US012550499B2

(12) United States Patent
Tae et al.

(10) Patent No.: US 12,550,499 B2
(45) Date of Patent: Feb. 10, 2026

(54) DISPLAY DEVICE INCLUDING OPTICAL LAYER ON LIGHT EMITTING ELEMENTS

(71) Applicant: SAMSUNG DISPLAY CO., LTD., Yongin-si (KR)

(72) Inventors: Chang Il Tae, Yongin-si (KR); Jae Woong Kang, Yongin-si (KR); Sin Chul Kang, Yongin-si (KR); Su Mi Moon, Yongin-si (KR); Won Sik Oh, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 981 days.

(21) Appl. No.: 17/754,552

(22) PCT Filed: Mar. 12, 2020

(86) PCT No.: PCT/KR2020/003474
§ 371 (c)(1),
(2) Date: Apr. 5, 2022

(87) PCT Pub. No.: WO2021/075647
PCT Pub. Date: Apr. 22, 2021

(65) Prior Publication Data
US 2024/0055566 A1 Feb. 15, 2024

(30) Foreign Application Priority Data
Oct. 14, 2019 (KR) ........................ 10-2019-0127078

(51) Int. Cl.
H10H 20/00 (2025.01)
H01L 25/16 (2023.01)
H10H 20/831 (2025.01)
H10H 20/855 (2025.01)

(52) U.S. Cl.
CPC ......... H10H 20/855 (2025.01); H01L 25/167 (2013.01); H10H 20/8314 (2025.01)

(58) Field of Classification Search
CPC .. H10H 20/855; H10H 20/853; H10H 20/852; H10H 20/857; H01L 25/0753
See application file for complete search history.

(56) References Cited

U.S. PATENT DOCUMENTS 10,026,777 B2  7/2018 Kang et al.
10,115,767 B2  10/2018 Kwon
(Continued)

FOREIGN PATENT DOCUMENTS

CN  103995361 A  8/2014
CN  107611153 A  1/2018
(Continued)

OTHER PUBLICATIONS

International Search Report of PCT/KR2020/003474, Jul. 13, 2020, 4 pages.
(Continued)

Primary Examiner — Reema Patel
(74) Attorney, Agent, or Firm — Womble Bond Dickinson (US) LLP

(57) ABSTRACT

A display device in accordance with one or more embodiments may include: a substrate including a display area including a plurality of pixel areas, each of the plurality of pixel areas including an emission area, and a non-display area at at least one side of the display area; and a pixel in each of the plurality of pixel areas. The pixel may include: a first electrode and a second electrode spaced from each other on the substrate; a plurality of light emitting elements connected between the first and the second electrodes; and an optical pattern on the plurality of light emitting elements and overlapping at least some of the plurality of light emitting elements. The optical pattern is configured to extract light emitted from the plurality of light emitting elements.

20 Claims, 32 Drawing Sheets

(56) References Cited

U.S. PATENT DOCUMENTS

| | | |
|---|---|---|
| 10,187,631 B2 | 1/2019 | Hu et al. |
| 10,446,724 B2 | 10/2019 | Kwon et al. |
| 10,461,123 B2 | 10/2019 | Kim et al. |
| 10,490,537 B2 | 11/2019 | Bae et al. |
| 10,672,946 B2 | 6/2020 | Cho et al. |
| 10,816,849 B2 | 10/2020 | Lee et al. |
| 10,879,223 B2 | 12/2020 | Do et al. |
| 11,074,858 B2 | 7/2021 | Cho et al. |
| 2017/0062674 A1* | 3/2017 | Kwon ................... H10H 20/812 |
| 2017/0069611 A1 | 3/2017 | Zhang et al. |
| 2018/0175009 A1* | 6/2018 | Kim .................... H01L 25/0753 |
| 2019/0115513 A1 | 4/2019 | Im et al. |

FOREIGN PATENT DOCUMENTS

| | | |
|---|---|---|
| CN | 108206228 A | 6/2018 |
| JP | 2016-072584 A | 5/2016 |
| KR | 10-2017-0026959 A | 3/2017 |
| KR | 10-2017-0116631 A | 10/2017 |
| KR | 10-2018-0007376 A | 1/2018 |
| KR | 10-1845907 B1 | 4/2018 |
| KR | 10-2018-0071465 A | 6/2018 |
| KR | 10-2018-0072909 A | 7/2018 |
| KR | 10-2018-0079081 A | 7/2018 |
| KR | 10-2019-0096475 A | 8/2019 |
| KR | 10-2021-0045572 A | 4/2021 |
| WO | WO 2017/037537 A1 | 3/2017 |

OTHER PUBLICATIONS

Written Opinion of PCT/KR2020/003474, Jul. 13, 2020, with English Translation, 8 pages.

Gines, et al., "Light-Emitting Diode Operation", Zeiss Microscopy Online Campus, 2 pages.

\* cited by examiner

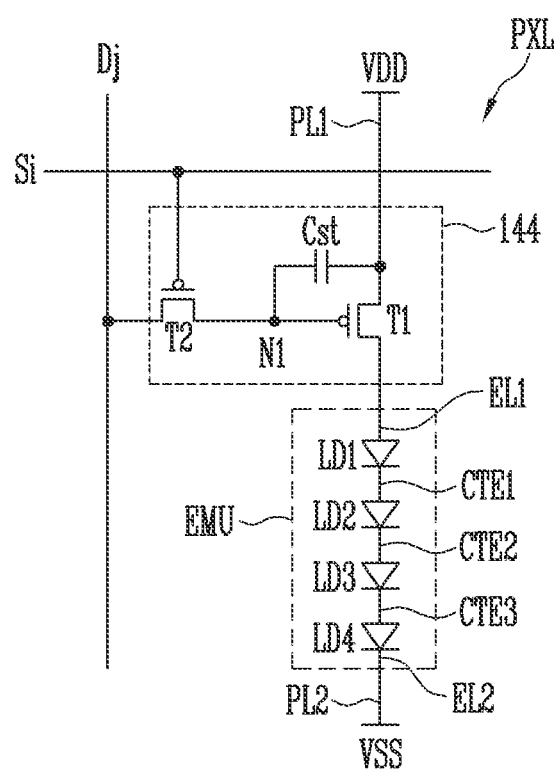

DISPLAY DEVICE INCLUDING OPTICAL LAYER ON LIGHT EMITTING ELEMENTS

CROSS-REFERENCE TO RELATED APPLICATIONS

This application is a U.S. National Phase Patent Application of International Patent Application Number PCT/KR2020/003474, filed on Mar. 12, 2020, which claims priority to Korean Patent Application Number 10-2019-0127078, filed on Oct. 14, 2019, the entire contents of all of which are incorporated by reference herein.

BACKGROUND

1. Field

Various embodiments of the present disclosure relate to a display device.

2. Description of Related Art

A light emitting diode may have relatively satisfactory durability even under poor environmental conditions, and may have excellent performances in terms of lifetime and luminance.

To apply the LED to a lighting device, a display device, or the like, there is a need to connect the LED to an electrode so that the voltage of the power supply may be applied to the LED. With regard to application purposes of the LED, a method of reducing space needed for the electrode, or a method of fabricating the LED, various researches on the arrangement relationship between the LED and the electrode have been conducted.

SUMMARY

Various embodiments of the present disclosure are directed to a display device having improved light output efficiency.

A display device in accordance with one or more embodiments of the present disclosure includes: a substrate including a display area including a plurality of pixel areas, each of the plurality of pixel area including an emission area, and a non-display area at at least one side of the display area; and a pixel in each of the plurality of pixel areas. The pixel may include: a first electrode and a second electrode spaced from each other on the substrate; a plurality of light emitting elements connected between the first and the second electrodes; and an optical pattern on the plurality of light emitting elements and overlapping at least some of the plurality of light emitting elements.

In one or more embodiments of the present disclosure, the optical pattern may be configured to extract light emitted from the light emitting elements.

In one or more embodiments of the present disclosure, the optical pattern may be a lens.

In one or more embodiments of the present disclosure, the display device may further include an encapsulation layer on the first and the second electrodes, and the plurality of light emitting elements.

In one or more embodiments of the present disclosure, the optical pattern may be integral with the encapsulation layer.

In one or more embodiments of the present disclosure, the encapsulation layer may be on the optical pattern.

In one or more embodiments of the present disclosure, the optical pattern may include a plurality of sub-optical patterns. Each of the plurality of sub-optical patterns may group a specific number of light emitting elements among the plurality of light emitting elements as one unit and may be disposed on the one unit.

In one or more embodiments of the present disclosure, the sub-optical patterns may have shapes different from each other.

In one or more embodiments of the present disclosure, the sub-optical patterns may have an identical shape.

In one or more embodiments of the present disclosure, the display device may further include an insulating layer directly on an upper surface of each of the plurality of light emitting elements. The optical pattern may be on the plurality of light emitting elements with the insulating layer interposed therebetween.

In one or more embodiments of the present disclosure, the display device may further include: a first contact electrode on the insulating layer and electrically connecting the first electrode with one end of opposite ends of a light emitting element of the plurality of light emitting elements; and a second contact electrode spaced from the first contact electrode on the insulating layer, and electrically connecting the second electrode with a remaining end of the opposite ends of the light emitting element. The optical pattern may cover a portion of the first contact electrode and a portion of the second contact electrode.

In one or more embodiments of the present disclosure, the optical pattern may include light diffusion particles.

A display device in accordance with one or more embodiments of the present disclosure includes: a substrate including a display area including a plurality of pixel areas, each of the plurality of pixel areas including an emission area, and a non-display area at at least one side of the display area; and a pixel in each of the pixel areas. The pixel may include: a first electrode and a second electrode spaced from each other on the substrate; a plurality of light emitting elements connected between the first and the second electrodes; an insulating optical pattern on an upper surface of each of the plurality of light emitting elements, and configured to extract light emitted from the plurality of light emitting elements; a first contact electrode and a second contact electrode spaced from each other on the insulating optical pattern; and an encapsulation layer on the first and the second contact electrodes.

In one or more embodiments, the insulating optical pattern has an upwardly protruding shape, and includes optical diffusion particles dispersed therein. In one or more embodiments, the insulating optical pattern includes an organic insulating material.

A display device in accordance with one or more embodiments of the present disclosure includes: a substrate including a display area including a plurality of pixel areas, each of the plurality of pixel areas including an emission area, and a non-display area at at least one side of the display area; and a pixel in each of the pixel areas. The pixel may include: a first electrode and a second electrode spaced from each other on the substrate; a plurality of light emitting elements connected between is the first and the second electrodes; an insulating layer on an upper surface of each of the light emitting elements; a first contact electrode and a second contact electrode spaced from each other on the insulating layer; an encapsulation layer on the first and the second contact electrodes; and an optical layer on the encapsulation layer.

In one or more embodiments of the present disclosure, the optical layer may be configured to extract light emitted from the light emitting elements.

In one or more embodiments, the optical layer includes a plurality of optical patterns. In one or more embodiments, each of the plurality of optical patterns has an upwardly protruding shape. In one or more embodiments, each of the plurality of optical patterns has a downwardly recessed shape. In one or more embodiments, the optical patterns have an identical size. In one or more embodiments, the optical patterns have sizes different from each other.

An embodiment of the present disclosure may provide a display device in which an optical pattern is disposed on a light emitting element to diffuse and/or scatter or concentrate (or condense) light emitted from the light emitting element, whereby light output efficiency may be enhanced.

The effects, aspects, and features of embodiments of the present disclosure are not limited by the foregoing, and other various effects, aspects, and features are anticipated herein.

BRIEF DESCRIPTION OF THE DRAWINGS

FIG. 48 is a schematically cross-sectional view illustrating the light emitting element of FIG. 4A.

FIGS. 7A and 7B are circuit diagrams illustrating various embodiments of electrical connection relationship of components included in one pixel illustrated in FIG. 5.

DETAILED DESCRIPTION

Figure 1A:
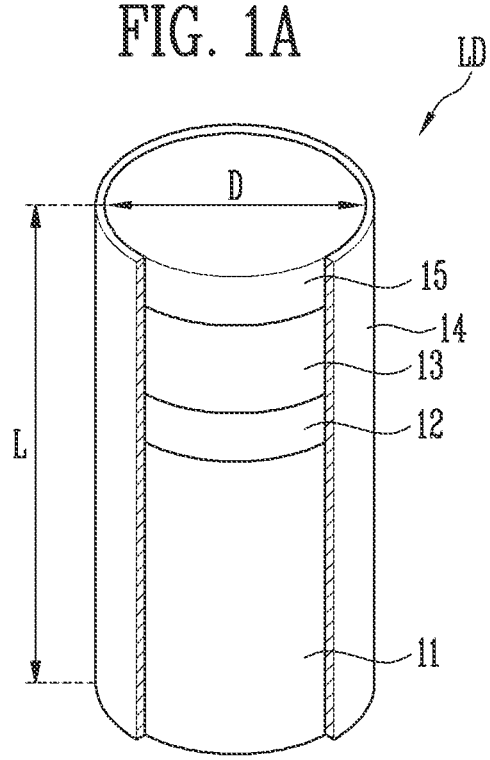
FIG. 1A is a perspective cutaway view schematically illustrating alight emitting element in accordance with one or more embodiments of the present disclosure.

As the present disclosure allows for various changes and numerous embodiments, particular embodiments will be illustrated in the drawings and described in detail in the written description. However, this is not intended to limit the present disclosure to particular modes of practice, and it is to be appreciated that all changes, equivalents, and substitutes that do not depart from the technical scope of the present disclosure are encompassed in the present disclosure.

Throughout the disclosure, like reference numerals refer to like parts throughout the various figures and embodiments of the present disclosure. The sizes of elements in the accompanying drawings may be exaggerated for clarity of illustration. It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element. In the present disclosure, the singular forms are intended to include the plural forms as well, unless the context clearly indicates otherwise.

It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof. Furthermore, in the case that a first part such as a layer, a film, a region, or a plate is disposed on a second part, the first part may be not only directly on the second part but a third part may intervene between them. In addition, in the case that it is expressed that a first part such as a layer, a film, a region, or a plate is formed on a second part, the surface of the second part on which the first part is formed is not limited to an upper surface of the second part but may include other surfaces such as a side surface or a lower surface of the second part. To the contrary, in the case that a first part such as a layer, a film, a region, or a plate is under a second part, the first part may be not only directly under the second part but a third part may intervene between them.

One or more embodiments and required details of the present disclosure are described with reference to the accompanying drawings in order to describe the present disclosure in detail so that those having ordinary knowledge in the technical field to which the present disclosure pertains may easily practice the present disclosure. Furthermore, a singular form may include a plural form as long as it is not specifically mentioned in a sentence.

Figure 1B:
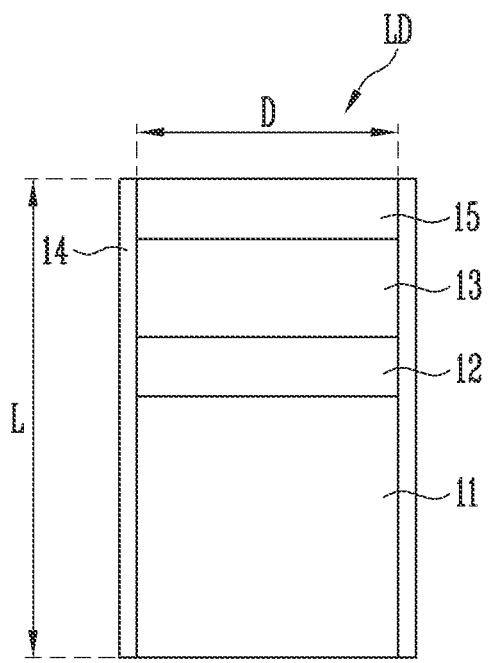
FIG. 1B is a schematically cross-sectional view illustrating the light emitting element of FIG. 1A.
Figure 2A:
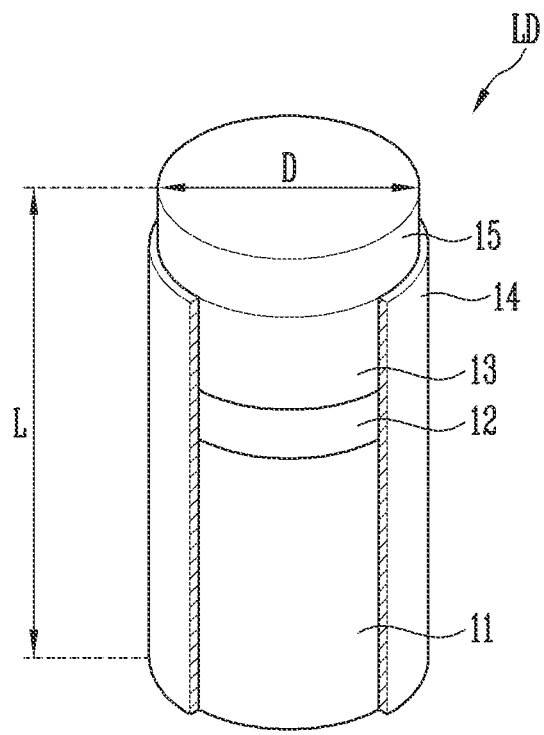
FIG. 2A is a perspective cutaway view schematically illustrating alight emitting element in accordance with one or more embodiments of the present disclosure.
Figure 2B:
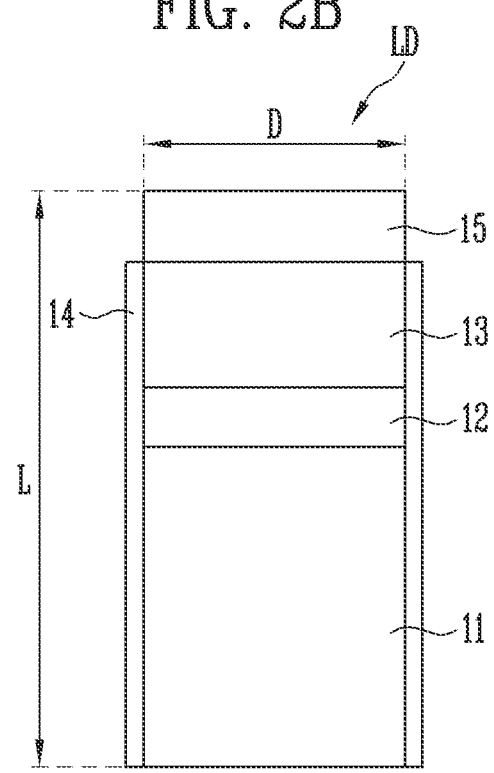
FIG. 2B is a schematically cross-sectional view illustrating the light emitting element of FIG. 2A.
Figure 3A:
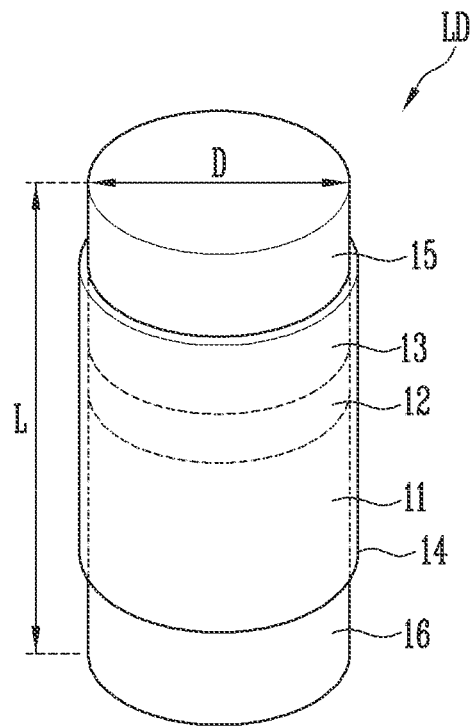
FIG. 3A is a perspective view schematically illustrating alight emitting element in accordance with one or more embodiments of the present disclosure.
Figure 3B:
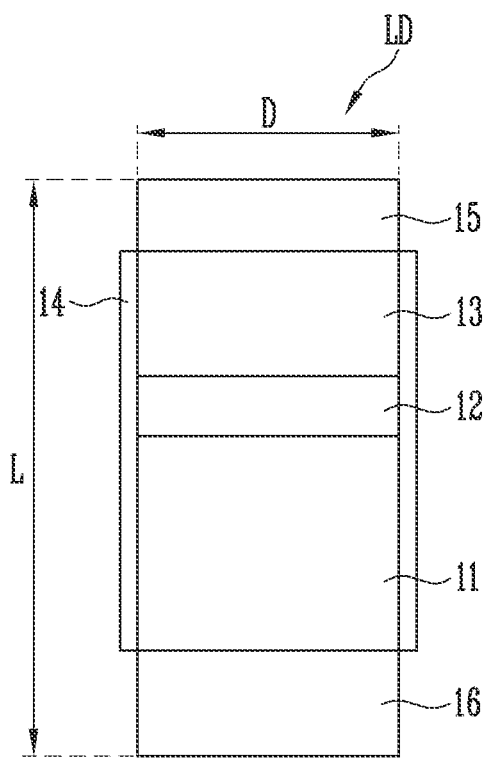
FIG. 3B is a schematically cross-sectional view illustrating the light emitting element of FIG. 3A.
Figure 4A:
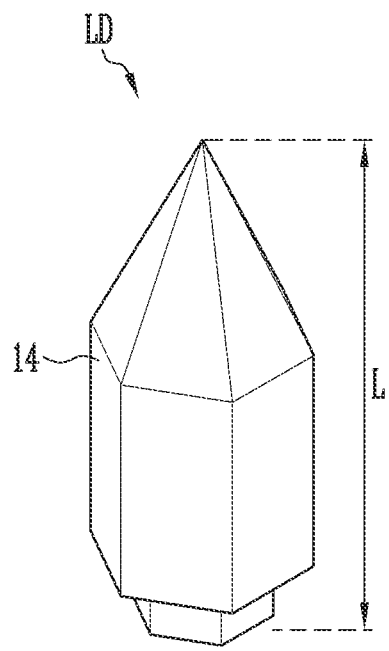
FIG. 4A is a perspective view schematically illustrating alight emitting element in accordance with one or more embodiments of the present disclosure.
Figure 4B:
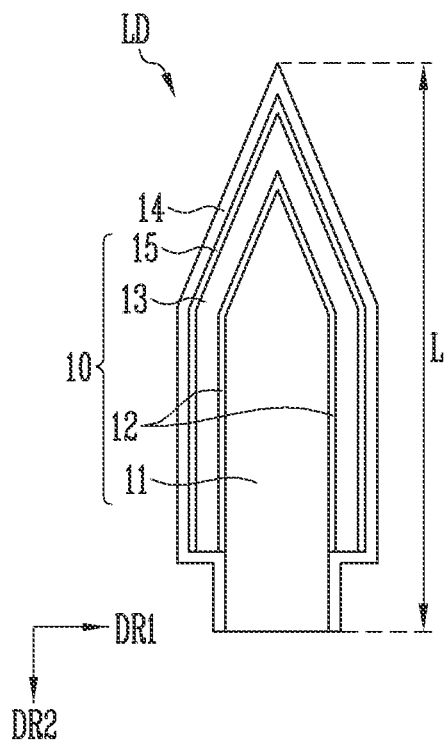

FIG. 1A is a perspective cutaway view schematically illustrating alight emitting element in accordance with one or more embodiments of the present disclosure. FIG. 1B is a schematically cross-sectional view illustrating the light emitting element of FIG. 1A. FIG. 2A is a perspective cutaway view schematically illustrating a light emitting element in accordance with one or more embodiments of the present disclosure. FIG. 2B is a schematically cross-sectional view illustrating the light emitting element of FIG. 2A. FIG. 3A is a perspective view schematically illustrating a light emitting element in accordance with one or more embodiments of the present disclosure. FIG. 3B is a schematically cross-sectional view illustrating the light emitting element of FIG. 3A. FIG. 4A is a perspective view schematically illustrating a light emitting element in accordance with one or more embodiments of the present disclosure. FIG. 4B is a schematically cross-sectional view illustrating the light emitting element of FIG. 4A.

For the sake of explanation, a light emitting element LD fabricated by an etching method will be described with reference to FIGS. 1A, 1B, 2A, 2B, 3A, and 3B, and then a light emitting element LD fabricated by a growth method will be described with reference to FIGS. 4A and 4B. In one or more embodiments of the present disclosure, the kind and/or shape of the light emitting element LD is not limited to the embodiments illustrated in FIGS. 1A, 1B, 2A, 2B, 3A, 3B, 4A, and 4B.

Referring to FIGS. 1A, 1B, 2A, 2B, 3A, and 3B, the light emitting element LD may include a first semiconductor layer 11, a second semiconductor layer 13, and an active layer 12 interposed between the first and second semiconductor layers 11 and 13. For example, the light emitting element LD may be implemented as an emission stack formed by successively stacking the first semiconductor layer 11, the active layer 12, and the second semiconductor layer 13.

In one or more embodiments of the present disclosure, the light emitting element LD may be formed in a shape extending in one direction. If the direction in which the light emitting element LD extends is defined as a longitudinal direction, the light emitting element LD may have one end and a remaining end in the extension direction. Any one of the first and second semiconductor layers 11 and 13 may be disposed on the one end of the light emitting element LD, and the other one of the first and second semiconductor layers 11 and 13 may be disposed on the remaining end of the light emitting element LD.

The light emitting element LD may have various shapes. For example, the light emitting element LD may have a rod-like shape or a bar-like shape extending in the longitudinal direction (i.e., to have an aspect ratio greater than 1). In one or more embodiments of the present disclosure, the length L of the light emitting element LD with respect to the longitudinal direction may be greater than the diameter (D, or a width of a cross-section) thereof. The light emitting element LD may include a light emitting diode fabricated to have a small size, e.g., with a length L and/or a diameter D corresponding to the micrometer scale or the nanometer scale. In various embodiments of the present disclosure, the shape of the light emitting element LD may be changed so as to meet requirements (or design conditions) of alighting device or a self-emissive display device.

The first semiconductor layer 11 may include, for example, at least one n-type semiconductor layer. For instance, the first semiconductor layer 11 may include an n-type semiconductor layer that includes any one semiconductor material of InAlGaN, GaN, AlGaN, InGaN, AlN, and InN and is doped with a first conductive dopant such as Si, Ge, or Sn. However, the constituent material of the first semiconductor layer 11 is not limited to thereto, and the first semiconductor layer 11 may be formed of various other materials.

The active layer 12 may be disposed on the first semiconductor layer 11 and have a single or multiple quantum well structure. The location of the active layer 12 may be changed in various ways depending on the type of the light emitting element LD. The active layer 12 may emit light having a wavelength ranging from 400 nm to 900 nm, and use a double hetero structure. In one or more embodiments of the present disclosure, a cladding layer doped with a conductive dopant may be formed on and/or under the active layer 12. For example, the cladding layer may be formed of an AlGaN layer or an InAlGaN layer. In one or more embodiments, a material such as AlGaN or InAlGaN may be used to form the active layer 12, and various other materials may be used to form the active layer 12.

If an electric field of a suitable voltage (e.g., a set or predetermined voltage) or more is applied between the opposite ends of the light emitting element LD, the light emitting element LD emits light by coupling of electron-hole pairs in the active layer 12. Because light emission of the light emitting element LD may be controlled based on the foregoing principle, the light emitting element LD may be used as a light source of various light emitting devices including a pixel of the display device.

The second semiconductor layer 13 may be disposed on the active layer 12 and include a semiconductor layer having a type different from that of the first semiconductor layer 11. For example, the second semiconductor layer 13 may include at least one p-type semiconductor layer. For instance, the second semiconductor layer 13 may include a p-type semiconductor layer that includes any one semiconductor material of InAlGaN, GaN, AlGaN, InGaN, AlN, and InN, and is doped with a second conductive dopant such as Mg. However, the material for forming the second semiconductor layer 13 is not limited thereto, and the second semiconductor layer 13 may be formed of various other materials.

In one or more embodiments of the present disclosure, the first semiconductor layer 11 and the second semiconductor layer 13 may have different widths (or thicknesses) with respect to the longitudinal direction (L) of the light emitting element LD. For example, the first semiconductor layer 11 may have a width (or a thickness) greater than that of the second semiconductor layer 13 with respect to the longitudinal direction (L) of the light emitting element LD. Hence, as illustrated in FIGS. 1A to 3B, the active layer 12 of the light emitting element LD may be disposed at a position closer to an upper surface of the second semiconductor layer 13 than to a lower surface of the first semiconductor layer 11.

In one or more embodiments of the present disclosure, the light emitting element LD may further include an additional electrode 15 disposed on the second semiconductor layer 13, as well as including the first semiconductor layer 11, the active layer 12, and the second semiconductor layer 13. In one or more embodiments, as shown in FIGS. 3A and 3B, the light emitting element LD may further include an additional electrode 16 disposed on one end of the first semiconductor layer 11.

Although each of the additional electrodes 15 and 16 may be an ohmic contact electrode, the present disclosure is not limited thereto, and it may be a Schottky contact electrode depending on embodiments. Furthermore, each of the additional electrodes 15 and 16 may include metal or a metal oxide. For example, chromium (Cr), titanium (Ti), aluminium (Al), gold (Au), nickel (Ni), ITO, and an oxide or alloy thereof may be used alone or in combination with each other. However, the present disclosure is not limited thereto.

Materials included in the respective additional electrodes 15 and 16 may be equal to or different from each other. The additional electrodes 15 and 16 may be transparent or semitransparent. Therefore, light generated from the light emitting element LD may pass through the additional electrodes 15 and 16 and then may be emitted outside the light emitting element LD. In one or more embodiments, in the case that light generated from the light emitting element LD is emitted outside the light emitting element LD through a region other than the opposite ends of the light emitting element LD rather than passing through the additional electrodes 15 and 16, the additional electrodes 15 and 16 may include opaque metal.

In one or more embodiments of the present disclosure, the light emitting element LD may further include an insulating layer 14. However, in one or more embodiments, the insulating layer 14 may be omitted, or may be provided to cover the outer surfaces (e.g., outer peripheral or circumferential surfaces) of only some of the first semiconductor layer 11, the active layer 12, and the second semiconductor layer 13.

The insulating layer 14 may prevent the active layer 12 from short-circuiting due to making contact with a conductive material except the first semiconductor layer 11 and the second semiconductor layer 13. Furthermore, because of the insulating layer 14, occurrence of a defect on the surface of the light emitting element LD may be reduced or minimized, whereby the lifetime and efficiency of the light emitting element LD may be improved. In the case that a plurality of light emitting elements LD are disposed in close contact with each other, the insulating layer 14 may prevent an undesired short-circuit from occurring between the light emitting elements LD. It is not limited whether the insulating layer 14 is provided, so long as the active layer 12 may be prevented from short-circuiting with external conductive material.

As illustrated in FIGS. 1A and 1B, the insulating layer 14 may be provided in a shape enclosing an outer surface (e.g., an outer peripheral or circumferential surface) of the emission stack including the first semiconductor layer 11, the active layer 12, the second semiconductor layer 13, and the additional electrode 15. For the sake of explanation, FIG. 1A illustrates the insulating layer 14 a portion of which has been removed. The first semiconductor layer 11, the active layer 12, the second semiconductor layer 13, and the additional electrode 15 that are included in the light emitting element LD may be enclosed by the insulating layer 14.

Although in the above-mentioned embodiment the insulating layer 14 has been described as enclosing the overall outer surface (e.g., other peripheral or circumferential surface) of the first semiconductor layer 11, the active layer 12, the second semiconductor layer 13, and the additional electrode 15, the present disclosure is not limited thereto.

In one or more embodiments, as illustrated in FIGS. 2A and 2B, the insulating layer 14 may enclose the respective outer surface (e.g., other peripheral or circumferential surfaces) of the first semiconductor layer 11, the active layer 12, and the second semiconductor layer 13, and may not enclose the entirety of the outer surface (e.g., other peripheral or circumferential surface) of the additional electrode 15 disposed on the second semiconductor layer 13 or may enclose only a portion of the outer surface (e.g., other peripheral or circumferential surface) of the additional electrode 15 without enclosing the other portion of the outer surface (e.g., other peripheral or circumferential surface) of the additional electrode 15. Here, the insulating layer 14 may allow at least the opposite ends of the light emitting element LD to be exposed to the outside. For example, the insulating layer 14 may allow not only the additional electrode 15 disposed on one end of the second semiconductor layer 13 but also one end of the first semiconductor layer 11 to be exposed to the outside. In one or more embodiments, as illustrated in FIGS. 3A and 3B, in the case that the additional electrodes 15 and 16 are respectively disposed on the opposite ends of the light emitting element LD, the insulating layer 14 may allow at least a portion of each of the additional electrodes 15 and 16 to be exposed to the outside. Alternatively, in one or more embodiments, the insulating layer 14 may not be provided.

In an embodiment of the present disclosure, the insulating layer 14 may include a transparent insulating material. For example, the insulating layer 14 may include at least one insulating material selected from the group consisting of $SiO_2$, $Si_3N_4$, $Ab_2O_3$, and $TiO_2$, but it is not limited thereto. In other words, various materials having insulating properties may be employed.

If the insulating layer 14 is provided on the light emitting element LD, the active layer 12 may be prevented from short-circuiting with a first and/or second electrode. Furthermore, because of the insulating layer 14, occurrence of a defect on the surface of the light emitting element LD may be reduced or minimized, whereby the lifetime and efficiency of the light emitting element LD may be improved. In the case that a plurality of light emitting elements LD are disposed in close contact with each other, the insulating layer 14 may prevent an undesired short-circuit from occurring between the light emitting elements LD.

The light emitting element LD may be employed as a light source for various display devices. The light emitting element LD may be fabricated through a surface treatment process. For example, the light emitting element LD may be surface-treated so that, when a plurality of light emitting elements LD are mixed with a fluidic solution (or solvent) and then supplied to each emission area (e.g., an emission area of each pixel or an emission area of each sub-pixel), the light emitting elements LD may be evenly distributed rather than unevenly aggregating in the solution.

A light emitting device including the light emitting element LD described above may be used not only in a display device but also in various devices that require a light source. For instance, in the case that a plurality of light emitting elements LD are disposed in the emission area of each pixel of a display panel, the light emitting elements LD may be used as a light source of the pixel. However, the application field of the light emitting element LD is not limited to the above-mentioned examples. For example, the light emitting element LD may also be used in other types of devices such as a lighting device, which requires a light source.

Next, a light emitting element LD fabricated by the growth method will be described with reference to FIGS. 4A and 4B.

The following description of the light emitting element LD fabricated by the growth method will be focused on differences from the above-mentioned embodiments, and components of the light emitting element LD that are not separately explained in the following description may comply with that of the preceding embodiments. The same reference numerals will be used to designate the same components, and similar reference numerals will be used to designate similar components.

Referring to FIGS. 4A and 4B, the light emitting element LD in accordance with an embodiment of the present disclosure may include a first semiconductor layer 11, a second semiconductor layer 13, and an active layer 12 interposed between the first and second semiconductor layers 11 and 13. In one or more embodiments, the light emitting element LD may include an emission pattern 10 having a core-shell structure. The emission pattern 10 may include a first semiconductor layer 11 disposed in a central portion of the light emitting element LD, an active layer 12 that encloses at least one side of the first semiconductor layer 11, a second semiconductor layer 13 that encloses at least one side of the active layer 12, and an additional electrode 15 which encloses at least one side of the second semiconductor layer 13.

The light emitting element LD may be formed in a polypyramid shape extending in one direction. For example, the light emitting element LD may have a hexagonal pyramid shape. If the direction in which the light emitting element LD extends is defined as a longitudinal direction (L), the light emitting element LD may have one end (or a lower end) and a remaining end (or an upper end) in the longitudinal direction (L). A portion of any one of the first and second semiconductor layers 11 and 13 on the one end (or the lower end) of the light emitting element LD may be exposed to the outside. A portion of the other one of the first and second semiconductor layers 11 and 13 on the remaining end (or the upper end) of the light emitting element LD may be exposed to the outside. For example, a portion of the first semiconductor layer 11 on the one end (or the lower end) of the light emitting element LD may be exposed, and a portion of the second semiconductor layer 13 on the remaining end (or the upper end) of the light emitting element LD may be exposed. In one or more embodiments, in the case that the light emitting element LD includes the additional electrode 15, a portion of the additional electrode 15 that encloses at least one side of the second semiconductor layer 13 on the remaining end (or the upper end) of the light emitting element LD may be exposed.

In one or more embodiments of the present disclosure, the first semiconductor layer 11 may be disposed in a core, i.e., a central (or middle) portion, of the light emitting element LD. The light emitting element LD may have a shape corresponding to the shape of the first semiconductor layer 11. For instance, if the first semiconductor layer 11 has a hexagonal pyramid shape, the light emitting element LD and the emission pattern 10 each may also have a hexagonal pyramid shape.

The active layer 12 may be provided and/or formed in a shape enclosing the outer surface (e.g., other peripheral or circumferential surface) of the first semiconductor layer 11 in the longitudinal direction (L) of the light emitting element LD. In detail, the active layer 12 may be provided and/or formed in a shape enclosing an area of the first semiconductor layer 11, other than a lower end of the opposite ends of the first semiconductor layer 11, in the longitudinal direction (L) of the light emitting element LD.

The second semiconductor layer 13 may be provided and/or formed in a shape enclosing the active layer 12 in the longitudinal direction (L) of the light emitting element LD, and may include a semiconductor layer having a type different from that of the first semiconductor layer 11. For example, the second semiconductor layer 13 may include at least one p-type semiconductor layer.

In one or more embodiments of the present disclosure, the light emitting element LD may include the additional electrode 15 that encloses at least one side of the second semiconductor layer 13. The additional electrode 15 may be an ohmic contact electrode electrically connected to the second semiconductor layer 13, but the present disclosure is not limited thereto.

As described above, the light emitting element LD may have a hexagonal pyramid shape with the opposite ends protruding outward, and may be implemented as the emission pattern 10 with a core-shell structure including the first semiconductor layer 11 provided in the central portion thereof, the active layer 12 that encloses the first semiconductor layer 11, the second semiconductor layer 13 that encloses the active layer 12, and the additional electrode 15 that encloses the second semiconductor layer 13. The first semiconductor layer 11 may be disposed on the one end (or the lower end) of the light emitting element LD having a hexagonal pyramid shape, and the additional electrode 15 may be disposed on the remaining end (or the upper end) of the light emitting element LD.

In one or more embodiments, the light emitting element LD may further include an insulating layer 14 provided on the outer surface (e.g., other peripheral or circumferential surface) of the emission pattern 10 having a core-shell structure. The insulating layer 14 may include a transparent insulating material.

Figure 5:
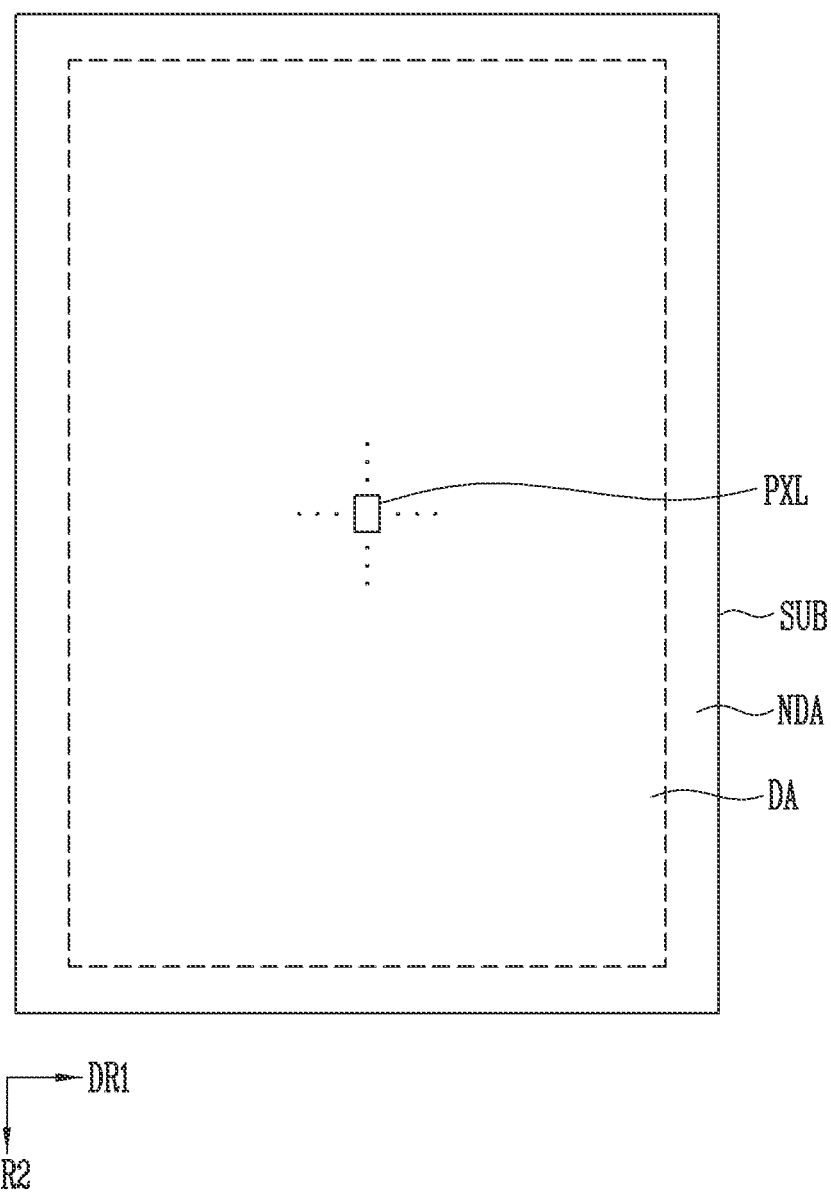
FIG. 5 illustrates a display device in accordance with one or more embodiments of the present disclosure, and particularly, is a schematic plan view of a display device using, as a light source, any one of the light emitting elements illustrated in FIGS. 1A, 1B, 2A, 2B, 3A, 3B, 4A, and 4B.

FIG. 5 illustrates a display device in accordance with one or more embodiments of the present disclosure, and particularly, is a schematic plan view of a display device using, as a light source, any one of the light emitting elements illustrated in FIGS. 1A, 1B, 2A, 2B, 3A, 38, 4A, and 4B.

For the sake of explanation, FIG. 5 schematically illustrates the structure of the display device, focused on a display area DA on which an image is displayed. In one or more embodiments, although not illustrated, at least one driving circuit (e.g., a scan driver and a data driver) and/or a plurality of lines may be further provided in the display device.

Referring to FIGS. 1A, 1B, 2A, 2B, 3A, 3B, 4A, 4B, and 5, the display device in accordance with one or more embodiments of the present disclosure may include a substrate SUB, a plurality of pixels PXL that are provided in the substrate SUB and each of which includes at least one light emitting element LD, a driver provided in the substrate SUB and configured to drive the pixels PXL, and a line component provided to connect the pixels PXL to the driver.

The display device may be classified into a passive-matrix type display device and an active-matrix type display device according to a method of driving the light emitting element LD. For example, in case that the display device is implemented as an active matrix type, each of the pixels PXL may include a driving transistor configured to control the amount of current to be supplied to the light emitting element LD, and a switching transistor configured to transmit a data signal to the driving transistor.

Recently, active-matrix type display devices capable of selectively turning on each pixel PXL taking into account the resolution, the contrast, and the working speed have been mainstreamed. However, the present disclosure is not limited thereto. For example, passive-matrix type display devices in which pixels PXL may be turned on by groups may also employ components (e.g., first and second electrodes) for driving the light emitting element LD.

The substrate SUB may include a display area DA and a non-display area NDA.

In one or more embodiments, the display area DA may be disposed in a central portion of the display device, and the non-display area NDA may be disposed in a perimeter portion of the display device in such a way as to enclose the display area DA along the edge or periphery of the display area DA. The locations of the display area DA and the non-display area NDA are not limited thereto, and the locations thereof may be changed.

The display area DA may be an area in which the pixels PXL for displaying an image are provided. The non-display area NDA may be an area in which the driver for driving the pixels PXL and some of the line component for connecting the pixels PXL to the driver are provided.

The display area DA may have various shapes. For example, the display area DA may be provided in a closed polygonal shape including linear sides. Alternatively, the display area DA may be provided in a circular and/or elliptical shape including a curved side. As a further alternative, the display area DA may be provided in various shapes such as a semi-circular shape and a semi-elliptical shape including a linear side and a curved side.

The non-display area NDA may be provided in at least one side of the display area DA. In one or more embodiments of the present disclosure, the non-display area NDA may enclose the periphery (or the edge) of the display area DA.

The substrate SUB may include a transparent insulating material to allow light transmission.

The substrate SUB may be a rigid substrate. For example, the rigid substrate may be one of a glass substrate, a quartz substrate, a glass ceramic substrate, and a crystalline glass substrate. The substrate SUB may be a flexible substrate.

One area on the substrate SUB may be provided as the display area DA in which the pixels PXL are disposed, and the other area thereof may be provided as the non-display area NDA. For example, the substrate SUB may include the display area DA including a plurality of pixel areas on which the respective pixels PXL are formed, and the non-display area NDA disposed around the display area DA.

The pixels PXL may be provided in the display area DA on the substrate SUB. In one or more embodiments of the present disclosure, the pixels PXL may be arranged in the display area DA in a stripe or a PENTILE® arrangement structure, but the present disclosure is not limited thereto. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea.

Each of the pixels PXL may include at least one light emitting element LD configured to be driven in response to a corresponding scan signal and a corresponding data signal. The light emitting element LD may have a small size corresponding to the micrometer scale or the nanometer scale and may be connected in parallel to light emitting elements LD disposed adjacent thereto, but the present disclosure is not limited thereto. The light emitting element LD may form a light source of each pixel PXL.

Each of the pixels PXL may include at least one light source that is driven by a suitable signal (e.g., a set or predetermined signal, for example, a scan signal and a data signal) and/or a suitable power supply (e.g., a set or predetermined power supply, for example, a first driving power supply and a second driving power supply). For example, each of the pixels PXL may include alight emitting element LD illustrated in each of the embodiments of FIGS. 1A to 4B, for example, at least one subminiature light emitting element LD having a small size corresponding to the nanometer scale or the micrometer scale. However, in one or more embodiments of the present disclosure, the type of the light emitting element LD which may be used as a light source of each of the pixels PXL is not limited thereto.

In one or more embodiments of the present disclosure, the color, the type, and/or the number of pixels PXL are not particularly limited. For example, the color of light emitted from each pixel PXL may be changed in various ways.

The driver may provide a suitable signal (e.g., a set or predetermined signal) and a suitable power voltage (e.g., a set or predetermined power voltage) to each of the pixels PXL through the line component and thus control the operation of the pixel PXL. For the sake of explanation, in FIG. 5, the line component is omitted.

The driver may include a scan driver configured to provide scan signals to the pixels PXL through scan lines, an emission driver configured to provide emission control signals to the pixels PXL through emission control lines, a data driver configured to provide data signals to the pixels PXL through data lines, and a timing controller. The timing controller may control the scan driver, the emission driver, and the data driver.

FIGS. 6A to 6E are circuit diagrams illustrating various embodiments of electrical connection relationship of components included in one pixel illustrated in FIG. 5.

For example, FIGS. 6A to 6E illustrate different embodiments of the electrical connection relationship of components included in a pixel PXL which may be employed in an active display device. However, the types of the components included in the pixel PXL to which embodiments of the present disclosure may be applied are not limited thereto.

In FIGS. 6A to 6E, not only the components included in each of the pixels PXL illustrated in FIG. 5 but also an area in which the components are provided is embraced in the definition of the term "pixel PXL". In one or more embodiment, each pixel PXL illustrated in FIGS. 6A to 6E may be any one of the pixels PXL provided in the display device of FIG. 5. The pixels PXL may have structures substantially equal or similar to each other.

Referring to FIGS. 1A to 4B, 5, and 6A to 6E, each pixel PXL (hereinafter referred to as 'pixel') may include an emission unit EMU configured to generate light having a luminance corresponding to a data signal. The pixel PXL may selectively further include a pixel circuit 144 configured to drive the emission unit EMU.

In one or more embodiments, the emission unit EMU may include a plurality of light emitting elements LD connected in parallel between a first power line PL1 to which a first driving power supply VDD is applied and a second power line PL2 to which a second driving power supply VSS is applied. For example, the emission unit EMU may include a first electrode EL1 (or "first alignment electrode") connected to the first driving power supply VDD via the pixel circuit 144 and the first power line PL1, a second electrode EL2 (or "second alignment electrode") connected to the second driving power supply VSS through the second power line PL2, and a plurality of light emitting elements LD connected in parallel to each other in the same direction between the first and second electrodes EL1 and EL2. In one or more embodiments of the present disclosure, the first electrode EL1 may be an anode electrode, and the second electrode EL2 may be a cathode electrode.

In one or more embodiments of the present disclosure, each of the light emitting elements LD included in the emission unit EMU may include a first end connected to the first driving power supply VDD through the first electrode EL1, and a second end connected to the second driving power supply VSS through the second electrode EL2. The first driving power supply VDD and the second driving power supply VSS may have different potentials. For example, the first driving power supply VDD may be set as a high-potential power supply, and the second driving power supply VSS may be set as a low-potential power supply. Here, a difference in potential between the first and second driving power supplies VDD and VSS may be set to a value equal to or greater than a threshold voltage of the light emitting elements LD during a light emission period of the pixel PXL.

As described above, the light emitting elements LD that are connected in parallel to each other in the same direction (e.g., in a forward direction) between the first electrode EL1 and the second electrode EL2 to which voltages having different potentials are respectively supplied may form respective valid light sources. The valid light sources may be collected to form the emission unit EMU of the pixel PXL.

The light emitting elements LD of the emission unit EMU may emit light having a luminance corresponding to driving current supplied thereto through the pixel circuit 144. For example, during each frame period, the pixel circuit 144 may supply driving current corresponding to a gray scale of corresponding frame data to the emission unit EMU. The driving current supplied to the emission unit EMU may be divided into the light emitting elements LD connected to each other in the same direction. Hence, each of the light emitting elements LD may emit light having a luminance corresponding to current applied thereto, so that the emission unit EMU may emit light having a luminance corresponding to the driving current.

Figure 6A:
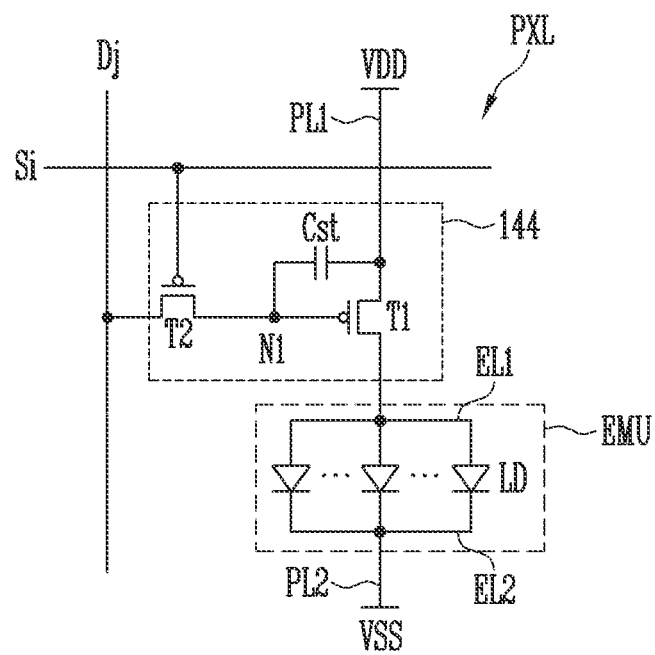
FIGS. 6A to 6E are circuit diagrams illustrating various embodiments of electrical connection relationship of components included in one pixel illustrated in FIG. 5.
Figure 6B:
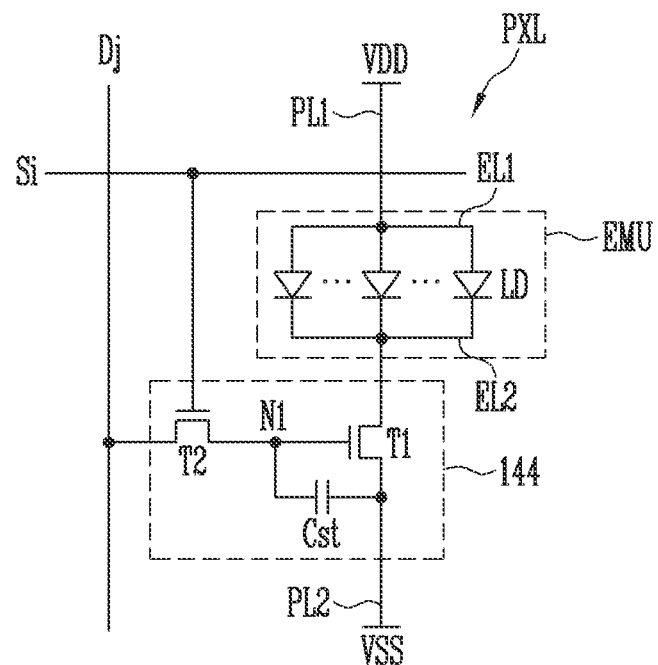
Figure 6C:
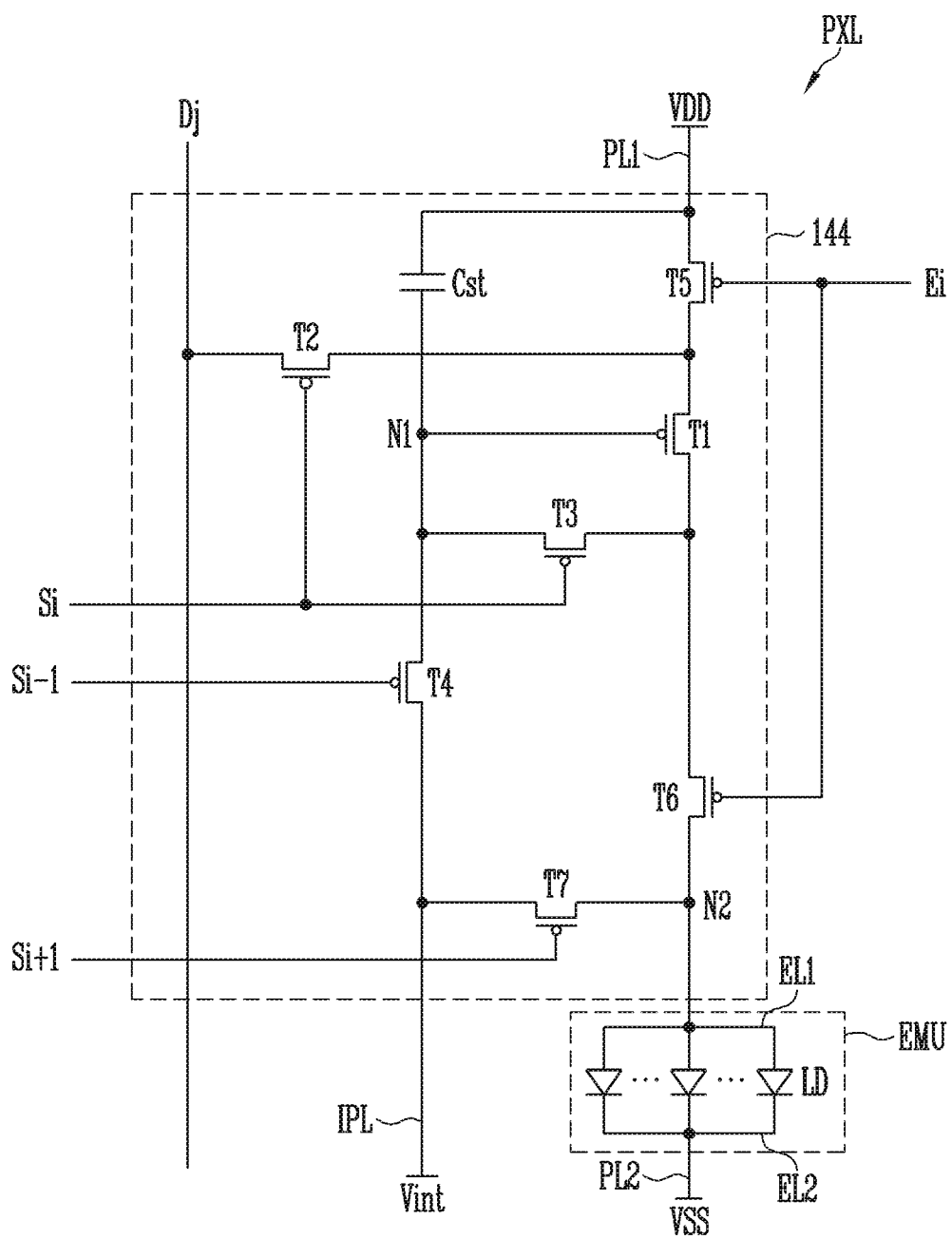
Figure 6D:
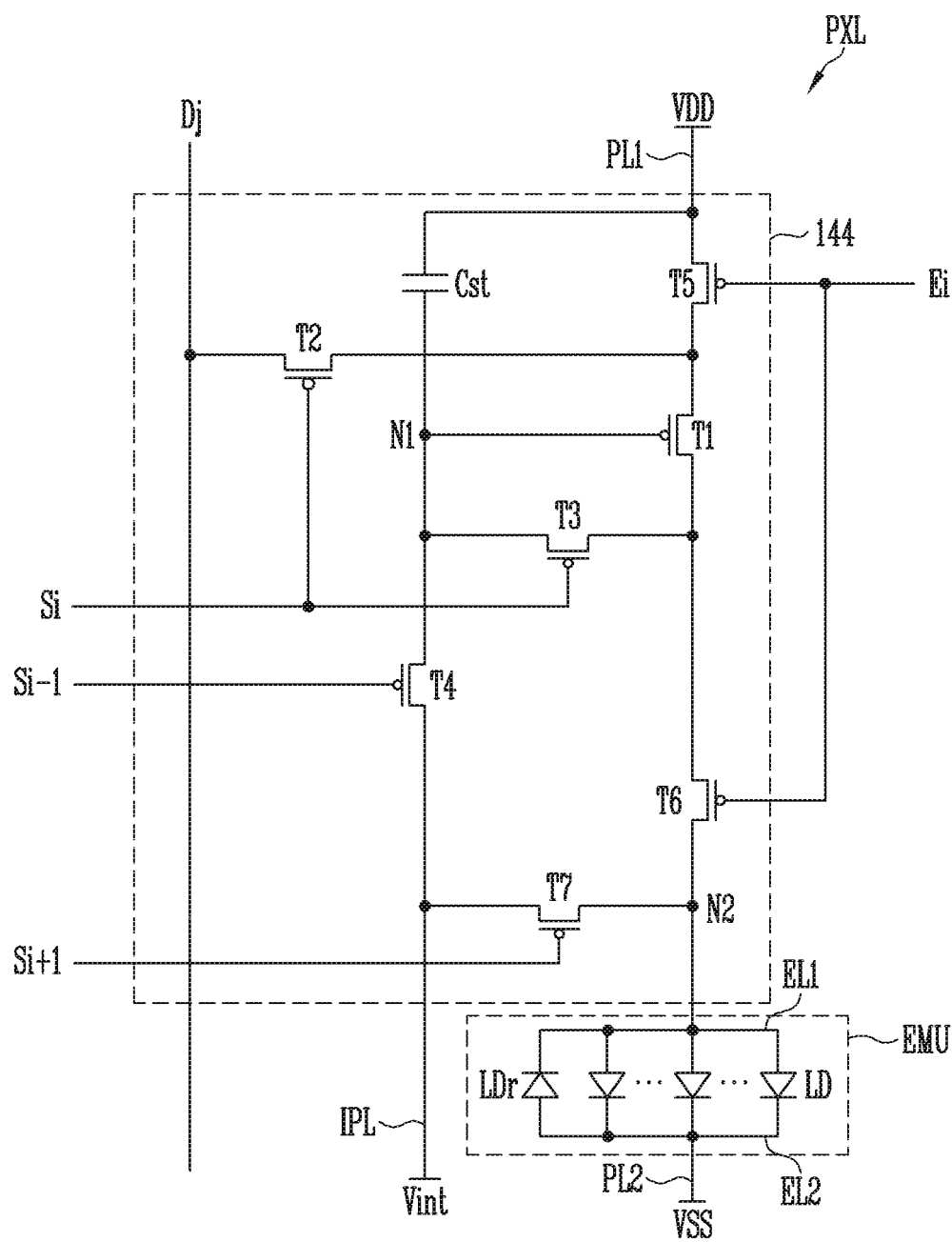
Figure 6E:
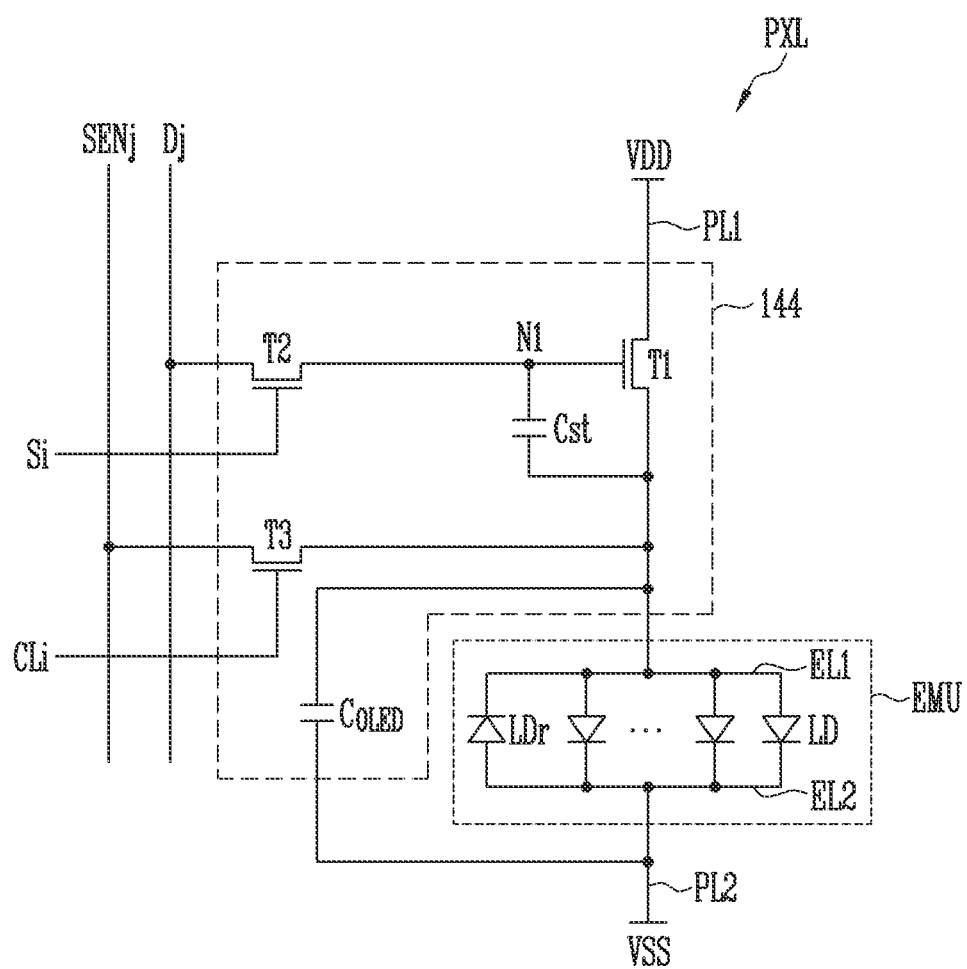

Although FIGS. 6A to 6E illustrate embodiments in which the light emitting elements LD are connected to each other in the same direction between the first and second driving power supplies VDD and VSS, the present disclosure is not limited thereto. In one or more embodiments, the emission unit EMU may further include at least one invalid light source, as well as including the light emitting elements LD that form the respective valid light sources. For example, as illustrated in FIGS. 6D and 6E, at least a reverse light emitting element LDr may be further connected between the first and second electrodes EL1 and EL2 of the emission unit EMU. The reverse light emitting element LDr, along with the light emitting elements LD that form the valid light sources, may be connected in parallel to each other between the first and second electrodes EL1 and EL2. Here, the reverse light emitting element LDr may be connected between the first and second electrodes EL1 and EL2 in a direction opposite to that of the light emitting elements LD. Even when a suitable driving voltage (e.g., a set or predetermined driving voltage, for example, a normal directional driving voltage) is applied between the first and second electrodes EL1 and EL2, the reverse light emitting element LDr remains disabled. Hence, current does not substantially flow through the reverse light emitting element LDr.

The pixel circuit 144 may be connected to a scan line Si and a data line Dj of the corresponding pixel PXL. For example, if the pixel PXL is disposed on an i-th row (i is a natural number) and a j-th column (j is a natural number) of the display area DA, the pixel circuit 144 of the pixel PXL may be connected to an i-th scan line Si and a j-th data line Dj of the display area DA. In one or more embodiments, the pixel circuit 144 may include first and second transistors T1 and T2, and a storage capacitor Cst, as illustrated in FIGS. 6A and 6B. The structure of the pixel circuit 144 is not limited to the embodiments illustrated in FIGS. 6A and 6B.

First, referring to FIG. 6A, the pixel circuit 144 may include first and second transistors T1 and T2, and a storage capacitor Cst.

A first terminal of the second transistor T2 (e.g., the switching transistor) may be connected to the data line Dj, and a second terminal thereof may be connected to a first node N1. Here, the first terminal and the second terminal of the second transistor T2 are different terminals, and, for example, if the first terminal is a source electrode, the second terminal may be a drain electrode. A gate electrode of the second transistor T2 may be connected to the i-th scan line Si.

When a scan signal having a voltage (e.g., a low-level voltage) capable of turning on the second transistor T2 is supplied from the i-th scan line Si, the second transistor T2 is turned on to electrically connect the j-th data line Dj with the first node N1. Here, a data signal of a corresponding frame is supplied to the j-th data line Dj, whereby the data signal is transmitted to the first node N1. The data signal transmitted to the first node N1 may be charged to the storage capacitor Cst. For example, the storage capacitor Cst may hole a change or voltage corresponding to the data signal transmitted to the first node N1.

A first terminal of the first transistor T1 (e.g., the driving transistor) may be connected to the first driving power supply VDD, and a second terminal thereof may be electrically connected to the first electrode EL1 of the light emitting elements LD. A gate electrode of the first transistor T1 may be connected to the first node N1. As such, the first transistor T1 may control the amount of driving current to be supplied to the light emitting elements LD in response to the voltage of the first node N1.

One electrode of the storage capacitor Cst may be connected to the first driving power supply VDD, and a remaining electrode thereof may be connected to the first node N1. The storage capacitor Cst is charged with a voltage corresponding to a data signal supplied to the first node N1, and maintains the charged voltage until a data signal of a subsequent frame is supplied.

FIGS. 6A and 6B each illustrate the pixel circuit 144 including the second transistor T2 configured to transmit a data signal to the pixel PXL, the storage capacitor Cst configured to store the data signal, and the first transistor T1 configured to supply driving current corresponding to the data signal to the light emitting elements LD.

However, the present disclosure is not limited thereto, and the structure of the pixel circuit 144 may be changed in various ways. For example, the pixel circuit 144 may further include at least one transistor element such as a transistor element configured to compensate for the threshold voltage of the first transistor T1, a transistor element configured to initialize the first node N1, and/or a transistor element configured to control a light emission time of the light emitting elements LD, or other circuit elements such as a boosting capacitor for boosting the voltage of the first node N1.

Furthermore, although in FIG. 6A the transistors, e.g., the first and second transistors T1 and T2, included in the pixel circuit 144 have been illustrated as being formed of P-type transistors, the present disclosure is not limited thereto. In other words, at least one of the first and second transistors T1 and T2 included in the pixel circuit 144 may be changed to an N-type transistor.

Referring to FIGS. 1A to 4B, 5, and 6B, the first and second transistors T1 and T2 in accordance with one or more embodiments of the present disclosure may be formed of N-type transistors. The configuration and operation of the pixel circuit 144 illustrated in FIG. 6B, other than a change in connection positions of some components (e.g., storage capacitor Cst) due to a change in the type of transistor, are similar to those of the pixel circuit 144 of FIG. 6A. Therefore, descriptions pertaining thereto will be simplified.

In one or more embodiments of the present disclosure, the pixel circuit 144 illustrated in FIG. 6B may include first and second transistors T1 and T2 formed of N-type transistors, and a storage capacitor Cst. In the case that the first and second transistors T1 and T2 are formed of N-type transistors, the emission unit EMU may be connected between the first driving power supply VDD and the pixel circuit 144 to secure stabilization of the storage capacitor Cst configured to be charged with a voltage corresponding to a data signal supplied to the first node N1. Here, the present disclosure is not limited thereto. In one or more embodiments, the emission unit EMU illustrated in FIG. 6B may be connected between the pixel circuit 144 and the second driving power supply VSS. In one or more embodiments of the present disclosure, the configuration of the pixel circuit 144 is not limited to the embodiments illustrated in FIGS. 6A and 6B. For example, the pixel circuit 144 may be configured in the same manner as that of the embodiments illustrated in FIGS. 6C and 6D.

As illustrated in FIGS. 6C and 6D, the pixel circuit 144 may be further connected to at least another scan line. For example, the pixel PXL disposed on the i-th row of the display area DA may be further connected to an i−1-th scan line Si−1 (e.g., a preceding scan line) and/or an i+1-th scan line Si+1 (e.g., a subsequent set). In one or more embodiments, the pixel circuit 144 may be connected not only to the first and second driving power supplies VDD and VSS but also to a third power supply. For example, the pixel circuit 144 may also be connected to an initialization power supply Vint.

The pixel circuit 144 may include first to seventh transistors T1 to T7, and a storage capacitor Cst.

One electrode, e.g., a source electrode, of the first transistor (T1; driving transistor) may be connected to the first driving power supply VDD via the fifth transistor T5, and another electrode thereof, e.g., a drain electrode, may be connected to one ends of light emitting elements LD via the sixth transistor T6. A gate electrode of the first transistor T1 may be connected to a first node N1. The first transistor T1 may control driving current flowing between the first driving power supply VDD and the second driving power supply VSS via the light emitting elements LD in response to the voltage of the first node N1. The foregoing first transistor T1 may have the same configuration as that of the first transistor T1 described with reference to FIG. 6A.

The second transistor T2 (e.g., switching transistor) may be connected between the j-th data line Dj connected to the pixel PXL and the source electrode of the first transistor T1. A gate electrode of the second transistor T2 may be connected to the i-th scan line Si connected to the pixel PXL. When a scan signal having a gate-on voltage (e.g., a low-level voltage) is supplied from the i-th scan line Si, the second transistor T2 may be turned on to electrically connect the j-th data line Dj to the source electrode of the first transistor T1. Hence, if the second transistor T2 is turned on, a data signal supplied from the j-th data line Dj may be transmitted to the first transistor T1. The foregoing second transistor T2 may have the same configuration as that of the second transistor T2 described with reference to FIG. 6A.

The third transistor T3 may be connected between the drain electrode of the first transistor T1 and the first node N1. A gate electrode of the third transistor T3 may be connected to the i-th scan line Si. Men a scan signal having a gate-on voltage (e.g., a low-level voltage) is supplied from the i-th scan line Si, the third transistor T3 may be turned on to electrically connect the drain electrode of the first transistor T1 to the first node N1.

The fourth transistor T4 may be connected between the first node N1 and an initialization power line IPL to which the initialization power supply Vint is to be applied. A gate electrode of the fourth transistor T4 may be connected to the preceding scan line, e.g., the i−1-th scan line Si−1. When a scan signal having a gate-on voltage (e.g., a low-level voltage) is supplied to the i−1-th scan line Si−1, the fourth transistor T4 may be turned on so that the voltage of the initialization power supply Vint may be transmitted to the first node N1. Here, the initialization power supply Vint may have a voltage equal to or less than the minimum voltage of the data signal.

The fifth transistor T5 may be connected between the first driving power supply VDD and the first transistor T1. A gate electrode of the fifth transistor T5 may be connected to a corresponding emission control line, e.g., an i-th emission control line Ei. The fifth transistor T5 may be turned off when an emission control signal having a gate-off voltage (e.g., a high-level voltage) is supplied to the i-th emission control line Ei, and may be turned on when an emission control signal having a gate-on voltage (e.g., a low-level voltage) is supplied to the i-th emission control line Ei.

The sixth transistor T6 may be connected between the first transistor T1 and the first ends of the light emitting elements LD. A gate electrode of the sixth transistor T6 may be connected to the i-th emission control line Ei. The sixth transistor T6 may be turned off when an emission control signal having a gate-off voltage (e.g., a high-level voltage) is supplied to the i-th emission control line Ei, and may be turned on when an emission control signal having a gate-on voltage (e.g., a low-level voltage) is supplied to the i-th emission control line Ei).

The seventh transistor T7 may be connected between the initialization power line IPL and the first ends of the light emitting elements LD or a second node N2. A gate electrode of the seventh transistor T7 may be connected to any one of scan lines of a subsequent set, e.g., to the i+1-th scan line Si+1. When a scan signal having a gate-on voltage (e.g., a low-level voltage) is supplied to the i+1-th scan line Si+1, the seventh transistor T7 may be turned on so that the voltage of the initialization power supply Vint may be supplied to the first ends of light emitting elements LD.

The storage capacitor Cst may be connected between the first driving power supply VDD and the first node N1. The storage capacitor Cst may store a voltage corresponding both to the data signal applied to the first node N1 during each frame period and to the threshold voltage of the first transistor T1.

Although in FIGS. 6C and 6D the transistors, e.g., the first to seventh transistors T1 to T7, included in the pixel circuit 144 have been illustrated as being formed of P-type transistors, the present disclosure is not limited thereto. For example, at least one of the first to seventh transistors T1 to T7 may be changed to an N-type transistor.

In one or more embodiments of the present disclosure, the configuration of the pixel circuit 144 is not limited to the embodiments illustrated in FIGS. 6A to 6D. For example, the pixel circuit 144 may be configured in the same manner as that of the embodiment shown in FIG. 6E.

As illustrated in FIG. 6E, the pixel circuit 144 may be further connected to a control line CLi and a sensing line SENj. For example, the pixel circuit 144 of the pixel PXL disposed on the i-th raw and the j-th column of the display area DA may be connected to an i-th control line CLi and a j-th sensing line SENj of the display area DA. The pixel circuit 144 described above may further include a third transistor T3 as well as including the first and second transistors T1 and T2 illustrated in FIGS. 6A and 6B.

The third transistor T3 is connected between the first transistor T1 and the j-th sensing line SENj. For example, one electrode of the third transistor T3 may be connected to one terminal (e.g., a source electrode) of the first transistor T1 connected to the first electrode EL1, and another electrode of the third transistor T3 may be connected to the j-th sensing line SENj. In the case that the sensing line SENj is omitted, the second electrode of the third transistor T3 may be connected to the j-th data line Dj.

In one or more embodiments, the gate electrode of the third transistor T3 is connected to the i-th control line CLi. In the case that the i-th control line CLi is omitted, the gate electrode of the third transistor T3 may be connected to the i-th scan line Si. The third transistor T3 may be turned on by a control signal that has a gate-on voltage (e.g., a high-level voltage) and is supplied to the i-th control line CLi during a sensing period (e.g., a set or predetermined sensing period), so that the j-th sensing line SENj and the first transistor T1 may be electrically connected to each other.

In one or more embodiments, the sensing period may be a period in which characteristic information of each of the pixels PXL disposed in the display area DA (e.g., a threshold voltage, etc. of the first transistor T1) are extracted. During the above-mentioned sensing period, the first transistor T1 may be turned on by supplying a reference voltage (e.g., a set or predetermined reference voltage) capable of turning on the first transistor T1 to the first node N1 through the j-th data line Dj and the second transistor T2, or connecting each pixel PXL to a current source or the like. Furthermore, the first transistor T1 may be connected to the j-th sensing line SENj by turning on the third transistor T3 by supplying a control signal having a gate-on voltage (e.g., a high-level voltage) to the third transistor T3. Hence, the characteristic information of each pixel PXL that includes the threshold voltage, etc. of the first transistor T1 may be extracted through the j-th sensing line SENj. The extracted characteristic information may be used to convert image data to compensate for a deviation in characteristics between the pixels PXL.

Although FIG. 6E illustrates an embodiment where all of the first to third transistors T1 to T3 are N-type transistors, the present disclosure is not limited thereto. For example, at least one of the first to third transistors T1 to T3 may be changed to a P-type transistor. Furthermore, although FIG. 6E illustrates an embodiment where the emission unit EMU is connected between the pixel circuit 144 and the second driving power supply VSS, the emission unit EMU may be connected between the first driving power supply VDD and the pixel circuit 144.

Although FIGS. 6A to 6E illustrate embodiments in which all light emitting elements LD of each emission unit EMU are connected in parallel to each other, the present disclosure is not limited thereto. In one or more embodiments, the emission unit EMU may include at least one serial set including a plurality of light emitting elements LD connected in parallel to each other. In other words, the emission unit EMU may be formed of a serial/parallel combination structure. The foregoing configuration will be described below with reference to FIGS. 7A and 7B.

The structure of the pixel PXL that may be applied to the present disclosure is not limited to the embodiments illustrated in FIGS. 6A to 6E, and the corresponding pixel PXL may have various structures. In one or more embodiments of the present disclosure, each pixel PXL may be configured in a passive light emitting display device, or the like. In this case, the pixel circuit 144 may be omitted, and the opposite ends of the light emitting elements LD included in the emission unit EMU may be directly connected to the scan lines Si−1, Si, and Si+1, the j-th data line Dj, the first power line PL1 to which the first driving power supply VDD is to be applied, the second power line PL2 to which the second driving power supply VSS is to be applied, and/or a control line (e.g., a set or predetermined control line) CLi.

Figure 7B:
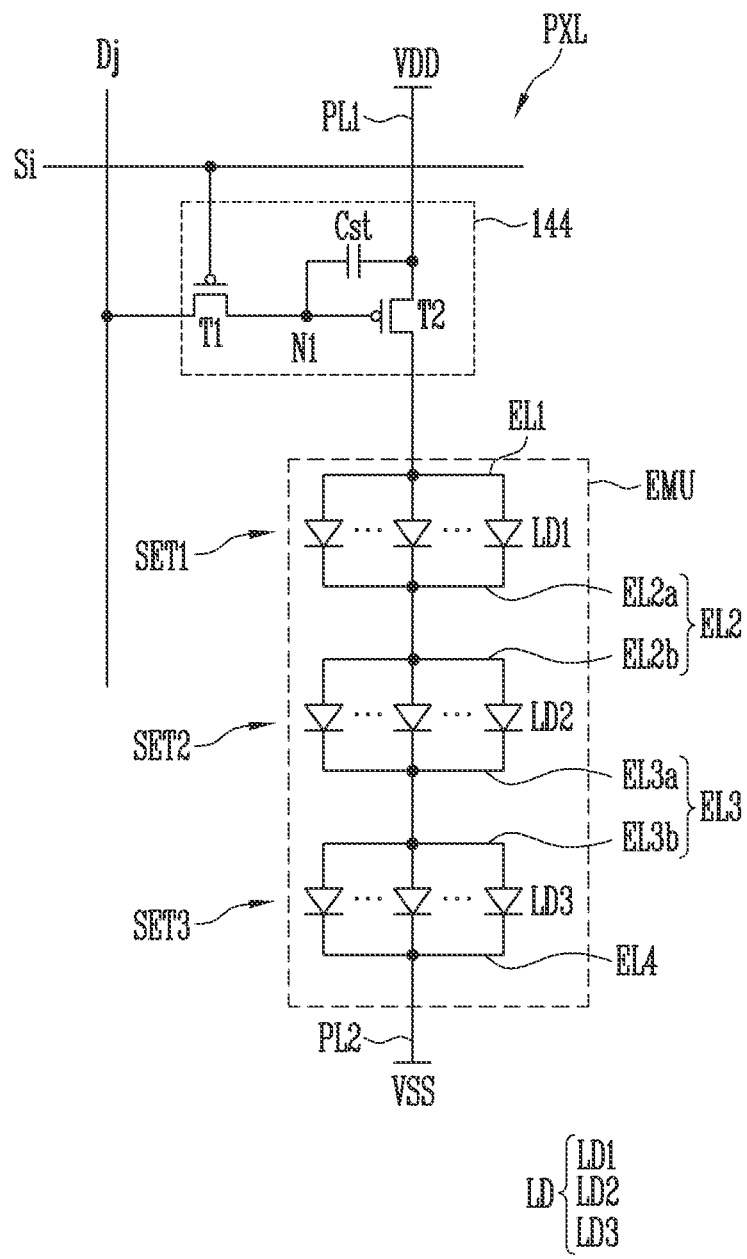

FIGS. 7A and 7B are circuit diagrams illustrating various embodiments of electrical connection relationship of components included in one pixel illustrated in FIG. 5. As illustrated in FIGS. 7A and 7B, the emission unit EMU of each pixel PXL may be configured to include a plurality of serial sets that are successively connected to each other. In the following descriptions of embodiments of FIGS. 7A and 7B, detailed explanations of components similar or equal to that of the embodiments of FIGS. 6A to 6E, e.g., detailed explanations of the pixel circuit 144, will be omitted to avoid redundant explanation.

First, referring to FIG. 7A, the emission unit EMU may include a plurality of light emitting elements LD connected in series to each other. For example, the emission unit EMU may include a first light emitting element LD1, a second light emitting element LD2, a third light emitting element LD3, and a fourth light emitting element LD4 that are connected in series in a forward direction between the first driving power supply VDD and the second driving power supply VSS and thus form a valid light source. In the following embodiment, the term "light emitting element LD" or "light emitting elements LD" will be used to arbitrarily designate one light emitting element of the first to fourth light emitting elements LD1 to LD4 or collectively designate the first to fourth light emitting elements LD1 to LD4.

One end (e.g., a second semiconductor layer) of the first light emitting element LD1 may be connected to the first driving power supply VDD by a first electrode EL1, and a remaining end (e.g., a first semiconductor layer) of the first light emitting element LD1 may be connected to one end (e.g., a second semiconductor layer) of the second light emitting element LD2 by a first intermediate electrode CTE1 connected between first and second serial sets.

The one end of the second light emitting element LD2 may be connected to the first intermediate electrode CTE1, and a remaining end thereof (e.g., a first semiconductor layer) may be connected to one end (e.g., a second semiconductor layer) of the third light emitting element LD3 by a second intermediate electrode CTE2 connected between the second serial set and a third serial set.

The one end of the third light emitting element LD3 may be connected to the second intermediate electrode CTE2, and a remaining end thereof (e.g., a first semiconductor layer) may be connected to one end (e.g., a second semiconductor layer) of the fourth light emitting element LD4 by a third intermediate electrode CTE3 connected between the third serial set and a fourth serial set.

The one end of the fourth light emitting element LD4 may be connected to the third intermediate electrode CTE3, and a remaining end thereof (e.g., a first semiconductor layer) may be connected to the second driving power supply VSS by a second electrode EL2.

As described above, the first to fourth light emitting elements LD1 to LD4 may be connected in series between the first and second electrodes EL1 and EL2 of the emission unit EMU of the pixel PXL.

In the case of the emission unit EMU having a structure in which the light emitting elements LD are connected in series to each other, a voltage to be applied between the first and second electrodes EL1 and EL2 may be increased, and the amount of driving current flowing through the emission unit EMU may be reduced, compared to the case of the emission unit EMU having a structure in which the light emitting elements LD are connected in parallel to each other. Therefore, in the case that the emission unit EMU of each pixel PXL has a serial structure, the power consumption of the display device may be reduced.

In one or more embodiments, at least one serial set may be provided in the form of including a plurality of light emitting elements LD connected in parallel to each other. In this case, the emission unit EMU of each pixel PXL may be formed of a serial/parallel combination structure. For example, the emission unit EMU may be configured as illustrated in FIG. 7B.

Next, referring to FIG. 7B, the emission unit EMU of the pixel PXL may include a plurality of serial sets that are successively connected to each other between the first and second driving power supplies VDD and VSS. Each of the serial sets may include one or more light emitting elements LD that are connected in the forward direction between two electrodes that constitute an electrode pair of the corresponding serial set. For example, the emission unit EMU may include first to third serial sets SET1 to SET3 that are successively connected between the first and second driving power supplies VDD and VSS. Each of the first to third serial sets SET1 to SET3 may include two electrodes EL1 and EL2a, EL2b and EL3a, and EL3b and EL4 that constitute an electrode pair of the corresponding serial set, and a plurality of light emitting elements LD that are connected in parallel to each other between each two electrodes EL1 and EL2a, EL2b and EL3a, and EL3b and EL4 in the forward direction, that is, in the same direction.

The first serial set SET1 may include the first electrode EL1 and the 2a-th electrode EL2a among the two electrodes EL1 and EL2a, EL2b and EL3a, and EL3b and EL4 that constitute the electrode pairs included in the emission unit EMU, and at least one first light emitting element LD1 connected between the first electrode EL1 and the 2a-th electrode EL2a. For example, the first serial set SET1 may include the first electrode EL1 connected to the first driving power supply VDD via the pixel circuit 144, the 2a-th electrode EL2a connected to the second driving power supply VSS, and a plurality of first light emitting elements LD1 connected between the first electrode EL1 and the 2a-th electrode EL2a. One end (e.g., a second semiconductor layer) of each first light emitting element LD1 may be electrically connected to the first electrode EL1 of the first serial set SET1, and a remaining end (e.g., a first semiconductor layer) thereof may be electrically connected to the 2a-th electrode EL2a of the first serial set SET1. The first light emitting elements LD1 may be connected in parallel between the first electrode EL1 and the 2a-th electrode EL2a, and connected in the same direction (e.g., a forward direction) between the first electrode EL1 and the 2a-th electrode EL2a. In one or more embodiments, at least one reverse light emitting element (refer to LDr of FIG. 6E) may be further connected to the first serial set SET1. The reverse light emitting element LDr, along with the first light emitting elements LD1 that form valid light sources, may be connected in parallel between the first electrode EL1 and the 2a-th electrode EL2a. The reverse light emitting element LDr may be connected between the first electrode EL1 and the 2a-th electrode EL2a in a direction opposite to that of the first light emitting elements LD1. Even if a suitable driving voltage (e.g., a set or predetermined driving voltage, for example, a forward driving voltage) is applied between the first and 2a-th electrodes EL1 and EL2a, the reverse light emitting element LDr remains disabled. Hence, current does not substantially flow through the reverse light emitting element LDr.

The second serial set SET2 may include the 2b-th electrode EL2b and the 3a-th electrode EL3a among the two electrodes EL1 and EL2a, EL2b and EL3a, and EL3b and EL4 that constitute the electrode pairs included in the emission unit EMU, and at least one second light emitting element LD2 connected between the 2b-th electrode EL2b and the 3a-th electrode EL3a. For example, the second serial set SET2 may include the 2b-th electrode EL2b connected to the first driving power supply VDD via the pixel circuit 144 and the first serial set SET1, the 3a-th electrode EL3a connected to the second driving power supply VSS, and a plurality of second light emitting elements LD2 connected between the 2b-th electrode EL2b and 3a-th electrode EL3a. One end (e.g., a second semiconductor layer) of each second light emitting element LD2 may be electrically connected to the 2b-th electrode EL2b of the second serial set SET2, and a remaining end (e.g., a first semiconductor layer) thereof may be electrically connected to the 3a-th electrode EL3a of the second serial set SET2. The second light emitting elements LD2 may be connected in parallel between the 2b-th and 3a-th electrodes EL2b and EL3a of the second serial set SET2 and connected in the same direction (e.g., in the forward direction) between the first and second driving power supplies VDD and VSS through the 2b-th and 3a-th electrodes EL2b and EL3a. In one or more embodiments, at least one reverse light emitting element (refer to LDr of FIG. 6E) may be further connected between the 2b-th and 3a-th electrodes EL2b and EL3a. The reverse light emitting element LDr, along with the second light emitting elements LD2 that form valid light sources, may be connected in parallel between the 2b-th and 3a-th electrodes EL2b and EL3a. The reverse light emitting element LDr may be connected between the 2b-th and 3a-th electrodes EL2b and EL3a in a direction opposite to that of the second light emitting elements LD2.

In one or more embodiments of the present disclosure, the 2a-th electrode EL2a of the first serial set SET1 and the 2b-th electrode EL2b of the second serial set SET2 may be integrally provided and connected to each other. In other words, the 2a-th electrode EL2a of the first serial set SET1 and the 2b-th electrode EL2b of the second serial set SET2 may form the second electrode EL2 that electrically connects the first serial set SET1 with the second serial set SET2. As described above, in the case that the 2a-th electrode EL2a of the first serial set SET1 and the 2b-th electrode EL2b of the second serial set SET2 are integrally provided, the 2a-th electrode EL2a and the 2b-th electrode EL2b may be different areas of the second electrode EL2.

The third serial set SET3 may include at least one third light emitting element LD3 connected between the 3b-th electrode EL3b and the fourth electrode EL4 among the two electrodes EL1 and EL2a, EL2b and EL3a, and EL3b and EL4 that constitute the electrode pairs included in the emission unit EMU. For example, the third serial set SET3 may include the 3b-th electrode EL3b connected to the first driving power supply VDD via the pixel circuit 144 and the previous serial sets, e.g., the first and second serial sets SET1 and SET2, the fourth electrode EL4 connected to the second driving power supply VSS, and a plurality of third light emitting elements LD3 connected between the 3b-th electrode EL3b and the fourth electrode EL4. One end (e.g., a second semiconductor layer) of each third light emitting element LD3 may be electrically connected to the 3b-th electrode EL3b of the third serial set SET3, and a remaining end (e.g., a first semiconductor layer) thereof may be electrically connected to the fourth electrode EL4 of the third serial set SET3. The third light emitting elements LD3 may be connected in parallel to each other between the 3b-th electrode EL3b and the fourth electrode EL4 of the third serial set SET3. The third light emitting elements LD3 may be connected in the same direction (e.g., in the forward direction) between the first and second driving power supplies VDD and VSS through the 3b-th electrode EL3b and the fourth electrode EL4. In one or more embodiments, at least one reverse light emitting element (refer to LDr of FIG. 6E) may be further connected between the 3b-th and fourth electrodes EL3b and EL4. The reverse light emitting element LDr, along with the third light emitting elements LD3 that form valid light sources, may be connected in parallel between the 3b-th and fourth electrodes EL3b and EL4. The reverse light emitting element LDr may be connected between the 3b-th and fourth electrodes EL3b and EL4 in a direction opposite to that of the third light emitting elements LD3.

In one or more embodiments of the present disclosure, the 3a-th electrode EL3a of the second serial set SET2 and the 3b-th electrode EL3b of the third serial set SET3 may be integrally provided and connected to each other. In other words, the 3a-th electrode EL3a of the second serial set SET2 and the 3b-th electrode EL3b of the third serial set SET3 may form the third electrode EL3 that electrically connects the second serial set SET2 with the third serial set SET3. As described above, in the case that the 3a-th electrode EL3a of the second serial set SET2 and the 3b-th electrode EL3b of the third serial set SET3 are integrally provided, the 3a-th electrode EL3a and the 3b-th electrode EL3b may be different areas of the third electrode EL3.

In the foregoing embodiment, the first electrode EL1 of the first serial set SET1 may be an anode electrode of the emission unit EMU of each pixel PXL. The fourth electrode EL4 of the third serial set SET3 may be a cathode electrode of the emission unit EMU.

As described above, in the emission unit EMU of the pixel PXL including the light emitting elements LD connected to each other in a serial/parallel combination structure, driving current/voltage conditions may be adjusted in response to specifications of a product to which the emission unit EMU is applied.

For example, in the emission unit EMU of the pixel PXL including the light emitting elements LD connected to each other in a serial/parallel combination structure, the driving current thereof may be reduced, compared to that of the emission unit EMU including the light emitting elements LD connected in parallel to each other. Furthermore, in the emission unit EMU of the pixel PXL including the light emitting elements LD connected to each other in the serial/parallel combination structure, driving voltages to be applied to the opposite ends of the emission unit EMU may be reduced, compared to that of the emission unit EMU including the light emitting elements LD all connected in series to each other. In the case that all of the light emitting elements LD are connected only in series, if at least one of the light emitting elements LD connected in series to each other is not completely oriented in the forward direction (or a reverse light emitting element LDr is included), a dark spot defect may be caused when a path along which the driving current is able to flow in the pixel PXL is blocked. On the other hand, in the case that the light emitting elements LD are connected to each other in the serial/parallel combination structure, even if some light emitting elements LD in each serial set are not correctly connected in the forward direction (or a reverse light emitting element LDr is included) or defects occur in some light emitting elements LD, the driving current is allowed to flow through the other light emitting elements LD of the corresponding serial set. Therefore, defects of the pixel PXL may be prevented or reduced.

Figure 8:
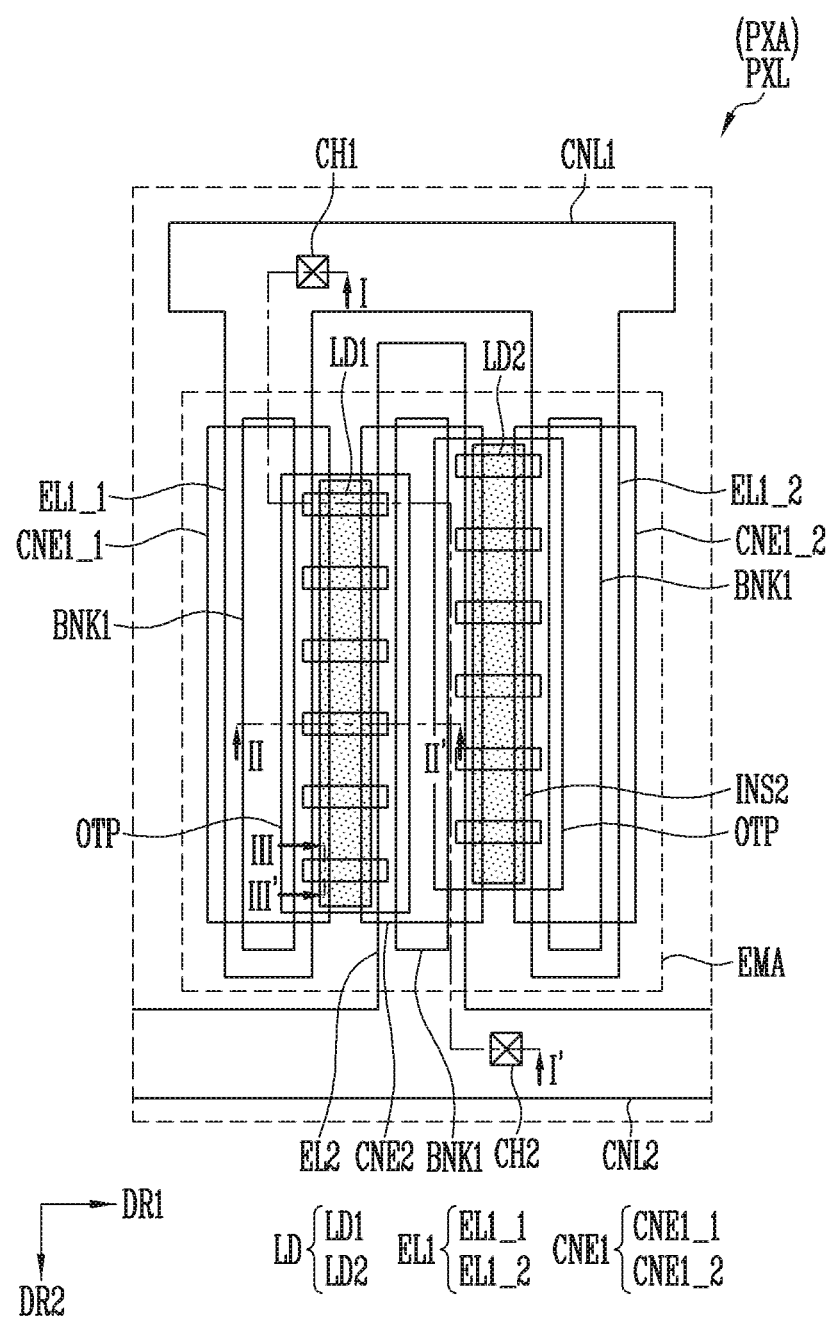
FIG. 8 is a plan view schematically illustrating one pixel of the pixels illustrated in FIG. 5.
Figure 9:
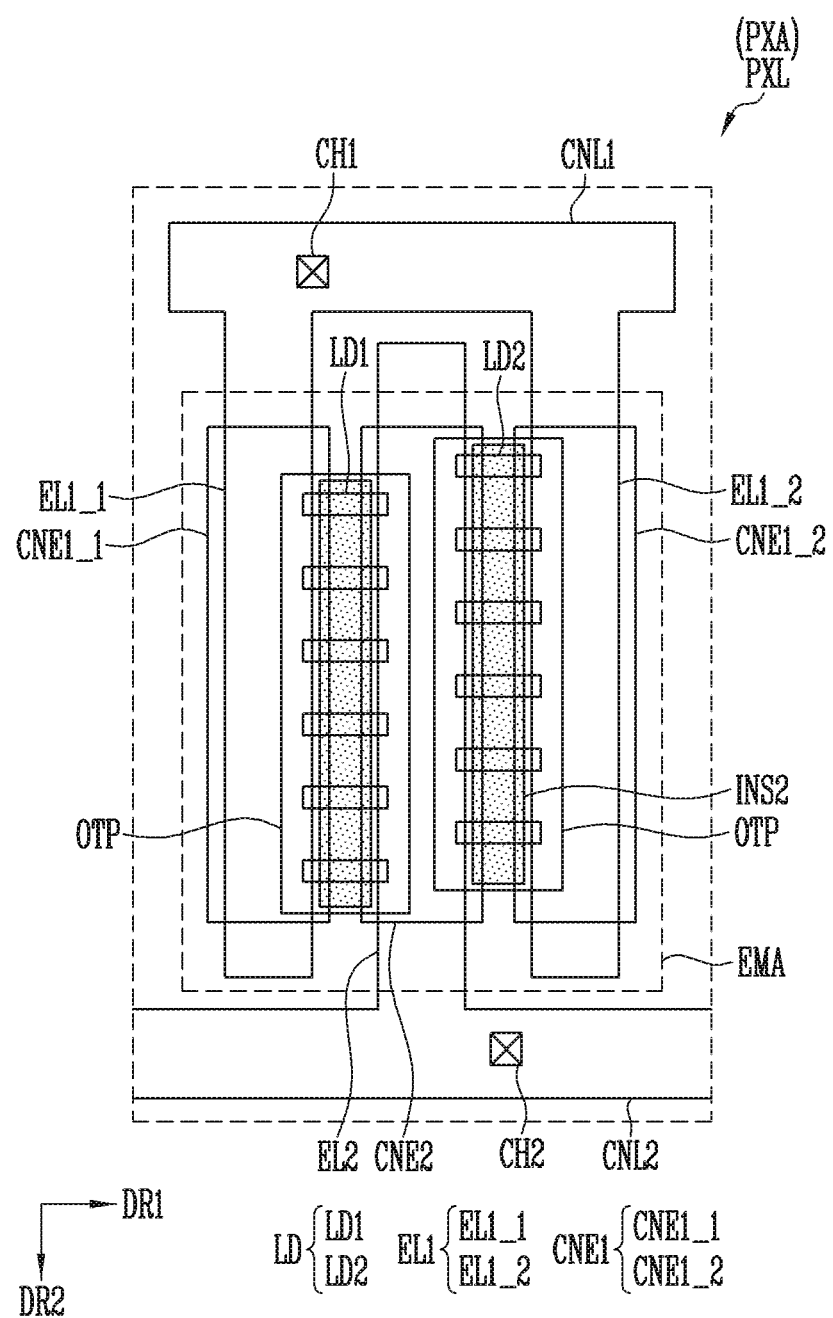
FIG. 9 is a plan view schematically illustrating the pixel of FIG. 8 including components other than a first bank pattern.
Figure 10:
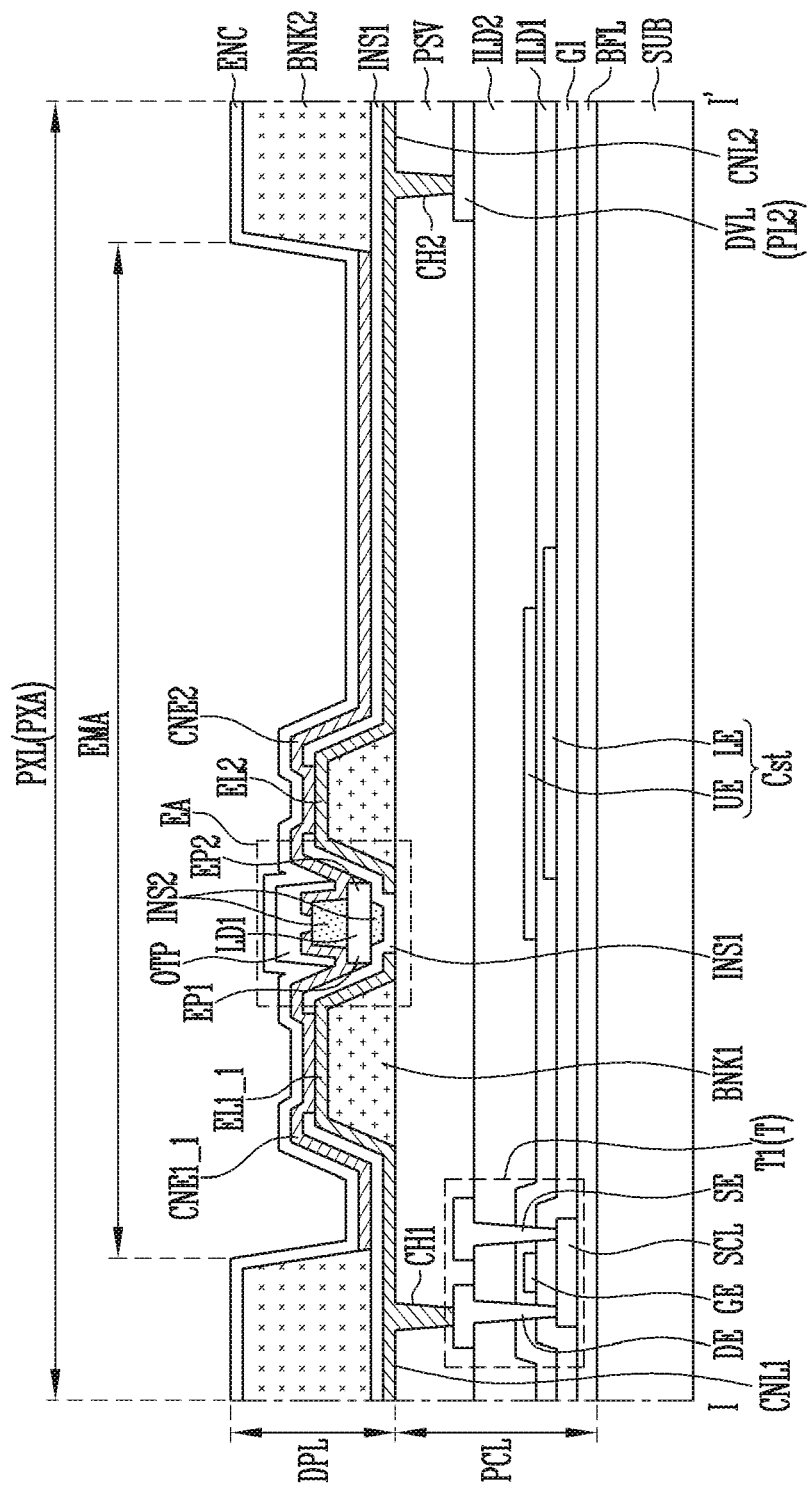
FIG. 10 is a schematically cross-sectional view taken along the line I-I' of FIG. 8.
Figure 11:
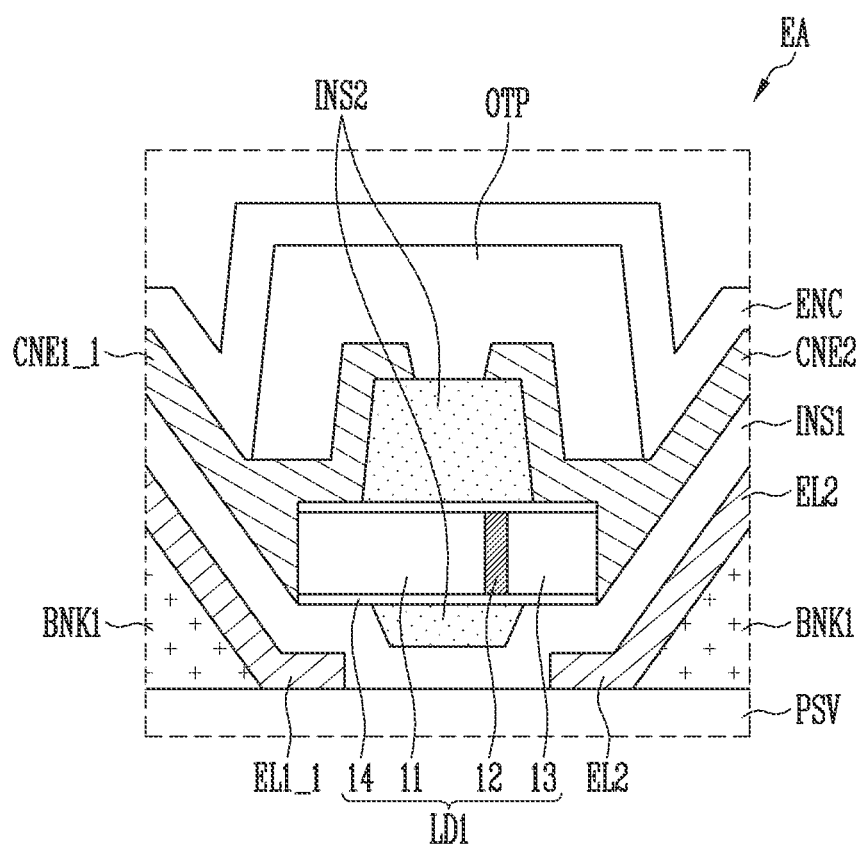
FIG. 11 is an enlarged schematically cross-sectional view of a portion EA of FIG. 10.
Figure 12A:
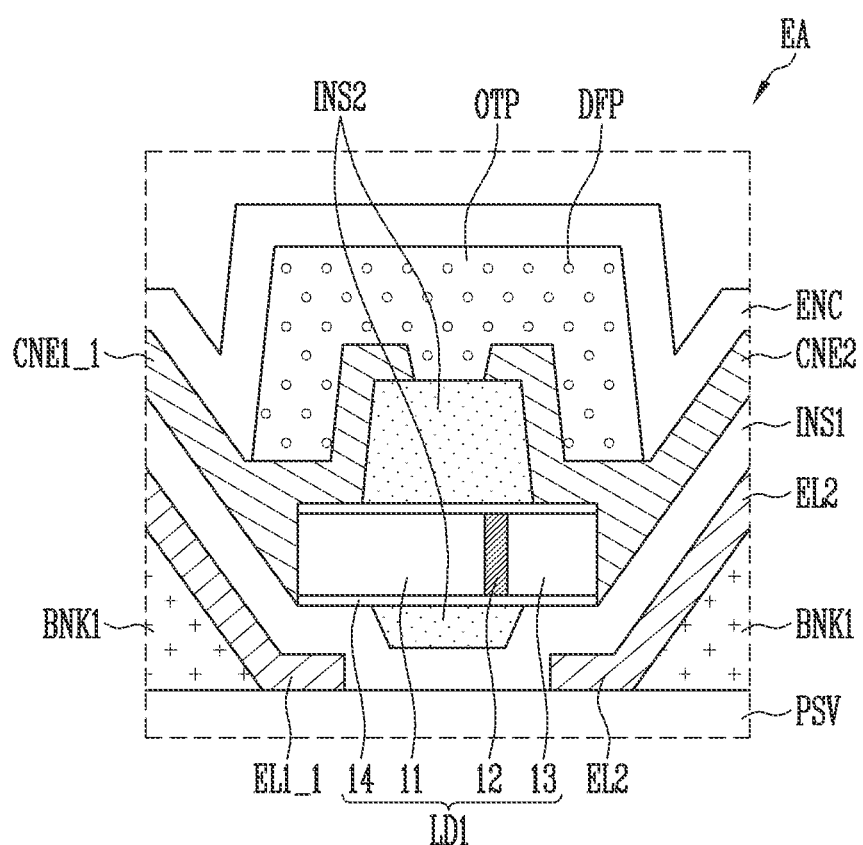
FIGS. 12A and 12B illustrate different embodiments of an optical pattern illustrated in FIG. 11, and are enlarged schematically cross-sectional views corresponding to portion EA of FIG. 10.
Figure 12B:
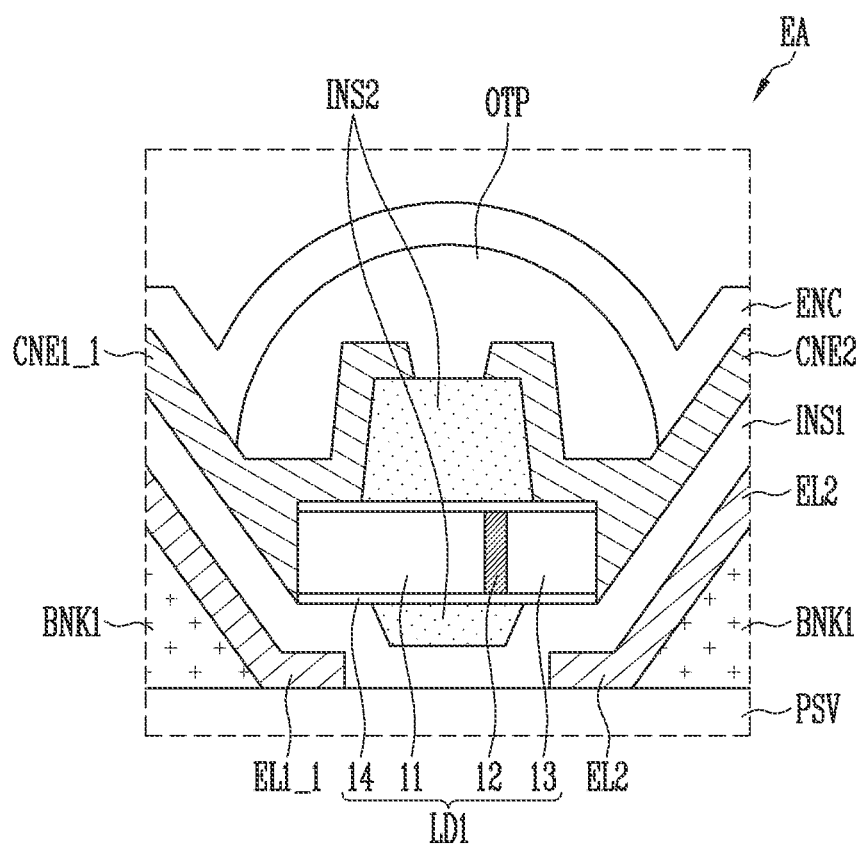
Figure 13:
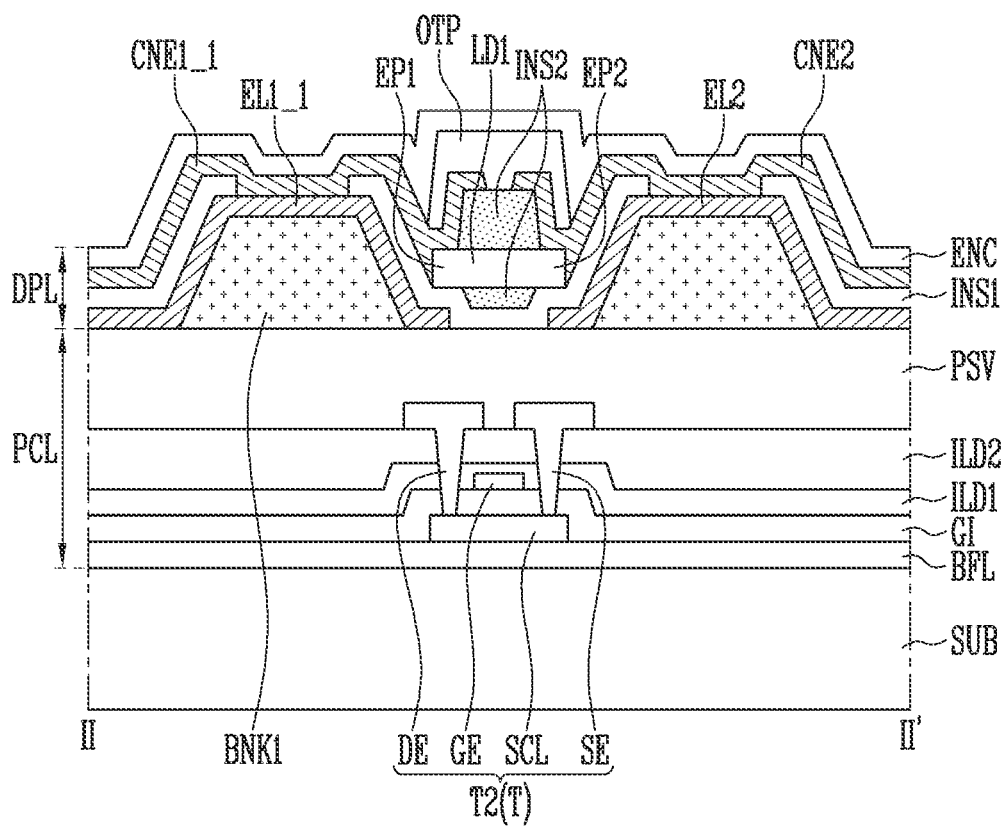
FIG. 13 is schematically cross-sectional view taken along the line II-II' of FIG. 8.
Figure 14:
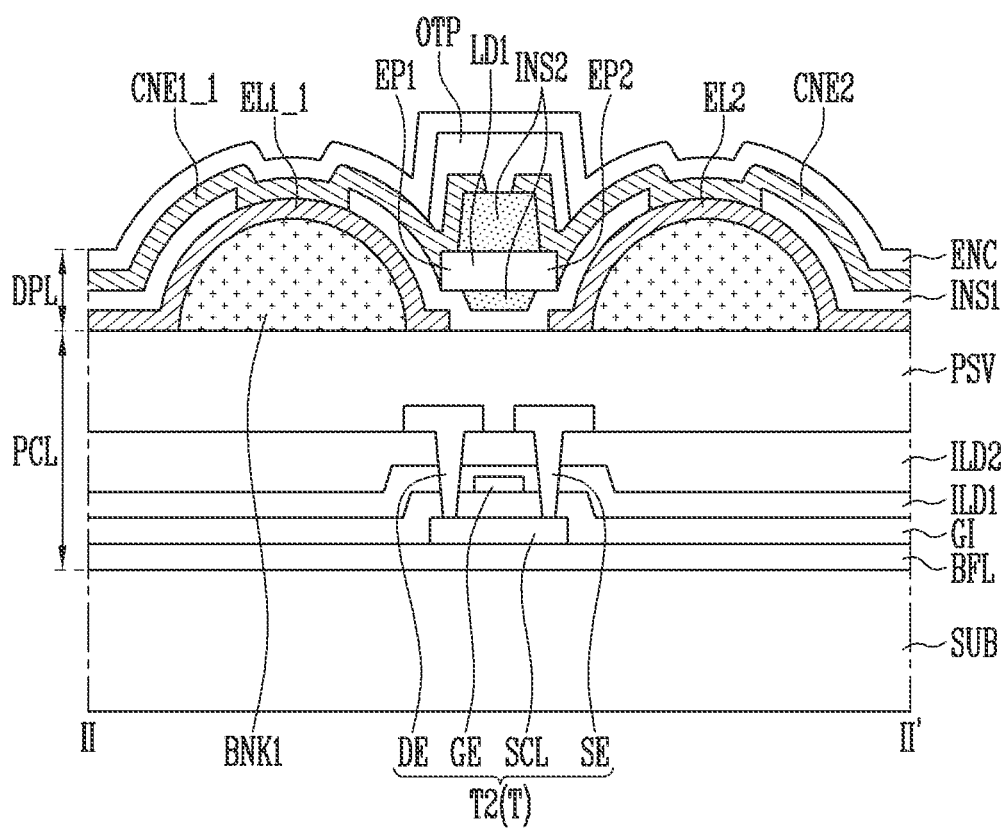
FIG. 14 illustrates an embodiment of a first bank pattern illustrated in FIG. 13, and is a schematically cross-sectional view corresponding to the line II-II' of FIG. 8.
Figure 15:
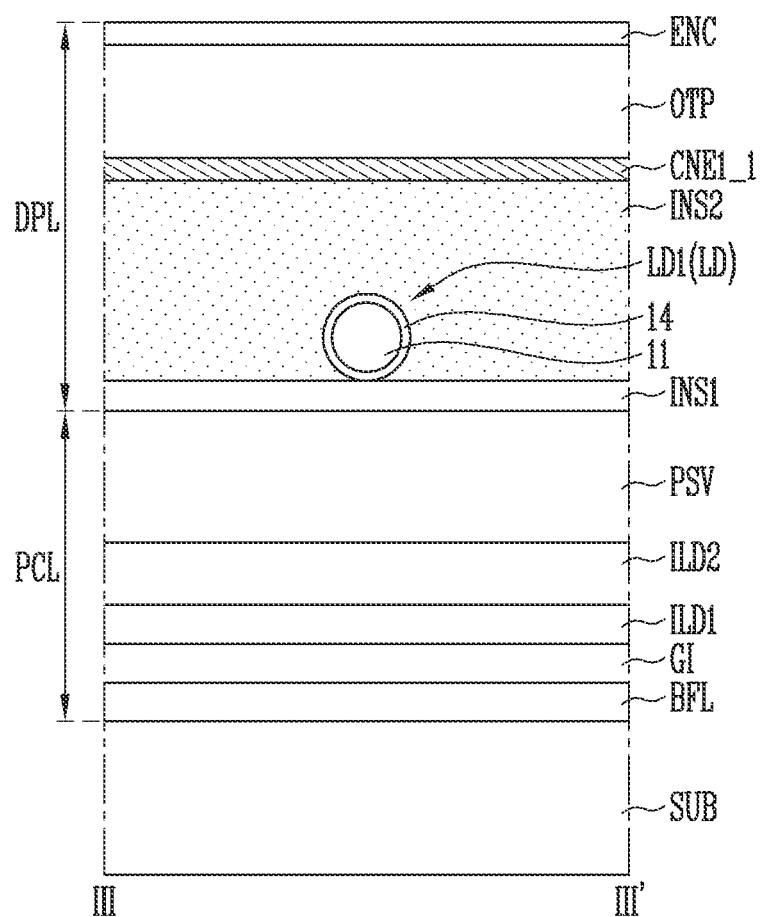
FIG. 15 is a schematically cross-sectional view taken along the line III-III' of FIG. 8.

FIG. 8 is a plan view schematically illustrating one pixel of the pixels illustrated in FIG. 5. FIG. 9 is a plan view schematically illustrating the pixel of FIG. 8 including components other than a first bank pattern. FIG. 10 is a sectional view taken along the line I-I' of FIG. 8. FIG. 11 is an enlarged sectional view of a portion EA of FIG. 10. FIGS. 12A and 12B illustrate different embodiments of an optical pattern illustrated in FIG. 11, and are enlarged sectional views corresponding to the portion EA of FIG. 10. FIG. 13 is a sectional view taken along the line II-II' of FIG. 8. FIG. 14 illustrates another embodiment of a first bank pattern illustrated in FIG. 13, and is a sectional view corresponding to the line II-II' of FIG. 8. FIG. 15 is a sectional view taken along the line III-III' of FIG. 8.

The pixel PXL illustrated in FIG. 8 may be any one of the pixels PXL respectively illustrated in FIGS. 6A to 6E, 7A, and 7B. For example, the pixel PXL illustrated FIG. 8 may be the pixel PXL illustrated in FIG. 6A.

For the sake of explanation, illustration of transistors connected to the light emitting elements LD and signal lines connected to the transistors is omitted in FIG. 8.

Although FIGS. 8 to 15 simply illustrate the structure of a pixel PXL, e.g., illustrate that each electrode is formed of a single electrode layer and each insulating layer is formed of a single insulating layer, the present disclosure is not limited thereto.

In addition, in the description of embodiments of the present disclosure, "components are provided and/or formed on the same layer" may mean that the components are formed through the same process, and "components are provided and/or formed on different layers may mean that the components are formed through different processes.

Referring to FIGS. 1A to 5, 6A, and 8 to 15, the display device in accordance with one or more embodiments of the present disclosure may include a substrate SUB, a line component, and a plurality of pixels PXL.

The substrate SUB may include a transparent insulating material to allow light transmission. The substrate SUB may be a rigid substrate or a flexible substrate.

For example, the rigid substrate may be one of a glass substrate, a quartz substrate, a glass ceramic substrate, and a crystalline glass substrate. The flexible substrate may be either a film substrate or a plastic substrate that includes a polymer organic material. For example, the flexible substrate may include at least one of the following: polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

However, materials constituting the substrate SUB may be changed, and include, for example, fiber reinforced plastic (FRP). Material applied to the substrate SUB may have resistance (thermal resistance) to high treatment temperatures during a process of fabricating the display device.

The substrate SUB may include a display area DA including at least one pixel area PXA in which the pixel PXL is disposed, and a non-display area NDA disposed around the display area DA.

In one or more embodiments, pixels PXL may be arranged in the display area DA in a matrix shape and/or a stripe shape along a plurality of pixel rows extending in a first direction DR1 and a plurality of pixel columns extending a second direction DR2 intersecting the first direction DR1, but the present disclosure is not limited thereto. In one or more embodiments, the pixels PXL may be disposed in the display area DA on the substrate SUB in various arrangement manners.

The pixel area PXA in which each pixel PXL is disposed (or provided) may include an emission area EMA from which light is emitted, and a peripheral area that encloses a perimeter of the emission area EMA. In one or more embodiments of the present disclosure, the term "peripheral area" may include a non-emission area from which no light is emitted.

Each pixel PXL may include a pixel circuit layer PCL provided on the substrate SUB and including a pixel circuit 144, and a display element layer DPL including a plurality of light emitting elements LD. The light emitting elements LD may be disposed in the emission area EMA of the pixel area PXA of each pixel PXL.

For the convenience sake, the pixel circuit layer PCL will be first described, and then the display element layer DPL will be described.

The pixel circuit layer PCL may include the pixel circuit 144 and a passivation layer PSV, the pixel circuit 144 including a buffer layer BFL, at least one transistor T, a storage capacitor Cst, a driving voltage line DVL, etc.

The buffer layer BFL may prevent impurities from diffusing into the transistor T. Although the buffer layer BFL may be provided in a single-layer structure, the buffer layer BFL may be provided in a multi-layer structure having at least two or more layers. In the case that the buffer layer BFL has a multi-layer structure, the respective layers may be formed of the same material or different materials. The buffer layer BFL may be omitted depending on the material of the substrate SUB or processing conditions.

The transistor T may include a first transistor T1 which is a driving transistor for controlling the amount of driving current to be supplied to the light emitting elements LD, and a second transistor T2 which is a switching transistor. In one or more embodiments of the present disclosure, the first transistor T1 may be the first transistor T1 of the pixel circuit 144 described with reference to FIG. 6A. The second transistor T2 may be the second transistor T2 of the pixel circuit 144 described with reference to FIG. 6A. In the following embodiment, the term "transistor T" or "transistors T" will be used to designate any one transistor of the first and second transistors T1 and T2 or collectively designate the first and second transistors T1 and T2.

Each of the first transistor T1 and the second transistor T2 may include a transistor semiconductor pattern SCL, a gate electrode GE, a first terminal SE, and a second terminal DE. The first terminal SE may be either a source electrode or a drain electrode, and the second terminal DE may be the other electrode. For example, in the case that the first terminal SE is a source electrode, the second terminal DE may be a drain electrode.

The transistor semiconductor pattern SCL may be provided and/or formed on the buffer layer BFL. The transistor semiconductor pattern SCL may include a first contact area that comes into contact with the first terminal SE, and a second contact area which comes into contact with the second terminal DE. An area between the first contact area and the second contact area may be a channel area. The transistor semiconductor pattern SCL may be a semiconductor panel formed of polysilicon, amorphous silicon, an oxide semiconductor, etc. The channel area may be an intrinsic semiconductor, which is an undoped semiconductor pattern. Each of the first contact area and the second area may be a semiconductor pattern doped with impurities.

The gate electrode GE may be provided and/or formed on the transistor semiconductor pattern SCL with a gate insulating layer GI interposed therebetween. For example, the gate insulating layer GI may be disposed over the semiconductor pattern SCL and the buffer layer BFL. A first interlayer insulating layer ILD1 may be disposed on the gate electrode GE, a lower electrode LE of the storage capacitor Cst, and the gate insulating layer GI. An upper electrode UE of the storage capacitor Cst may be disposed on the first interlayer insulating layer ILD1. A second interlayer insulating layer ILD2 may cover the upper electrode UE of the storage capacitor Cst.

The first terminal SE and the second terminal DE of the transistor T may be disposed on the second interlayer insulating layer ILD2 and may respectively contact the first contact area and the second contact area of the transistor semiconductor pattern SCL through corresponding contact holes that pass through first and second interlayer insulating layers ILD1 and ILD2 and the gate insulating layer GI.

Although in the foregoing embodiment the first and second terminals SE and DE of each of the first transistor T1 and the second transistor T2 each have been described as being a separate electrode electrically connected with the transistor semiconductor pattern SCL through the contact hole that passes through the gate insulating layer GI and the first and second interlayer insulating layers ILD1 and ILD2, the present disclosure is not limited thereto. In one or more embodiments, the first terminal SE of each of the first transistor T1 and the second transistor T2 may be one contact area of the first and second contact areas adjacent to the channel area of the corresponding transistor semiconductor pattern SCL. The second terminal DE of each of the first transistor T1 and the second transistor T2 may be the other contact area of the first and second contact areas adjacent to the channel area of the corresponding transistor semiconductor pattern SCL. In this case, the second terminal DE of each of the first transistor T1 and the second transistor T2 may be electrically connected to the light emitting elements LD of the corresponding pixel PXL through a bridge electrode, a contact electrode, or the like.

In one or more embodiments of the present disclosure, each of the transistors T included in the pixel circuit 144 may be formed of Low Temperature Polysilicon (LTPS) thin-film transistor, but the present disclosure is not limited thereto. In one or more embodiments, each transistor T may be formed of an oxide semiconductor thin-film transistor. Furthermore, there has been illustrated the case where each of the transistors T is a thin-film transistor having a top gate structure, but the present disclosure is not limited thereto. In one or more embodiments, each of the transistors T may be a thin-film transistor having a bottom gate structure.

In one or more embodiments, the transistors T included in the pixel circuit layer PCL may not only include the first and second transistors T1 and T2 but may also include additional transistors such as a transistor for compensating for a threshold voltage of the first transistor T1, and a transistor for controlling a light emission time of each of the light emitting elements LD.

The storage capacitor Cst may include the lower electrode LE disposed on the gate insulating layer GI, and the upper electrode UE that is disposed on the first interlayer insulating layer ILD1 and overlaps the lower electrode LE.

The lower electrode LE may be provided on the same layer as that of the gate electrode GE of the first transistor T1 and include the same material as that of the gate electrode GE. In one or more embodiments, the lower electrode LE may be provided integrally with the gate electrode GE of the first transistor T1 or may be provided as a component separate from the gate electrode GE.

The upper electrode UE may overlap the lower electrode LE and cover the lower electrode LE. The capacity of the storage capacitor Cst may be increased by increasing an overlapping area between the upper electrode UE and the lower electrode LE. The upper electrode UE may be electrically connected with the first power line (refer to PL1 of FIG. 6A). Therefore, a voltage of the first driving power supply VDD applied to the first power line PL1 may be transmitted to the upper electrode UE. The second interlayer insulating layer ILD2 may be disposed on the upper electrode UE. The second interlayer insulating layer ILD2 may be an inorganic insulating layer including an inorganic material or an organic insulating layer including an organic material.

The driving voltage line DVL may be disposed on the second interlayer insulating layer ILD2. The driving voltage line DVL may be the second power line PL2 to which a voltage of the second driving power supply VSS is applied, in the pixel PXL illustrated in FIG. 6A.

The passivation layer PSV may be provided and/or formed on the driving voltage line DVL and the transistors T.

The passivation layer PSV may be provided in the form of an organic insulating layer, an inorganic insulating layer, or a structure including the organic insulating layer disposed on the inorganic insulating layer. The inorganic insulating layer may include at least one of silicon oxide ($SiO_x$), silicon nitride ($SiN_x$), silicon oxynitride (SiON), and metallic oxide such as $AlO_x$. The organic insulating layer may include an organic insulating material allowing light to pass therethrough. The organic insulating layer may include, for example, at least one of polyacrylates resin, epoxy resin, phenolic resin, polyamides resin, polyimides rein, unsaturated polyesters resin, poly-phenylen ethers resin, polyphenylene sulfides resin, and benzocyclobutene resin.

Next, the display element layer DPL of each of the pixels PXL will be described.

The display element layer DPL may include first and second bank patterns BNK1 and BNK2, first and second electrodes EL1 and EL2, first and second connection lines CNL1 and CNL2, light emitting elements LD, and contact electrodes CNE1 and CNE2.

The first bank pattern BNK1 may be a support component that supports each of the first and second electrodes EL1 and EL2 so as to change a surface profile of each of the first and second electrodes EL1 and EL2 so that light emitted from the light emitting elements LD may more effectively travel in an image display direction of the display device.

The first bank pattern BNK1 may be provided and/or formed between the passivation layer PSV in the emission area EMA of each pixel PXL and the first and second electrodes EL1 and EL2. For example, the first bank pattern BNK1 may be provided and/or formed each between the passivation layer PSV and the first electrode EL1 and between the passivation layer PSV and the second electrode EL2. The first bank pattern BNK1 may include an inorganic insulating layer formed of an inorganic material, or an organic insulating layer formed of an organic material. In one or more embodiments, the first bank pattern BNK1 may include an organic insulating layer having a single-layer structure and/or an inorganic insulating layer having a single layer structure, but the present disclosure is not limited thereto. In one or more embodiments, the first bank pattern BNK1 may be provided in the form of a multi-layer structure formed by stacking at least one organic insulating layer and at least one inorganic insulating layer. However, the material of the first bank pattern BNK1 is not limited to the foregoing embodiments. In one or more embodiments, the first bank pattern BNK1 may include conductive material.

The first bank pattern BNK1 may have a trapezoidal cross-section which is reduced in width from one surface of the passivation layer PSV upward, but the present disclosure is not limited thereto. In one or more embodiments, the first bank pattern BNK1 may include a curved surface having a cross-section having a semi-elliptical shape, a semi-circular shape (or a hemispherical shape), etc., which is reduced in width upward from one surface of the passivation layer PSV, as illustrated in FIG. 14. In a cross-sectional view, the shape of the first bank pattern BNK1 is not limited to the foregoing embodiments, and may be changed in various ways within a range in which the efficiency of light emitted from each of the light emitting elements LD may be enhanced. First bank patterns BNK1 adjacent to each other may be disposed on the same plane on the passivation layer PSV and have the same height (or thickness).

Although in a plan view the first bank pattern BNK1 may have a bar-like shape extending in one direction, e.g., the second direction DR2 (a vertical direction), the present disclosure is not limited thereto, and the shape thereof may be changed in various shapes.

The second bank pattern BNK2 may enclose at least one side of the peripheral area of each pixel PXL. The second bank pattern BNK2 may be a structure configured to define (or partition) the respective emission areas EMA of each pixel PXL and a pixel PXL adjacent thereto and, for example, may be a pixel defining layer. The second bank pattern BNK2 may include at least one light blocking material and/or reflective material, thus preventing a light leakage defect in which light (or rays) leaks between each pixel PXL and the pixels PXL adjacent thereto. In one or more embodiments, a reflective material layer may be formed on the second bank pattern BNK2 so as to further enhance the efficiency of light emitted from each pixel PXL. Although the second bank pattern BNK2 may be formed and/or provided on a layer different from that of the first bank pattern BNK1, the present disclosure is not limited thereto. In one or more embodiments, the second bank pattern BNK2 may be formed and/or provided on the same layer as that of the first bank pattern BNK1. In one or more embodiments of the present disclosure, the second bank pattern BNK2 may be formed on a layer different from that of the first bank pattern BNK1 and disposed on a first insulating layer INS1.

The first connection line CNL1 may extend in the first direction DR1 (e.g., 'horizontal direction') of each of the pixels PXL. The first connection line CNL1 may be provided and/or formed, to drive each pixel PXL independently or individually from adjacent pixels PXL, in only each pixel PXL, and electrically and/or physically separated from the first connection line CNL1 provided and/or formed in each of the adjacent pixels PXL. The first connection line CNL1 provided in each pixel PXL may be electrically connected with a component, e.g., the first transistor T1, included in the pixel circuit layer PCL of the corresponding pixel PXL through the first contact hole CH1 that passes through the passivation layer PSV.

The second connection line CNL2 may extend in a direction parallel to a direction in which the first connection line CNL1 extends. For instance, the second connection line CNL2 may extend in the first direction DR1. The second connection line CNL2 may be provided in common to each pixel PXL and pixels PXL adjacent thereto. Hence, a plurality of pixels PXL disposed on the same pixel row in the first direction DR1 may be connected in common to the second connection line CNL2. The second connection line CNL2 provided in each pixel PXL may be electrically connected with a component, e.g., the driving voltage line DVL, included in the pixel circuit layer PCL of the corresponding pixel PXL through the second contact hole CH2 that passes through the passivation layer PSV. Hence, the voltage of the second driving power supply VSS that is applied to the driving voltage line DVL may be transmitted to the second connection line CNL2.

Each of the first and second electrodes EL1 and EL2 may be provided in the emission area EMA of each pixel PXL and extend in one direction, e.g., the second direction DR2. The first electrode EL1 and the second electrode EL2 may be provided on the same surface and spaced from each other.

The first electrode EL1 may include a 1-1-th electrode EL1_1 and a 1-2-th electrode EL1_2 that diverge from the first connection line CNL1 in the second direction DR2. The 1-1-th electrode EL1_1, the 1-2-th electrode EL1_2, and the first connection line CNL1 may be integrally provided and electrically and/or physically connected to each other. In the case that the first electrode EL1 and the first connection line CNL1 are integrally provided, the first connection line CNL1 may be one area of the first electrode EL1, or the first electrode EL1 may be one area of the first connection line CNL1. Here, the present disclosure is not limited thereto. In one or more embodiments, the first electrode EL1 and the first connection line CNL1 may be individually formed and electrically connected to each other through a contact hole, a connector, etc.

The second electrode EL2 may diverge from the second connection line CNL2 in the second direction DR2. The second electrode EL2 and the second connection line CNL2 may be integrally provided and electrically and/or physically connected to each other. In the case that the second electrode EL2 and the second connection line CNL2 are integrally provided, the second connection line CNL2 may be one area of the second electrode EL2, or the second electrode EL2 may be one area of the second connection line CNL2. However, the present disclosure is not limited thereto. In one or more embodiments, the second electrode EL2 and the second connection line CNL2 may be individually formed and electrically connected to each other through a contact hole, a connector, etc., which are not illustrated.

The second electrode EL2 may be disposed between the 1-1-th electrode EL1_1 and the 1-2-th electrode EL1_2. The 1-1-th electrode EL1_1 and the second electrode EL2 may be spaced from each other (e.g., spaced from each other by a predetermined distance). The second electrode EL2 and the 1-2-th electrode EL1_2 may be spaced from each other (e.g., spaced from each other by a predetermined distance). In the emission area EMA of each pixel PXL, the distance between the 1-1-th electrode EL1_1 and the second electrode EL2 and the distance between the second electrode EL2 and the 1-2-th electrode EL12 may be the same as each other. Therefore, the light emitting elements LD may be more uniformly arranged in the emission area EMA of each pixel PXL. However, the present disclosure is not limited thereto. In one or more embodiments, the distance between the 1-1-th electrode EL1_1 and the second electrode EL2 and the distance between the second electrode EL2 and the 1-2-th electrode EL1_2 may differ from each other.

Each of the first and second electrodes EL1 and EL2 may be provided and/or formed on the first bank pattern BNK1 and have a surface profile corresponding to the shape of the first bank pattern BNK1. For example, each of the first and second electrodes EL1 and EL2 may include a protrusion corresponding to the first bank pattern BNK1, and a planar portion corresponding to the passivation layer PSV. Each of the first and second electrodes EL1 and EL2 may be formed of material having a desired reflectivity (e.g., a set or predetermined reflectivity) to allow light emitted from each of the light emitting elements LD to travel in an image display direction of the display device.

Each of the first and second electrodes EL1 and EL2 may be made of conductive material having a desired reflectivity (e.g., a set of predetermined reflectivity). The conductive material may include opaque metal that may be desirable for reflecting, in the image display direction of the display device, light emitted from the light emitting elements LD. The opaque metal may include metal, for example, Ag, Mg, Al, Pt, Pd, Au, Ni, Nd, Ir, Cr, Ti, and an alloy thereof. In one or more embodiments, each of the first and second electrodes EL1 and EL2 may include a transparent conductive material. The transparent conductive material may include conductive oxide such as indium tin oxide (ITO), indium zinc oxide (IZO), zinc oxide (ZnO), or indium tin zinc oxide (ITZO), or a conductive polymer such as PEDOT. In the case that each of the first and second electrodes EL1 and EL2 includes a transparent conductive material, a separate conductive layer formed of opaque metal for reflecting light emitted from the light emitting elements LD in the image display direction of the display device may be further included. However, the material of each of the first and second electrodes EL1 and EL2 is not limited to the foregoing materials.

Although each of the first and second electrodes EL1 and EL2 may be provided and/or formed in a single-layer structure, the present disclosure is not limited thereto. In one or more embodiments, each of the first and second electrodes EL1 and EL2 may be provided and/or formed in a multi-layer structure formed by stacking at least two materials among metals, alloys, conductive oxides, and conductive polymers. Each of the first and second electrodes EL1 and EL2 may have a multi-layer structure including at least two layers to reduce or minimize distortion resulting from a signal delay when signals (or voltages) are transmitted to opposite ends of each of the light emitting elements LD. For example, each of the first and second electrodes EL1 and EL2 may have a multi-layer structure in which layers are stacked in a sequence of indium tin oxide (ITO)/silver (Ag)/indium tin oxide (ITO).

In the case that the first connection line CNL1 is integrally provided with the first electrode EL1, the first connection line CNL1 may include the same material of that of the first electrode EL1. In the case that the second connection line CNL2 is integrally provided with the second electrode EL2, the second connection line CNL2 may include the same material of that of the second electrode EL2.

As described above, because each of the first and second electrodes EL1 and EL2 have a surface profile corresponding to the shape of the first bank pattern BNK1 disposed therebelow, light emitted from each of the light emitting elements LD may be reflected by each of the first and second electrodes EL1 and EL2 and more effectively travel in the image display direction of the display device. Consequently, the efficiency of light emitted from each of the light emitting elements LD may be further enhanced.

The first bank pattern BNK1 and the first and second electrodes EL1 and EL2 each may function as a reflective component configured to guide light emitted from the light emitting elements LD in a desired direction and thus enhance the optical efficiency of the display device. In other words, the first bank pattern BNK1 and the first and second electrodes EL1 and EL2 each may function as a reflective component configured to enable light emitted from the light emitting elements LD to travel in the image display direction of the display device, thus enhancing the light output efficiency of the light emitting elements LD.

Any one electrode of the first electrode EL1 and the second electrode EL2 may be an anode electrode, and the other electrode may be a cathode electrode. In one or more embodiments of the present disclosure, the first electrode EL1 may be an anode electrode, and the second electrode EL2 may be a cathode electrode.

Each of the light emitting elements LD may be formed of a light emitting element that is made of material having an inorganic crystal structure and has a subminiature size, e.g., ranging from the nanometer scale to the micrometer scale.

For example, each of the light emitting elements LD may be a subminiature light emitting element fabricated by an etching scheme, or a subminiature light emitting element fabricated by a growth scheme. For example, as illustrated FIG. 11, each of the light emitting elements LD may be a light emitting element that is fabricated by the etching scheme and includes an emissive stack pattern formed by successively stacking a first semiconductor layer 11, an active layer 12, and a second semiconductor layer 13 in a longitudinal direction (L), and an insulating layer 14 configured to enclose an outer surface (e.g., an outer peripheral or circumferential surface) (or a surface) of the emissive stack pattern. The type, the size, the shape, etc. of the light emitting elements LD may be changed in various ways.

Although at least two to several tens of light emitting elements LD may be aligned and/or provided in the emission area EMA of each pixel PXL, the number of light emitting elements LD is not limited thereto. In one or more embodiments, the number of light emitting elements LD aligned and/or provided in the emission area EMA of each pixel PXL may be changed in various ways.

In one or more embodiments of the present disclosure, each of the light emitting elements LD may emit anyone light of color light and/or white light. Each of the light emitting elements LD may be aligned between the first electrode EL1 and the second electrode EL2 such that the longitudinal direction (L) is parallel to the first direction DR1. The light emitting elements LD may be diffused in a solution and supplied into the emission area EMA of each pixel PXL.

In one or more embodiments of the present disclosure, the light emitting elements LD may be supplied to the emission area EMA of each pixel PXL by an inkjet printing scheme, a slit coating scheme, or other various schemes. For example, the light emitting elements LD may be mixed with a volatile solvent and then supplied to the emission area EMA of each pixel PXL by an inkjet printing scheme or a slit coating scheme. Here, if the first and second electrodes EL1 and EL2 disposed in the emission area EMA of each pixel PXL are respectively supplied with corresponding alignment signals (or alignment voltages), an electric field may be formed between the first electrode EL1 and the second electrode EL2. Hence, the light emitting elements LD may be aligned between the first electrode EL1 and the second electrode EL2.

After the alignment of the light emitting elements LD, the solvent may be removed by volatilization or other schemes. As a result, the light emitting elements LD may be eventually aligned and/or provided in the emission area EMA of each pixel PXL.

When the light emitting elements LD are aligned in the emission area EMA of the pixel PXL, each of the first and second electrodes EL1 and EL2 may function as alignment electrodes (or alignment lines) to which suitable alignment signals (e.g., set or predetermined alignment signals or alignment voltages) are to be applied so as to align the light emitting elements LD. For example, the first electrode EL1 may be a first alignment electrode (or a first alignment line) configured to receive a first alignment signal (or a first alignment voltage) from the first connection line CNL1. The second electrode EL2 may be a second alignment electrode (or a second alignment line) configured to receive a second alignment signal (or a second alignment voltage) from the second connection line CNL2. The first and second alignment signals may have different voltage levels. The first and second alignment signals may be signals having a voltage difference and/or a phase difference enabling the light emitting elements LD to be aligned between the first and second electrodes EL1 and EL2. For example, the first alignment signal may be a ground voltage, and the second alignment signal may be an alternating current (AC) signal, but the present disclosure is not limited thereto. In one or more embodiments, both the first and second alignment signals may be AC signals.

After the light emitting elements LD are aligned in the emission area EMA of each pixel PXL, the first and second electrodes EL1 and EL2 may function as driving electrodes for driving the light emitting elements LD.

When the light emitting elements LD are aligned in the emission area EMA of each pixel PXL, the light emitting elements LD supplied to the emission area EMA may be controlled to be relatively biased and aligned by controlling alignment signals (or alignment voltages) to be respectively applied to the first and second electrodes EL1 and EL2 or forming a magnetic field.

Each of the light emitting elements LD may include a first end EP1 electrically connected to one electrode of two adjacent electrodes in the emission area EMA of each pixel PXL, and a second end EP2 electrically connected to the other electrode of the two adjacent electrodes. In one or more embodiments of the present disclosure, the first end EP1 of each light emitting element LD may be a first semiconductor layer 11 including a n-type semiconductor layer, and the second end EP2 thereof may be a second semiconductor layer 13 including an p-type semiconductor layer. In other words, in the emission area EMA of each pixel PXL, each light emitting element LD may be connected in the forward direction between two electrodes adjacent to each other with a distance (e.g., a set or predetermined distance) therebetween. As described above, the light emitting elements LD connected between the two adjacent electrodes in the forward direction may form valid light sources of the emission unit EMU of each pixel PXL.

The light emitting elements LD may include first and second light emitting elements LD1 and LD2. For example, the light emitting elements LD may include a plurality of first light emitting elements LD1 disposed between the 1-1-th electrode EL1_1 and the second electrode EL2, and a plurality of second light emitting elements LD2 disposed between the second electrode EL2 and the 1-2-th electrode EL1_2.

The light emitting elements LD may be provided and/or formed on the first insulating layer INS1 in the emission area EMA of each pixel PXL.

The first insulating layer INS1 may be provided and/or formed under each of the light emitting elements LD in the emission area EMA of each pixel PXL. The first insulating layer INS1 may be located into space between each of the light emitting elements LD and the passivation layer PSV to stably support the light emitting elements LD and prevent the light emitting elements LD from being removed from the passivation layer PSV.

Furthermore, in the emission area EMA of each pixel PXL, the first insulating layer INS1 may expose one area of each of the first and second electrodes EL1 and EL2 and cover a remaining area thereof other than the one area. Here, the contact electrodes CNE1 and CNE2 may be respectively provided and/or formed on the exposed areas of the first and second electrodes EL1 and EL2 so that the first and second electrodes EL1 and EL2 may be electrically and/or physically connected to the contact electrodes CNE1 and CNE2.

The first insulating layer INS1 may be formed of an inorganic insulating layer including an inorganic material, or an organic insulating layer including an organic material. Although in one or more embodiments of the present disclosure the first insulating layer INS1 may be formed of inorganic insulating layer adapted for protecting the light emitting elements LD from the pixel circuit layer PCL of each pixel PXL, the present disclosure is not limited thereto. In one or more embodiments, the first insulating layer INS1 may be formed of an organic insulating layer that adapted for planarization of support surfaces of the light emitting elements LD.

A second insulating layer INS2 may be provided and/or formed on the light emitting elements LD. The second insulating layer INS2 may be provided and/or formed on each of the light emitting elements LD to cover a portion of an upper surface of each of the light emitting elements LD, and expose the opposite ends EP1 and EP2 of each of the light emitting elements LD to the outside. The second insulating layer INS2 may be formed in an independent insulating pattern in the emission area EMA of each pixel PXL, but the present disclosure is not limited thereto.

The second insulating layer INS2 may have a single-layer structure or a multi-layer structure, and include an inorganic insulating layer including at least one inorganic material or an organic insulating layer including at least one organic material. The second insulating layer INS2 may more reliably fix each of the light emitting elements LD aligned in the emission area EMA of each pixel PXL. In one or more embodiments of the present disclosure, the second insulating layer INS2 may include an inorganic insulating layer that is adapted for protecting the active layer 12 of each of the light emitting elements LD from external oxygen, water, etc. However, the present disclosure is not limited thereto. The second insulating layer INS2 may be formed of an organic insulating layer including an organic material, depending on design conditions of the display device to which the light emitting elements LD are applied.

In one or more embodiments of the present disclosure, after the alignment of the light emitting elements LD in the emission area EMA of each pixel PXL have been completed, the second insulating layer INS2 is formed on the light emitting elements LD so that the light emitting elements LD may be prevented from being removed from the aligned position. In the case that a gap (or space) is present between the first insulating layer INS1 and the light emitting elements LD before the formation of the second insulating layer INS2, the gap may be filled with the second insulating layer INS2 during a process of forming the second insulating layer INS2. Hence, the light emitting elements LD may be formed of an organic insulating layer adapted for filling the gap between the first insulating layer INS1 and the light emitting elements LD therewith.

In one or more embodiments of the present disclosure, the second insulating layer INS2 may be formed on each of the light emitting elements LD so that the active layer 12 of each of the light emitting elements LD may be prevented from contacting external conductive material. The second insulating layer INS2 may cover only a portion of the surface of each of the light emitting elements LD such that the opposite ends EP1 and EP2 of each of the light emitting elements LD may be exposed to the outside.

A contact electrode may be disposed on each of the first and second electrodes EL1 and EL2. The contact electrode may be a component configured to more reliably electrically connect each of the first and second electrodes EL1 and EL2 with the corresponding light emitting elements LD.

The contact electrode may include a first contact electrode CNE1 disposed on the first electrode EL1, and a second contact electrode CNE2 disposed on the second electrode EL2. The first and second contact electrodes CNE1 and CNE2 may be formed of various transparent conductive materials. For example, the first and second contact electrodes CNE1 and CNE2 may include at least one of various transparent conductive materials including ITO, IZO, and ITZO, and may be substantially transparent or translucent to satisfy a transmittancy (e.g., a set or predetermined transmittancy). However, the material of the first and second contact electrodes CNE1 and CNE2 is not limited to the foregoing embodiments. In one or more embodiments, the first and second contact electrodes CNE1 and CNE2 may be formed of various opaque conductive materials.

The first contact electrode CNE1 and the second contact electrode CNE2 may be disposed on the same plane at positions spaced from each other. The first contact electrode CNE1 and the second contact electrode CNE2 may be provided on the same layer and include the same material. However, the present disclosure is not limited thereto. In one or more embodiments, the first contact electrode CNE1 and the second contact electrode CNE2 may be provided on different layers and include different materials.

In one or more embodiments of the present disclosure, the first contact electrode CNE1 may be formed of a transparent conductive material to allow light emitted from each of the light emitting elements LD and reflected by the first electrode EL1 to travel in the image display direction of the display device without loss. The first contact electrode CNE1 may be disposed on the first electrode EL1 and overlap the first electrode EL1. The first contact electrode CNE1 may be disposed directly on the one area of the first electrode EL1 that is exposed from the first insulating layer INS1, and may be electrically and/or physically connected with the first electrode EL1. Furthermore, the first contact electrode CNE1 may be provided directly on one end of the opposite ends of each of the light emitting elements LD, and overlap the one end of each of the light emitting elements LD. The first contact electrode CNE1 may electrically reliably connect the first electrode EL1 to the one end of the opposite ends of each of the light emitting elements LD. The first contact electrode CNE1 may include a 1-1-th contact electrode CNE1_1 disposed on the 1-1-th electrode EL1_1, and a 1-2-th contact electrode CNE1_2 disposed on the 1-2-th electrode EL1_2.

The second contact electrode CNE2 may be disposed on the second electrode EL2 and overlap the second electrode EL2. The second contact electrode CNE2 may be disposed directly on the one area of the second electrode EL2 that is exposed from the first insulating layer INS1, and may be electrically and/or physically connected with the second electrode EL2. Furthermore, the second contact electrode CNE2 may be provided directly on a remaining end of the opposite ends of each of the light emitting elements LD, and overlap the remaining end of each of the light emitting elements LD. The second contact electrode CNE2 may electrically reliably connect the second electrode EL2 to the remaining end of the opposite ends of each of the light emitting elements LD. In one or more embodiments of the present disclosure, the second contact electrode CNE2 may be provided on the same layer as that of the first contact electrode CNE1, and may include the same material as that of the first contact electrode CNE1.

An encapsulation layer ENC may be provided and/or formed on the first and second contact electrodes CNE1 and CNE2. The encapsulation layer ENC may be an inorganic insulating layer including an inorganic material or an organic insulating layer including an organic material. For example, the encapsulation layer ENC may have a structure formed by alternately stacking at least one inorganic insulating layer and at least one organic insulating layer. The encapsulation layer ENC may cover the entirety of the display element layer DPL and prevent water or moisture from being drawn into the display element layer DPL including the light emitting elements LD from the outside.

A capping layer may be provided and/or formed in the emission area EMA of each pixel PXL. The capping layer may be provided and/or formed between each of the first and second electrodes EL1 and EL2 and the contact electrode. For example, the capping layer may be provided and/or formed between each of the first electrode EL1 and the first contact electrode CNE1 and between the second electrode EL2 and the second contact electrode CNE2. The capping layer may prevent each of the first and second electrodes EL1 and EL2 from being damaged by defects, etc. caused during a process of fabricating the display device, and reinforce adhesive force between each of the first and second electrodes EL1 and EL2 and the passivation layer PSV. The capping layer may be formed of a transparent conductive material such as indium zinc oxide (IZO) to reduce or minimize loss of light emitted from each of the light emitting elements LD and reflected by each of the first and second electrodes EL1 and EL2 in the image display direction of the display device.

The display element layer DPL of each pixel PXL may further include an optical pattern OTP.

The optical pattern OTP may be disposed on each of the light emitting elements LD and cover the entirety of each of the light emitting elements LD. The optical pattern OTP may be disposed under the encapsulation layer ENC, and cover both the second insulating layer INS2 disposed on the upper surface of each light emitting element LD and a portion of each of the first and second contact electrodes CNE1 and CNE2 spaced from each other on the second insulating layer INS2. The optical pattern OTP may diffuse and/or scatter light emitted from the light emitting elements LD or concentrate (or condense) the light, thus enhancing light extraction efficiency. Furthermore, the optical pattern OTP may be disposed on the light emitting elements LD and function as a light control component for controlling a travel path of light emitted from the light emitting elements LD.

The optical pattern OTP may have a polygonal shape, e.g., a trapezoidal shape, which is reduced in width upward from a surface thereof that contacts the second insulating layer INS2 and a portion of each of the first and second contact electrodes CNE1 and CNE2 spaced from each other on the second insulating layer INS2, but the present disclosure is not limited thereto. In one or more embodiments, the optical pattern OTP may have a lens-like shape with a cross-section having a semi-circular (or hemispherical) shape, a semi-elliptical shape, which is reduced in width upward, as illustrated in FIG. 12B. In the case that the optical pattern OTP has the foregoing shape, light that is emitted from the light emitting elements LD and is incident on the optical pattern OTP, and light that is reflected by the first and second electrodes EL1 and EL2 and is incident on the optical pattern OTP may be diffused and/or scattered in various directions or concentrated in a specific direction. The degree to which light emitted from the light emitting elements LD is diffused and/or scattered or concentrated may be controlled by changing the shape of the optical pattern OTP.

The optical pattern OTP may overlap each light emitting element LD, and a portion of each of the second insulating layer INS2, and the first and second contact electrodes CNE1 and CNE2. In a plan view, the optical pattern OTP may have a bar-like shape extending in the second direction DR2 and cover overall surfaces of the light emitting elements LD disposed between the first and second electrodes EL1 and EL2. In other words, the optical pattern OTP may be a light output pattern configured to extract light (hereinafter, referred to as 'first light') emitted from each of the light emitting elements LD, and light (hereinafter, referred to as 'second light') emitted from each of the light emitting elements LD and reflected by the first and second electrodes EL1 and EL2 in the image display direction of the display device. For example, the optical pattern OTP may diffuse and/or scatter or concentrate the first light and the second light so that the first light and the second light may be more intensively emitted in the image display direction of the display device. Furthermore, the optical pattern OTP may increase a light output angle of light that is emitted from the light emitting elements LD with a narrow light output angle, thus enhancing the light output efficiency of the light emitting elements LD.

The optical pattern OTP may be formed of diffusion ink having a reflectivity of a suitable level (e.g., a set or predetermined level) or more. For example, the diffusion ink may include a polystyrene (PS) or polymethylmethacrylate (PMMA) bead, solvent, a polystyrene (PS) or polymethylmethacrylate (PMMA) copolymer, and an additive, but the present disclosure is not limited thereto. In one or more embodiments, the optical pattern OTP may include polymer material having light permeability. For example, the polymer material may include polyethylene terephthalate, polyethylene naphthalate, polycarbonate, and polymethyl methacrylate. However, the material of the optical pattern OTP is not limited to the foregoing embodiments. Various materials may be selectively used, so long as the materials may diffuse and/or scatter or concentrate light emitted from the light emitting elements LD and light emitted from the light emitting elements LD and reflected by the first and second electrodes EL1 and EL2.

In one or more embodiments of the present disclosure, the optical pattern OTP may be formed through a process using a mask. Furthermore, the optical pattern OTP may be formed by a method such as inkjet printing, screen printing, lamination, spin coating, sputtering, or chemical vapor deposition (CVD). Furthermore, the optical pattern OTP may be formed by coating, with a medium including fine particles, the second insulating layer INS2 and portions of the first and second contact electrodes CNE1 and CNE2 spaced from each other on the second insulating layer INS2, and curing the medium through a thermosetting operation and/or an optical curing operation. For example, the optical pattern OTP may be formed by dropping the diffusion ink onto the second insulating layer INS2 on the light emitting elements LD and curing the dropped ink through a thermosetting operation and/or an optical curing operation.

In one or more embodiments, as illustrated in FIG. 12A, the optical pattern OTP may include fine particles DFP. In this case, the optical pattern OTP may include fine particles DFP that are dispersed in a transparent medium such as a transparent binder and provided for light diffusion and/or light scattering. In one or more embodiments of the present disclosure, the fine particles DFP may be referred to as diffused particles, scattered particles, etc. The fine particles DFP each may have a size ranging from several tens of nanometers to several micrometers, but the present disclosure is not limited thereto. The binder may include a transparent material such as acryl, urethane, or epoxy resin. Transparent particles or white particles may be used as the fine particles DFP.

The transparent particles may be, e.g., transparent organic particles or inorganic particles. For example, the organic particles may include acrylic-based particles of methyl methacrylate, acrylic acid, glycidyl methacrylate, ethyl acrylate, isobutyl acrylate, normal butyl acrylate, 2-ethylhexyl acrylate homopolymer or copolymer, olefin-based particles such as polyethylene, polystyrene, or polypropylene, acrylic-and-olefin-based copolymer particles, and multilayered and multicomponent particles formed by forming a layer including homopolymer particles and then covering the layer with a different type of monomer. The inorganic particles may include, for example, synthetic silica, glass beads, diamond. Titanium oxide, zinc oxide, barium sulfate, calcium carbonate, magnesium carbonate, aluminum hydroxide, clay, etc. may be used as the white particles. Furthermore, transparent particles or white particles may be used alone or in combination of two or more types as the fine particles DFP.

Although the foregoing fine particles DFP have the same size, the present disclosure is not limited thereto. In one or more embodiments, the fine particles DFP may have different sizes. Furthermore, although the fine particles DFP are illustrated as being regularly distributed in the optical pattern OTP, the present disclosure is not limited thereto. In one or more embodiments, the fine particles DFP may be irregularly distributed, and e.g., the distribution thereof may be biased to one side.

The first light that is emitted from the light emitting elements LD and is incident on the optical pattern OTP may be diffused and/or scattered by the fine particles DFP or concentrated in a specific direction so that the first light may more reliably travel outside the optical pattern OTP, e.g., in the image display direction of the display device. Furthermore, the second light that is emitted from the light emitting elements LD and reflected by the first and second electrodes EL1 and EL2 and then is incident on the optical pattern OTP may also be diffused and/or scattered or concentrated in a specific direction by the fine particles DFP so that the second light may more reliably travel in the image display direction of the display device.

As described above, in the case that the optical pattern OTP is disposed on the light emitting elements LD, light emitted from the light emitting elements LD and light reflected by the first and second electrodes EL1 and EL2 may be diffused and/or scattered, concentrated, refracted, and reflected in various directions (or at various angles) by the optical pattern OTP, so that the amount (or intensity) of light that travels in the image display direction of the display device may be increased. Hence, the light output efficiency of each pixel PXL may be further enhanced.

Although in the foregoing embodiment there has been described the case where the optical pattern OTP covers an overall surface of the second insulating layer INS2 disposed on the respective upper surfaces of the light emitting elements LD, the present disclosure is not limited thereto. In one or more embodiments, the optical pattern OTP may be provided to cover only a portion of the second insulating layer INS2 or cover an overall surface of the display element layer DPL of each pixel PXL.

Hereinafter, another embodiment of the optical pattern OTP will be described in detail.

Figure 16:
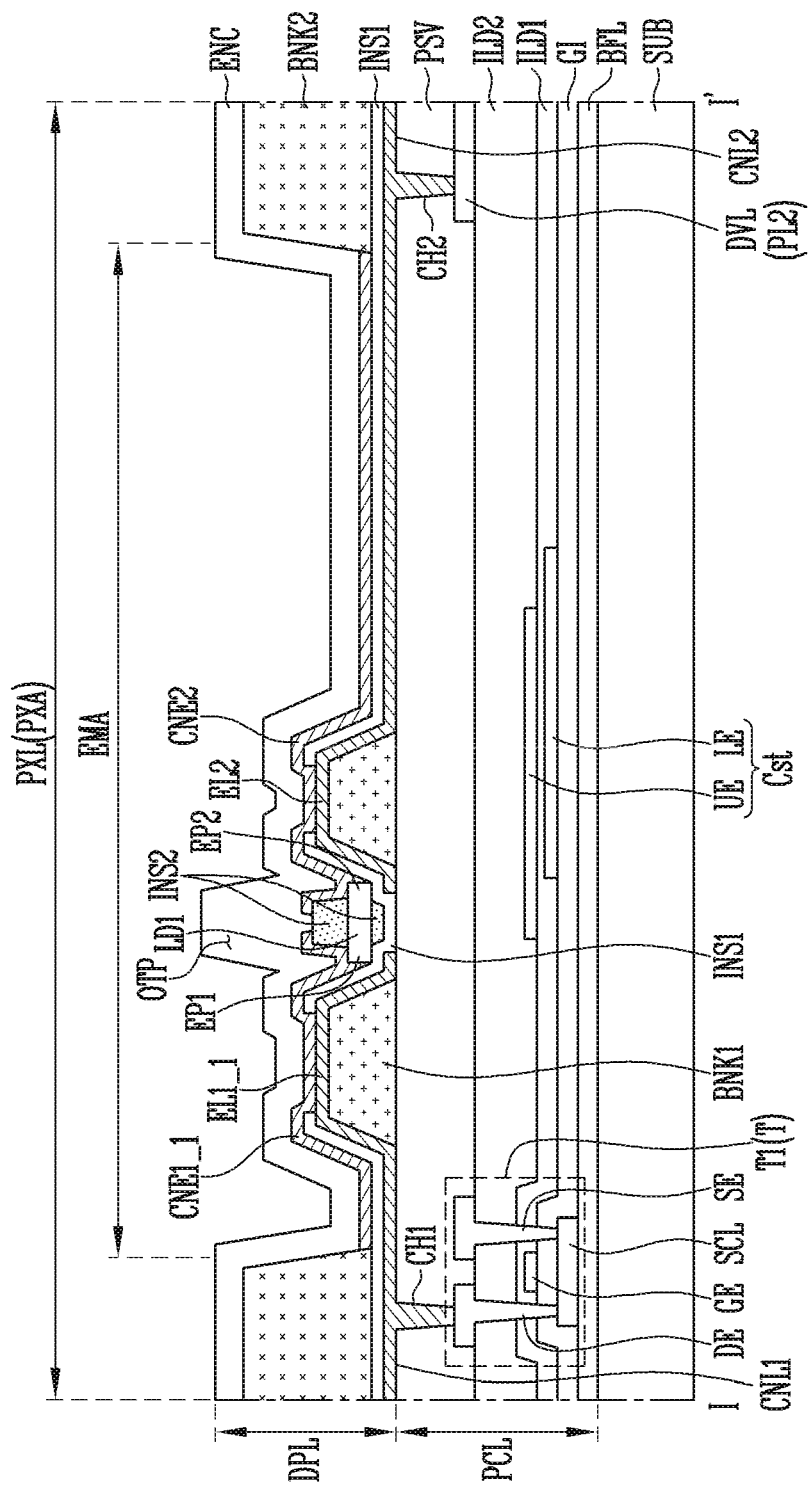
FIG. 16 illustrates an embodiment of an encapsulation layer illustrated in FIG. 10, and is a schematically cross-sectional view corresponding to line I-I' of FIG. 8.

FIG. 16 illustrates another embodiment of the encapsulation layer illustrated in FIG. 10, and is a sectional view corresponding to the line I-I' of FIG. 8.

Therefore, with regard to the embodiment of FIG. 16, the following description will be focused on differences from that of the foregoing embodiments, to avoid redundant explanation. Components that are not separately explained in the following description of the present embodiment comply with that of the foregoing embodiments. The same reference numeral will be used to designate the same component, and a similar reference numeral will be used to designate a similar component.

Referring to FIGS. 1A to 5, 6A, 8, and 16, each pixel PXL may include a substrate SUB, a pixel circuit layer PCL, and a display element layer DPL.

The display element layer DPL may include first and second bank patterns BNK1 and BNK2, first and second electrodes EL1 and EL2, first and second connection lines CNL1 and CNL2, light emitting elements LD, first and second contact electrodes CNE1 and CNE2, first and second insulating layers INS1 and INS2, and an encapsulation layer ENC.

The encapsulation layer ENC may entirely cover components included in the display element layer DPL. The encapsulation layer ENC may be made of a transparent insulating material to reduce or minimize loss of light emitted from the light emitting elements LD. For example, the encapsulation layer ENC may be formed of an inorganic insulating layer including an inorganic material, or an organic insulating layer including an organic material, but the present disclosure is not limited thereto.

To enhance light extraction efficiency of light emitted from the light emitting elements LD, a height (or a thickness) of a portion of the encapsulation layer ENC that corresponds to each of the light emitting elements LD may be greater than a height (or a thickness) of a portion of the encapsulation layer ENC that does not correspond to each of the light emitting elements LD. Here, the portion of the encapsulation layer ENC that corresponds to each of the light emitting elements LD may have a shape most highly protruding upward. To allow the portion of the encapsulation layer ENC that corresponds to each of the light emitting elements LD to have a most highly protruding shape, the encapsulation layer ENC may be formed by a method using a halftone mask or the like. In one or more embodiments of the present disclosure, the optical pattern OTP may be formed such that the portion of the encapsulation layer ENC that has a most highly protruding shape may function as a light control component that diffuses and/or scatters or concentrates light emitted from the light emitting elements LD and thus controls a path along which the light travels.

The optical pattern OTP may be included in the encapsulation layer ENC and correspond to the second insulating layer INS2 on the light emitting elements LD. In other words, the optical pattern OTP may be integrally provided with the encapsulation layer ENC. In the case that the optical pattern OTP is integrated with the encapsulation layer ENC, the optical pattern OTP may be regarded as an area of the encapsulation layer ENC.

In one or more embodiments, the encapsulation layer ENC including the optical pattern OTP may include scattering particles provided to further enhance light extraction efficiency of light emitted from the light emitting elements LD The scattering particles may have the same configuration as that of the fine particles DFP described with reference to FIG. 12A.

Figure 17A:
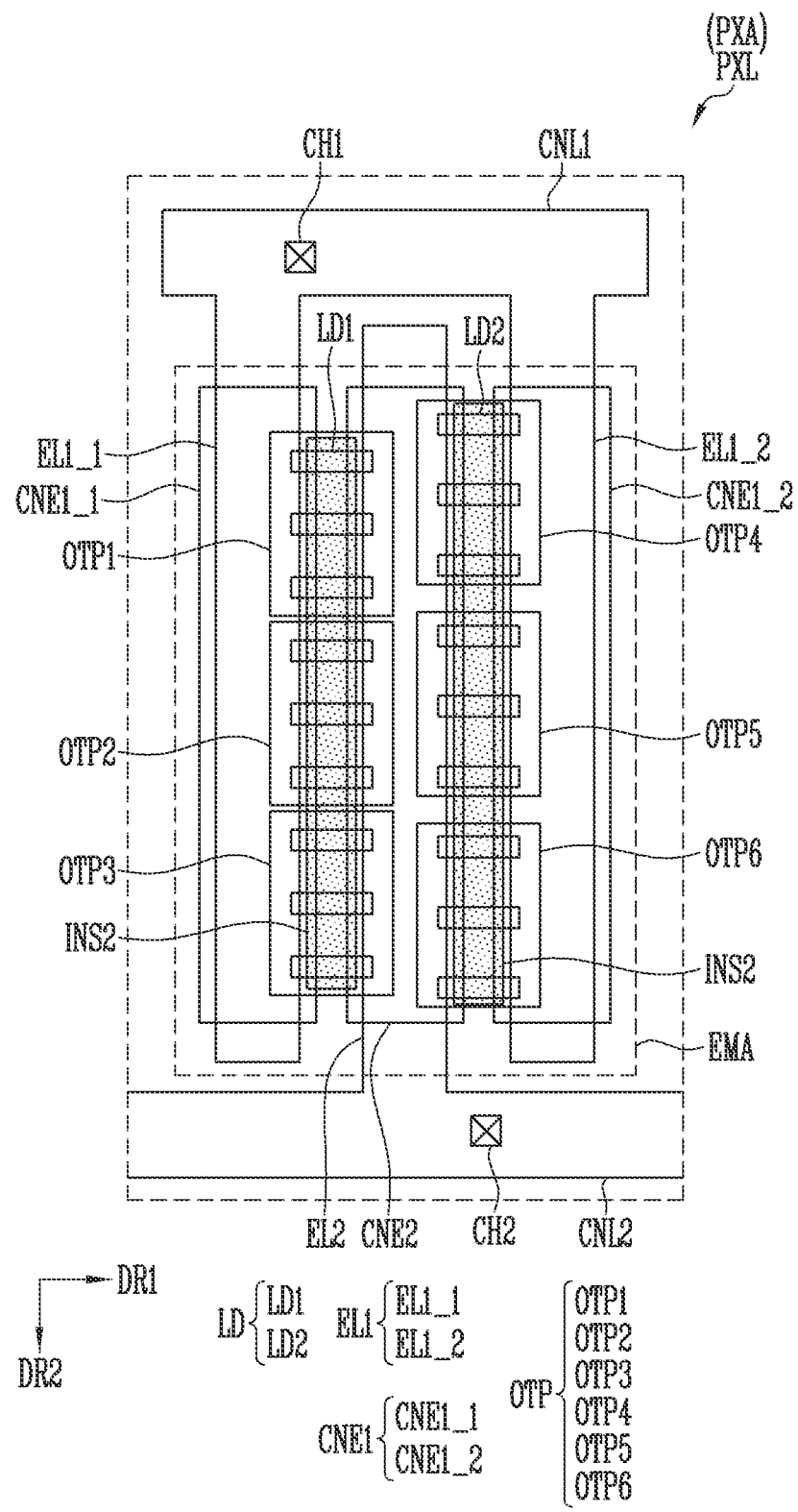
FIGS. 17A to 17C are schematic plan views illustrating different embodiments of the pixel of FIG. 8.
Figure 17B:
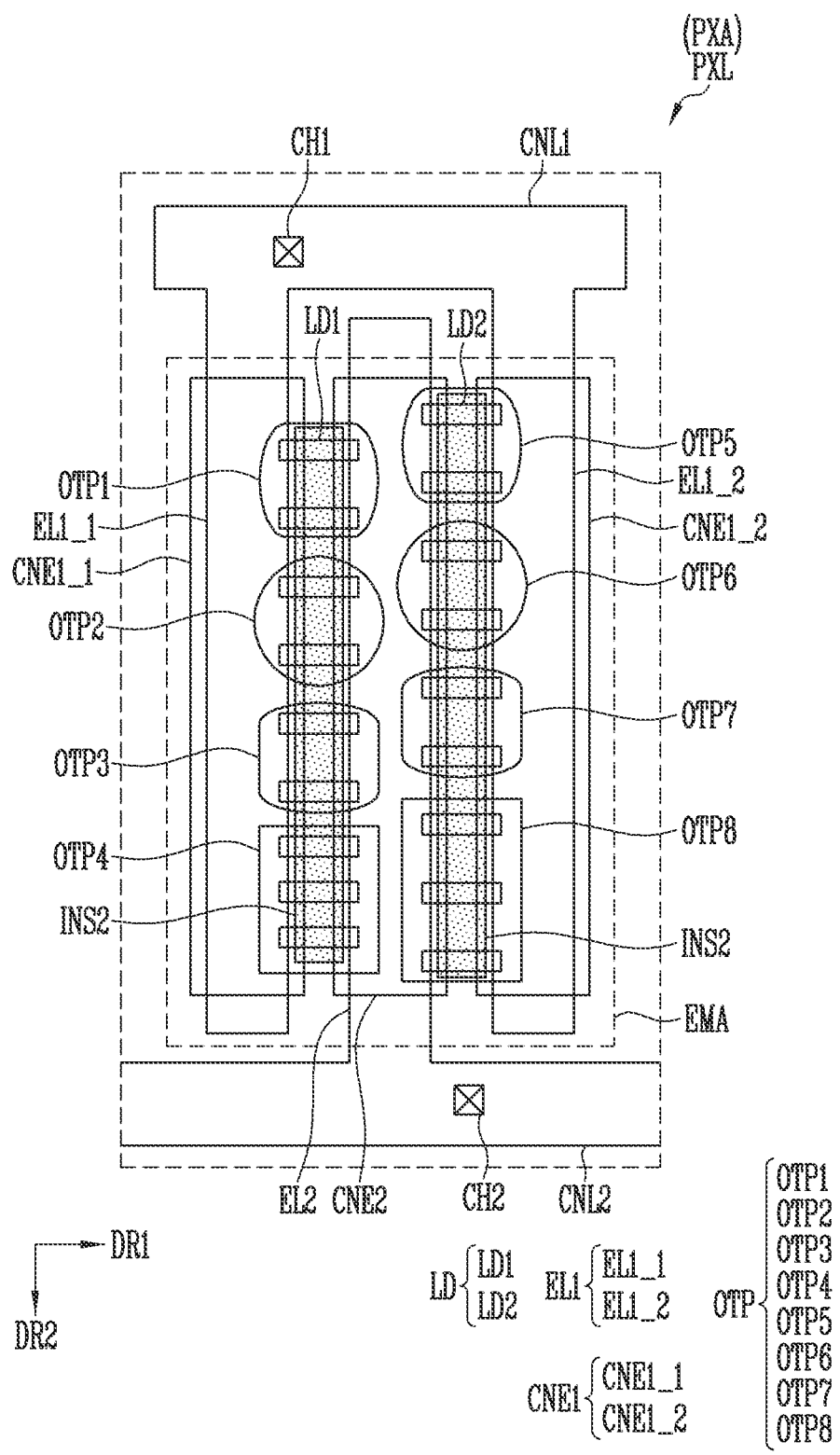
Figure 17C:
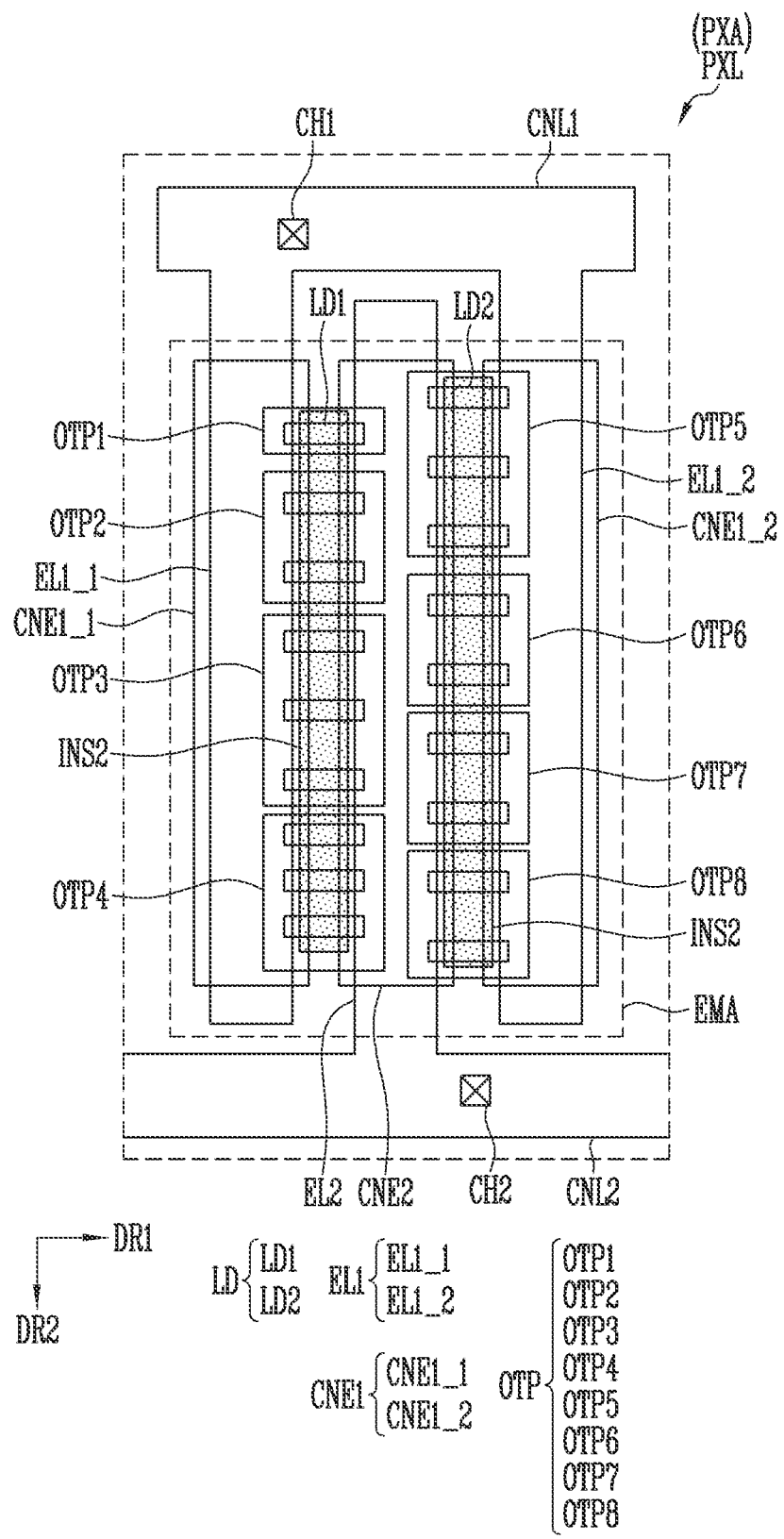

FIGS. 17A to 17C are schematic plan views illustrating different embodiments of the pixel of FIG. 8.

The description of a pixel PXL of each of FIGS. 17A to 17C will be focused on differences from the above-mentioned embodiments so as to avoid redundant description. Components that are not separately explained in the following description of the present embodiment comply with that of the foregoing embodiments. The same reference numeral will be used to designate the same component, and a similar reference numeral will be used to designate a similar component.

For the sake of explanation, FIGS. 17A to 17C schematically illustrate only some components included in a display element layer DPL of each pixel PXL.

First, referring to FIGS. 1A to 4B, 5, 6A, 10, and 17A, the display element layer DPL of each pixel PXL may include first and second connection lines CNL1 and CNL2, first and second electrodes EL1 and EL2, light emitting elements LD, and first and second contact electrodes CNE1 and CNE2.

A second insulating layer INS2 may be disposed on the light emitting elements LD. The second insulating layer INS2 may have the same configuration as that of the second insulating layer INS2 described with reference to FIG. 10. An optical pattern OTP may be provided and/or formed on the second insulating layer INS2 on the light emitting elements LD. An encapsulation layer ENC may be disposed on the optical pattern OTP.

In one or more embodiments of the present disclosure, the optical pattern OTP may include a plurality of sub-optical patterns. For example, the optical pattern OTP may include first to sixth sub-optical patterns OTP1 to OTP6. Each of the first to sixth sub-optical patterns OTP1 to OTP6 may be provided to group a specific number of light emitting elements LD among the light emitting elements LD as one sub-emission unit and cover only the one sub-emission unit.

For example, when it is assumed that the light emitting elements LD provided in the emission area EMA of each pixel PXL include nine first light emitting elements LD1 and nine second light emitting elements LD2, the first sub-optical pattern OTP1 may be provided to group three first light emitting elements LD1 among the nine first light emitting elements LD1 as a first sub-emission unit and cover only the first sub-emission unit. The second sub-optical pattern OTP2 may be provided to group three other first light emitting elements LD1 among the nine first light emitting elements LD1 as a second sub-emission unit and cover only the second sub-emission unit. The third sub-optical pattern OTP3 may be provided to group the other three first light emitting elements LD1 among the nine first light emitting elements LD1 as a third sub-emission unit and cover only the third sub-emission unit. The fourth sub-optical pattern OTP4 may be provided to group three second light emitting elements LD2 among the nine second light emitting elements LD2 as a fourth sub-emission unit and cover only the fourth sub-emission unit. The fifth sub-optical pattern OTP5 may be provided to group three other second light emitting elements LD2 among the nine second light emitting elements LD2 as a fifth sub-emission unit and cover only the fifth sub-emission unit. The sixth sub-optical pattern OTP6 may be provided to group the other three second light emitting elements LD2 among the nine second light emitting elements LD2 as a sixth sub-emission unit and cover only the sixth sub-emission unit.

In a plan view, each of the first to sixth sub-optical patterns OTP1 to OTP6 may have a bar-like shape extending in the second direction DR2. Each of the first to third sub-optical patterns OTP1, OTP2, and OTP3 may overlap the second insulating layer INS2 on the corresponding first light emitting elements LD1 between the 1-1-th electrode EL1_1 and the second electrode EL2. Each of the fourth to sixth sub-optical patterns OTP4, OTP5, and OTP6 may overlap the second insulating layer INS2 on the corresponding second light emitting elements LD2 between the second electrode EL2 and the 1-2-th electrode EL1_2.

Furthermore, the first to third sub-optical patterns OTP1, OTP2, and OTP3 may overlap at least a portion of each of the 1-1-th contact electrode CNE1_1 and the second contact electrode CNE2 that are spaced from each other on the second insulating layer INS2. The fourth to sixth sub-optical patterns OTP4, OTP5, and OTP6 may overlap at least a portion of each of the second contact electrode CNE2 and the 1-2-th contact electrode CNE1_2 that are spaced from each other on the second insulating layer INS2.

In one or more embodiments of the present disclosure, the first to sixth sub-optical patterns OTP1 to OTP6 may have the same size and the same shape, but the present disclosure is not limited thereto. In one or more embodiments, the first to third sub-optical patterns OTP1 to OTP3 corresponding to the first light emitting elements LD1 may have the same size and the same shape. The fourth to sixth sub-optical patterns OTP4 to OTP6 corresponding to the second light emitting elements LD2 may have the same size and the same shape. Furthermore, in one or more embodiments, the first to sixth sub-optical patterns OTP1 to OTP6 may have different sizes and different shapes.

Each of the first to sixth sub-optical patterns OTP1 to OTP6 may diffuse and/or scatter or concentrate both light that is emitted from the light emitting elements LD included in the corresponding sub-emission unit and is incident thereon, and light that is reflected by the first and second electrodes EL1 and EL2 and is incident thereon, so that the amount (or intensity) of light that travels in the image display direction of the display device may be increased. Hence, the light output efficiency of each pixel PXL may be enhanced.

Next, referring to FIGS. 1A to 6A, 10, 17B, and 17C, the optical pattern OTP may include first to eighth sub-optical patterns OTP1 to OTP8.

The first to fourth sub-optical patterns OTP1 to OTP4 of the first to eighth sub-optical patterns OTP1 to OTP8 may cover the first light emitting elements LD1 and the second insulating layer INS2 on the first light emitting elements LD1. The fifth to eighth sub-optical patterns OTP5 to OTP8 may cover the second light emitting elements LD2 and the second insulating layer INS2 on the second light emitting elements LD2.

The first sub-optical pattern OTP1 and the fifth sub-optical pattern OTP5 may have the same shape, and have substantially identical or different sizes (or surface areas). For example, the first and fifth sub-optical patterns OTP1 and OTP5 each may have an elliptical shape, in a plan view. The first sub-optical pattern OTP1 may cover only a first sub-emission unit including two first light emitting elements LD1 of the nine first light emitting elements LD1. The fifth sub-optical pattern OTP5 may cover only a fifth sub-emission unit including two second light emitting elements LD2 of the nine second light emitting elements LD2.

The second and sixth sub-optical patterns OTP2 and OTP6 may have the same shape, and have identical or different sizes (or surface areas). For example, the second and sixth sub-optical patterns OTP2 and OTP6 each may have a circular shape, in a plan view. The second sub-optical pattern OTP2 may cover only a second sub-emission unit including two other first light emitting elements LD1 of the nine first light emitting elements LD1. The sixth sub-optical pattern OTP6 may cover only a sixth sub-emission unit including two other second light emitting elements LD2 of the nine second light emitting elements LD2.

The third and seventh sub-optical patterns OTP3 and OTP7 may have the same shape, and have identical or different sizes (or surface areas). For example, the third and seventh sub-optical patterns OTP3 and OTP7 each may have an elliptical shape, in a plan view. The third sub-optical pattern OTP3 may cover only a third sub-emission unit including two other first light emitting elements LD1 of the nine first light emitting elements LD1. The seventh sub-optical pattern OTP7 may cover only a seventh sub-emission unit including two other second light emitting elements LD2 of the nine second light emitting elements LD2.

The fourth and eighth sub-optical patterns OTP4 and OTP8 may have the same shape, and have identical or different sizes (or surface areas). For example, the fourth and eighth sub-optical patterns OTP4 and OTP8 each may have a rectangular shape, in a plan view. The fourth sub-optical pattern OTP4 may cover only a fourth sub-emission unit including the other three first light emitting elements LD1 of the nine first light emitting elements LD1. The eighth sub-optical pattern OTP8 may cover only an eighth sub-emission unit including the other three second light emitting elements LD2 of the nine second light emitting elements LD2.

In one or more embodiments, as shown in FIG. 17C, the first to fourth sub-optical patterns OTP1 to OTP4 may have the same shape and different sizes (or surface areas). Likewise, the fifth to eighth sub-optical patterns OTP5 to OTP8 may have the same shape, and have different sizes (or surface areas).

Figure 18:
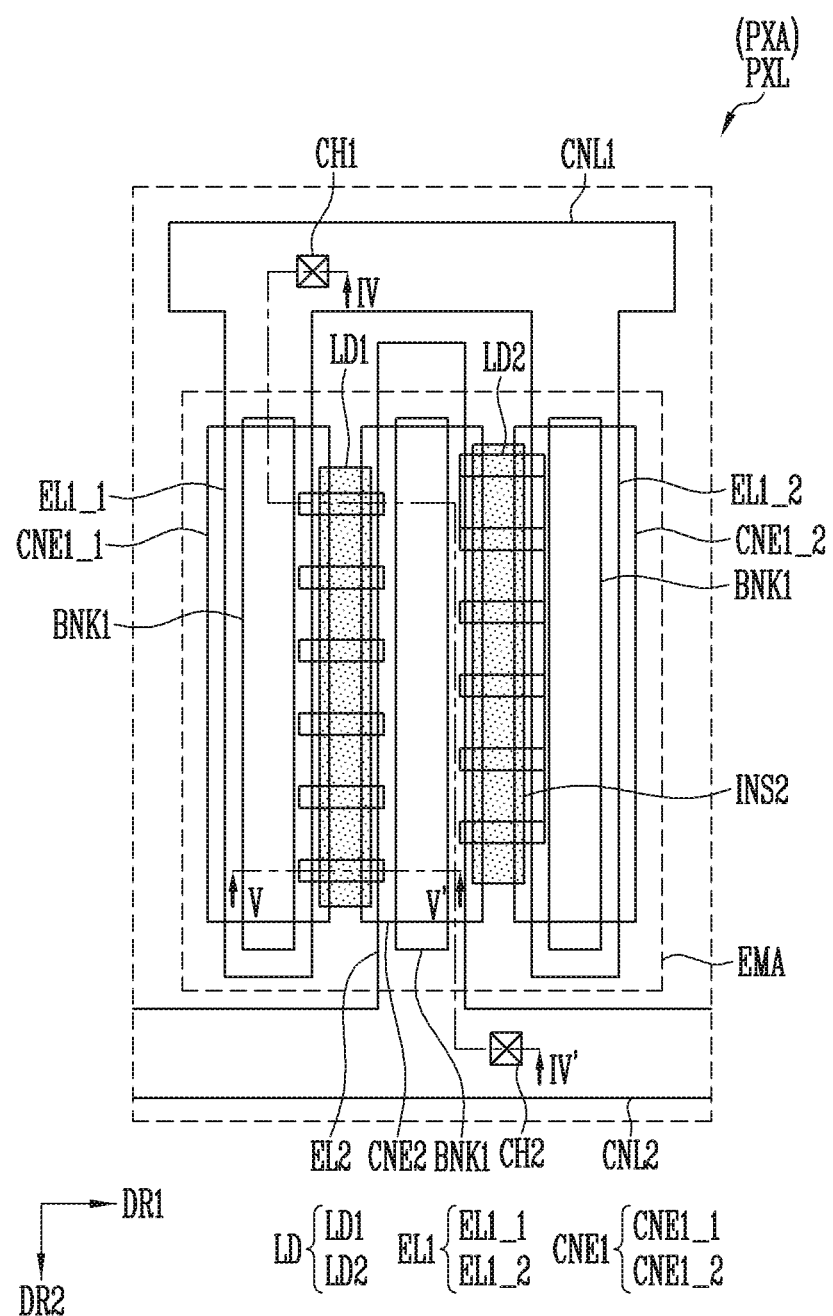
FIG. 18 is a plan view schematically illustrating a pixel in accordance with one or more embodiments of the present disclosure.
Figure 19:
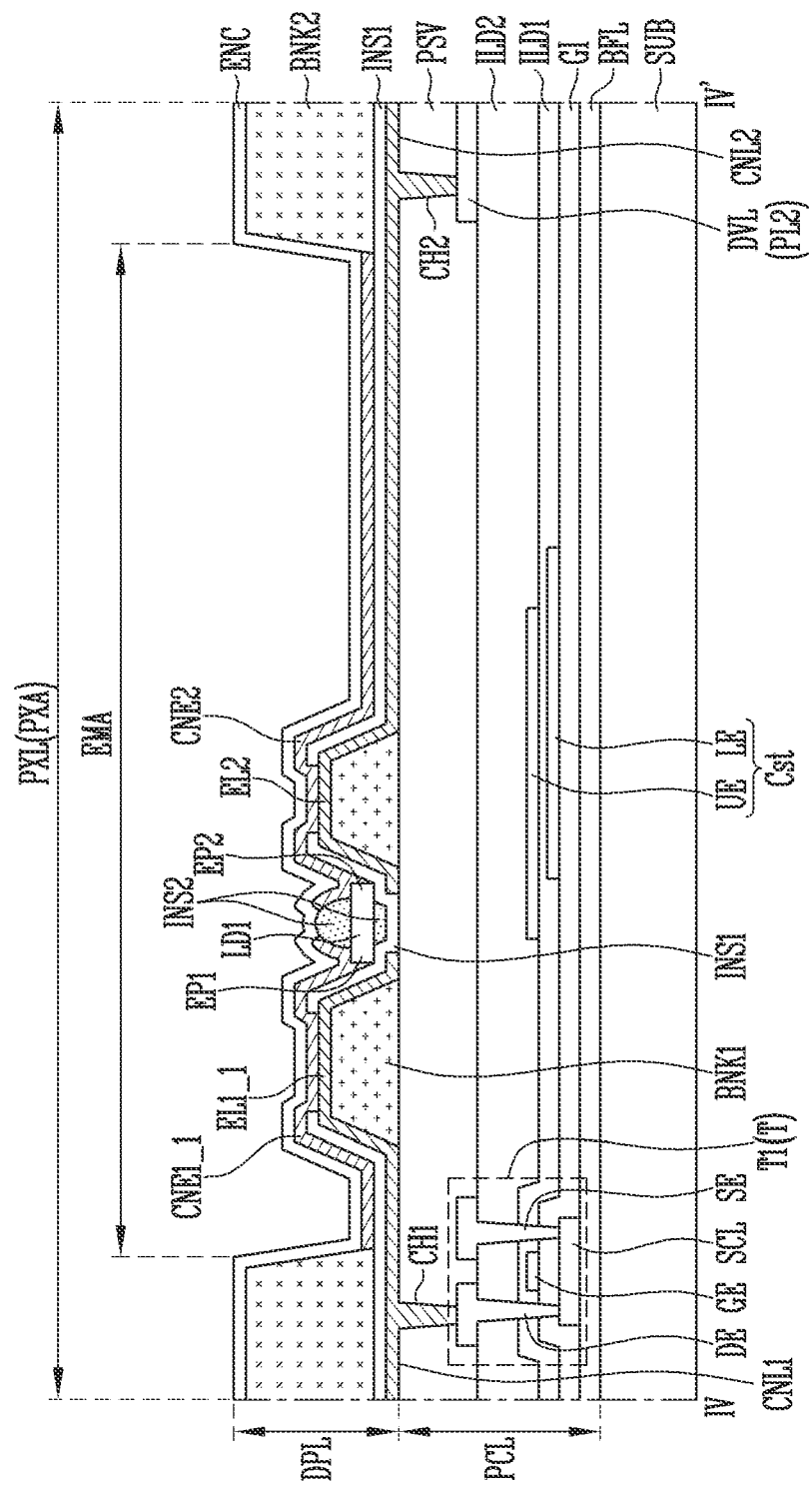
FIG. 19 is a schematically cross-sectional view taken along the line IV-IV of FIG. 18.
Figure 20:
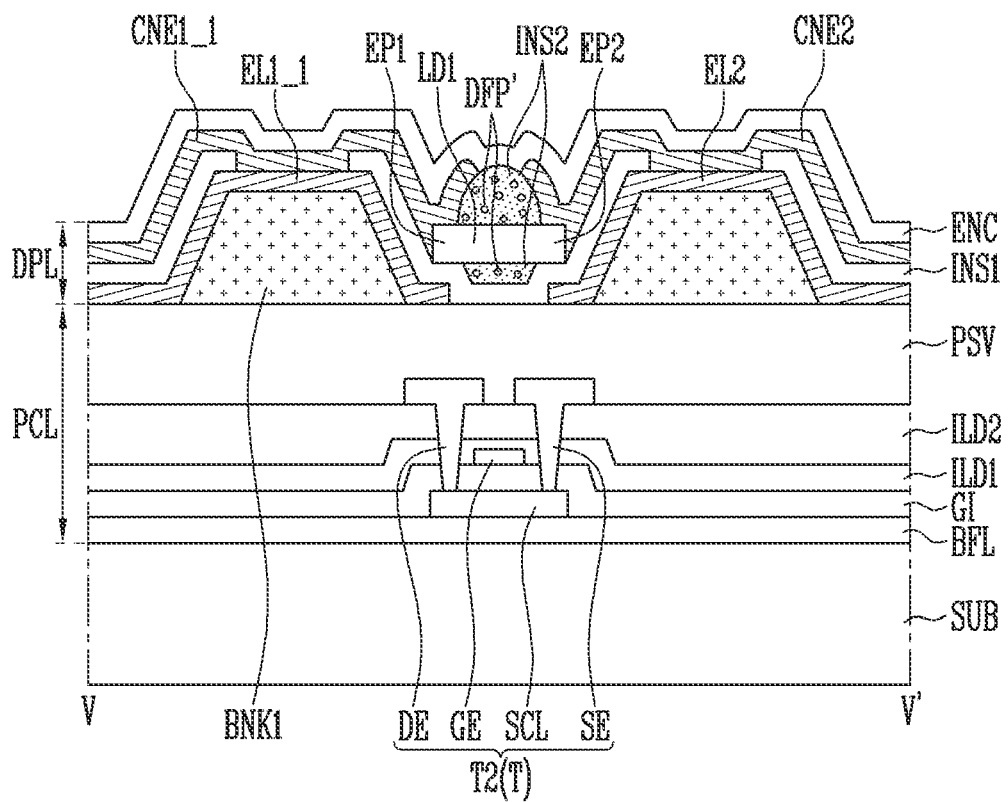
FIG. 20 is a schematically cross-sectional view taken along the line V-V of FIG. 18.

FIG. 18 is a plan view schematically illustrating a pixel in accordance with one or more embodiments of the present disclosure. FIG. 19 is a sectional view taken along the line IV-IV' of FIG. 18. FIG. 20 is a sectional view taken along the line V-V' of FIG. 18.

To avoid redundant explanation, the description of the pixel PXL of FIGS. 18 to 20 will be focused on differences from that of the foregoing embodiments. Components that are not separately explained in the following description of the present embodiment comply with that of the foregoing embodiments. The same reference numeral will be used to designate the same component, and a similar reference numeral will be used to designate a similar component.

Referring to FIGS. 1A to 5, 6A, and 18 to 20, each pixel PXL may include a substrate SUB, a pixel circuit layer PCL disposed on the substrate SUB, and a display element layer DPL disposed on the pixel circuit layer PCL. Here, the substrate SUB and the pixel circuit layer PCL may respectively have the same configurations of the substrate SUB and the pixel circuit layer PCL described with reference to FIG. 10.

The display element layer DPL may include first and second bank patterns BNK1 and BNK2, first and second connection lines CNL1 and CNL2, first and second electrodes EL1 and EL2, light emitting elements LD, first and second contact electrodes CNE1 and CNE2, and an encapsulation layer ENC. Furthermore, the display element layer DPL may include a second insulating layer INS2 configured to cover a portion of an upper surface of each of the light emitting elements LD and allow the opposite ends EP1 and EP2 of each of the light emitting elements LD to be exposed.

The second insulating layer INS2 may be disposed on the upper surface of each of the light emitting elements LD so that the active layer 12 of each of the light emitting elements LD may be prevented from contacting external conductive material. The second insulating layer INS2 may be charged into a gap between the first insulating layer INS1 and each light emitting element LD. In one or more is embodiments of the present disclosure, the second insulating layer INS2 may be an organic insulating layer including an organic material.

The second insulating layer INS2 may be formed through an exposure process using a mask, and the shape thereof may be changed in response to light (or rays) used during the exposure process. For example, the second insulating layer INS2 may be formed in a lens-like shape, including a semi-elliptical shape or a semi-circular shape (or a hemispherical shape), which swells upward in response to light used during the exposure process. The intensity and/or exposure time of light (or rays) used when the second insulating layer INS2 is formed may be adjusted, whereby the second insulating layer INS2 may be changed to a shape capable of increasing or maximizing the light extraction efficiency of light emitted from the light emitting elements LD and light reflected by the first and second electrodes EL1 and EL2.

In the case that the second insulating layer INS2 disposed on the upper surface of each of the light emitting elements LD has a lens-like shape in a sectional view, light emitted from the light emitting elements LD and light reflected by the first and second electrodes EL1 and EL2 may be diffused and/or scattered while passing through the second insulating layer INS2. Hence, the light extraction efficiency of light emitted from the emission area EMA of each pixel PXL may be enhanced. The second insulating layer INS2 having a lens-like shape may function as a light output pattern for extracting light emitted from the light emitting elements LD and light reflected by the first and second electrodes EL1 and EL2 in the image display direction of the display device. For example, the second insulating layer INS2 may diffuse and/or scatter or concentrate light emitted from the light emitting elements LD and light reflected by the first and second electrodes EL1 and EL2 and more intensively emit the light in the image display direction of the display device.

In one or more embodiments of the present disclosure, the second insulating layer INS2 disposed on the upper surface of each of the light emitting elements LD may function as an optical insulating component configured to stably support each of the light emitting elements LD, protect the active layer 12 of each light emitting element LD, and diffuse and/or scatter or concentrate light emitted from the light emitting elements LD and light reflected by the first and second electrodes EL1 and EL2.

In one or more embodiments, the second insulating layer INS2 may include diffusion particles DFP' for further enhancing the light extraction efficiency of light emitted from the light emitting elements LD. The diffusion particles DFP' may be regularly or irregularly dispersed in the second insulating layer INS2 so as to diffuse and/or scatter light emitted from the light emitting elements LD. Transparent particles or white particles may be used as the diffusion particles DFP'. The diffusion particles DFP' may have the same configuration as that of the fine particles DFP described with reference to FIG. 12A.

Figure 21:
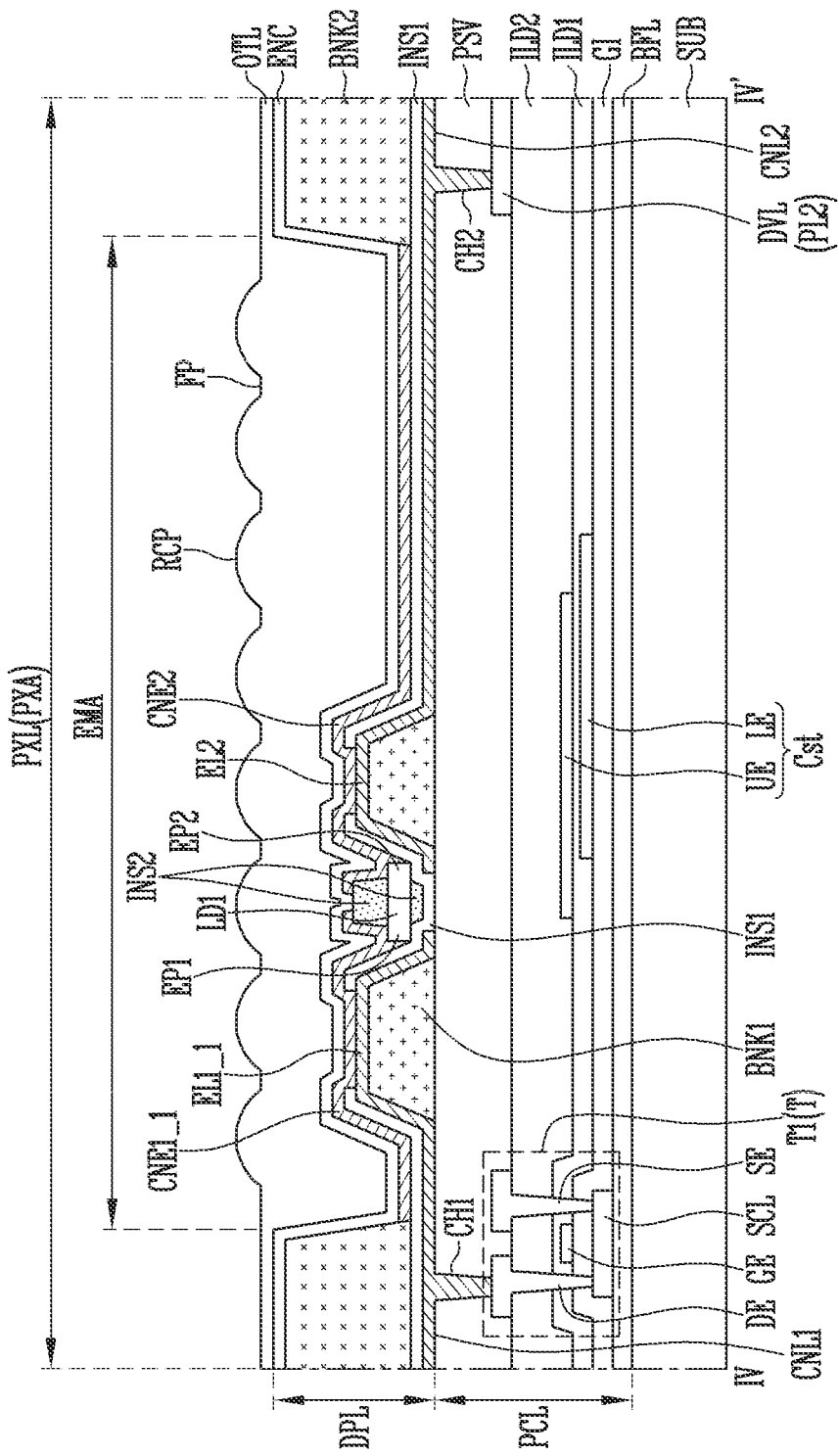
FIG. 21 illustrates a pixel in accordance with one or more embodiments of the present disclosure, and is a schematically cross-sectional view corresponding to the line IV-IV of FIG. 18.

FIG. 21 illustrates a pixel in accordance with one or more embodiments of the present disclosure, and is a sectional view corresponding to the line IV-IV' of FIG. 18. FIGS. 22A to 22D are sectional views illustrating different embodiments of the pixel of FIG. 21.

To avoid redundant explanation, the description of the pixel PXL of FIGS. 21, 22A to 22D will be focused on differences from that of the foregoing embodiments. Components that are not separately explained in the following description of the present embodiment comply with that of the foregoing embodiments. The same reference numeral will be used to designate the same component, and a similar reference numeral will be used to designate a similar component.

Referring to FIGS. 1A to 5, 6A, 18, 21, and 22A to 22D, each pixel PXL may include a substrate SUB, a pixel circuit layer PCL, and a display element layer DPL.

The display element layer DPL may include first and second bank patterns BNK1 and BNK2, first and second connection lines CNL1 and CNL2, first and second electrodes EL1 and EL2, light emitting elements LD, first and second contact electrodes CNE1 and CNE2, first and second insulating layers INS1 and INS2, and an encapsulation layer ENC.

Furthermore, the display element layer DPL may further include an optical layer OTL disposed on the encapsulation layer ENC.

The optical layer OTL may be an optical component disposed on the encapsulation layer ENC and configured to diffuse and/or scatter or concentrate light that passes through the encapsulation layer ENC, thus enhancing the amount (or intensity) of light that travels in the image display direction of the display device. The optical layer OTL may be provided to cover the entirety of the encapsulation layer ENC, and corresponds to an outermost layer of the display element layer DPL. In one or more embodiments of the present disclosure, the optical layer OTL may include material that may diffuse and/or scatter or concentrate light that passes through the encapsulation layer ENC and allow the light to pass therethrough. For example, the optical layer OTL may be made of a transparent resin.

The optical layer OTL may include a plurality of embossed patterns RCP formed through an imprint process. For example, the optical layer OTL may be formed to include the plurality of embossed patterns RCP on an upper surface thereof by applying a transparent resin onto the encapsulation layer ENC, performing an imprint process using a stamp, and then applying ultraviolet rays thereto. Furthermore, the optical layer OTL may include a planar portion FP disposed between two adjacent embossed patterns RCP. The embossed patterns RCP may be disposed on an upper surface of the optical layer OTL to correspond to the emission area EMA of each pixel PXL.

Each of the embossed patterns RCP may have a lens-like shape with a semi-elliptical shape, a semi-circular shape (or a hemispherical shape), which is reduced in width upward. In other words, each of the embossed patterns RCP may have an upwardly convex shape. Each of the embossed patterns RCP may be disposed on one surface of the optical layer OTL and spaced from embossed patterns RCP adjacent thereto with the planar portions FP interposed therebetween. Although a distance between the embossed patterns RCP may be uniform, the present disclosure is not limited thereto. In one or more embodiments, the embossed patterns RCP may be disposed on the upper surface of the optical layer OTL such that, based on any one point, the distance between the adjacent embossed patterns RCP is reduced or increased in a direction toward or away from the any one point.

Figure 22A:
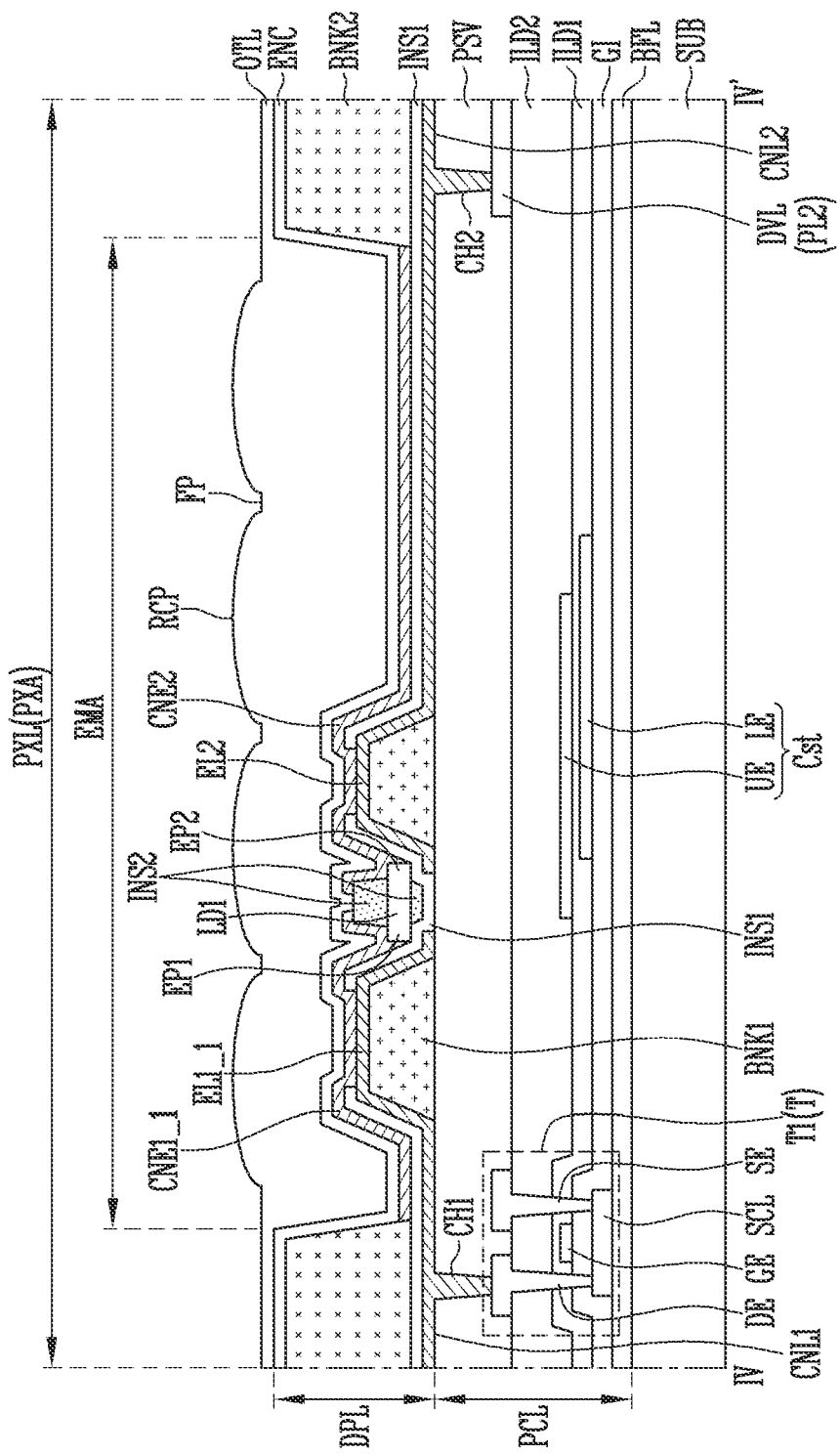
FIGS. 22A to 22D are schematically cross-sectional views illustrating different embodiments of the pixel of FIG. 21.
Figure 22B:
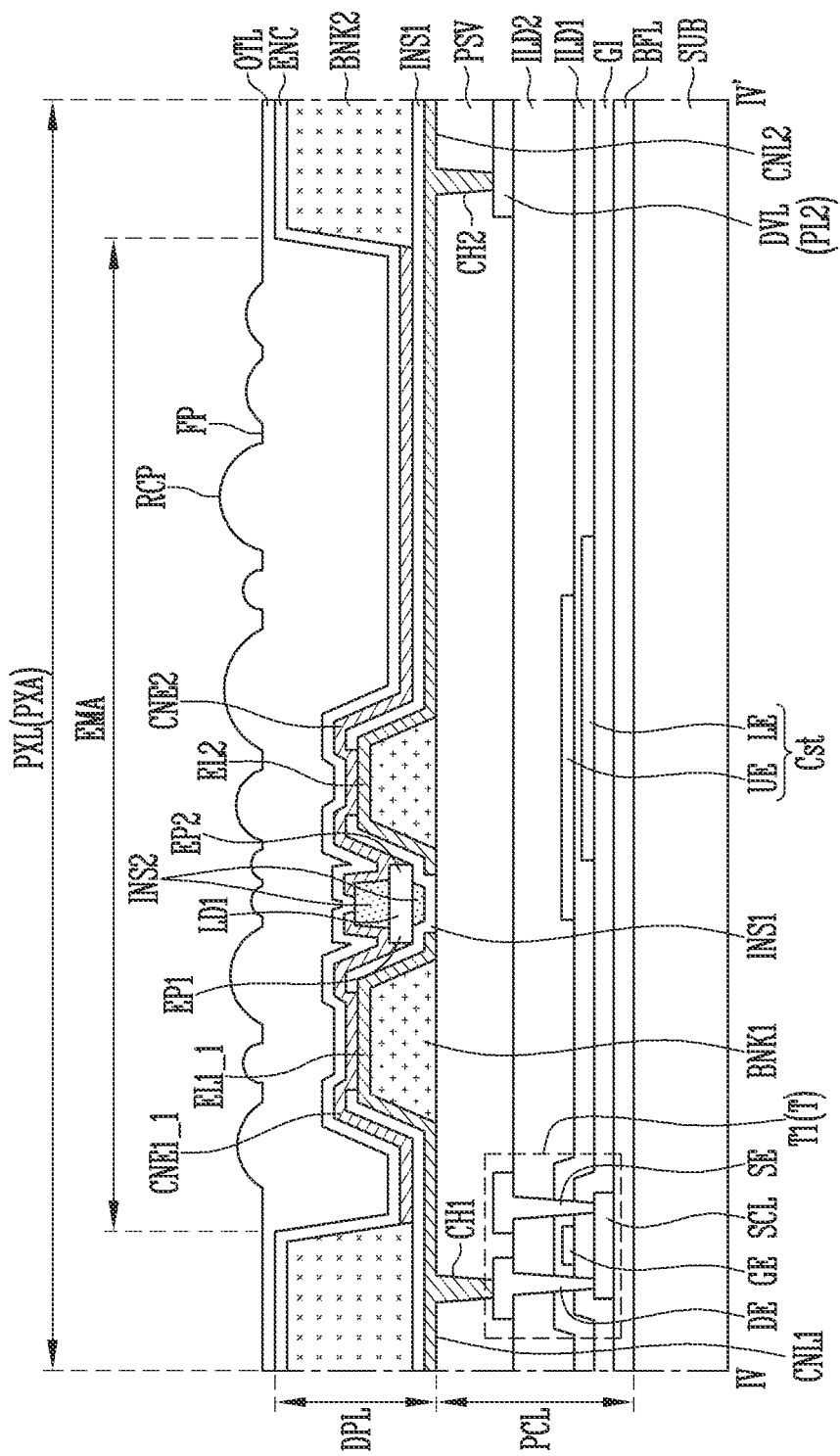

Each of the embossed patterns RCP may have a size equal to or substantially similar to the length L of each of the light emitting elements LD, but the present disclosure is not limited thereto. In one or more embodiments, as illustrated in FIG. 22A, each of the embossed patterns RCP may have a size greater than the length L of each of the light emitting elements LD and sufficient to cover each of the light emitting elements LD. Furthermore, in one or more embodiments, each of the embossed patterns RCP may have a size less than the length L of each of the light emitting elements LD. The embossed patterns RCP may have the same size and the same width, but the present disclosure is not limited thereto. In one or more embodiments, the embossed patterns RCP may have different sizes and widths. As is illustrated in FIG. 22B, only some of the embossed patterns RCP may have the same size and width, or may have different sizes and widths.

The embossed patterns RCP may be light control means for diffusing and/or scattering or concentrating light that passes through the encapsulation layer ENC and changing a travel path of the light to the image display direction of the display device. In addition, the embossed patterns RCP may increase an exit angle of light that passes through the encapsulation layer ENC, and enhance the light output efficiency of light emitted from the emission area EMA of each pixel PXL. The optical layer OTL including the embossed patterns RCP may further include diffusion particles for diffusing and/or scattering light that passes through the encapsulation layer ENC. Here, the diffusion particles may have the same configuration as the fine particles DFP described with reference to FIG. 12A.

The optical layer OTL including the embossed patterns RCP and the planar portion FP may have a structure such that a portion of the upper surface (or the outer surface) thereof is curved.

Figure 22C:
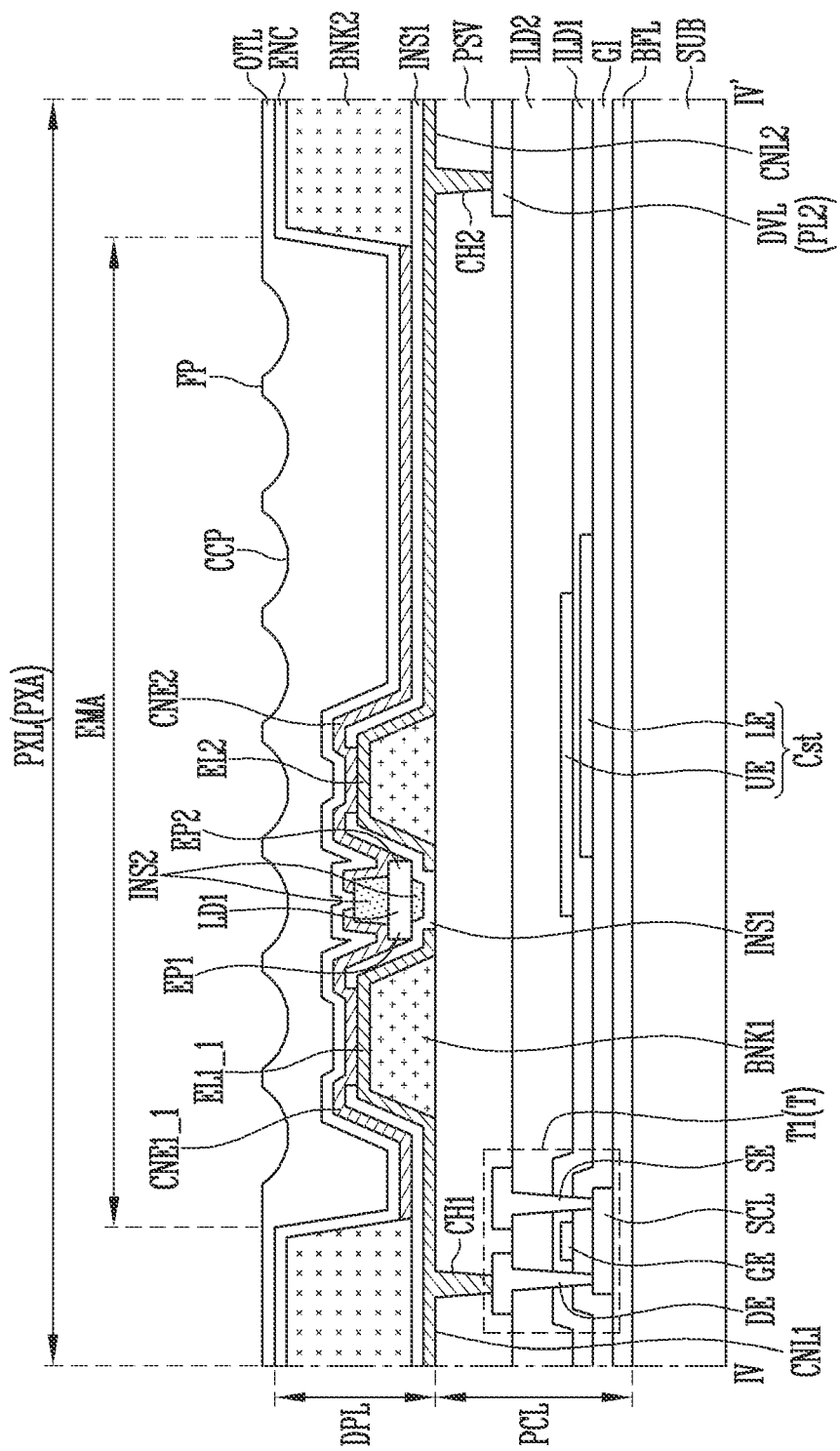

Although in the foregoing embodiment there has been described the case where the optical layer OTL includes the embossed patterns RCP each having an upwardly convex lens-like shape, the present disclosure is not limited thereto. In one or more embodiments, as illustrated in FIG. 22C, the optical layer OTL may be provided to have concave patterns CCP that are recessed downward, in lieu of the embossed patterns RCP. The concaved patterns CCP may have the same size and width, but the present disclosure is not limited thereto. In one or more embodiments, each of the concave patterns CCP may have a size and width different from those of an adjacent concave pattern CCP with a planar portion FP interposed therebetween. The optical layer OTL including the concave patterns CCP and the planar portion FP may be formed through an imprint process.

The concave patterns CCP may be light control means for diffusing and/or scattering or concentrating light that passes through the encapsulation layer ENC and changing a travel path of the light to the image display direction of the display device.

Figure 22D:
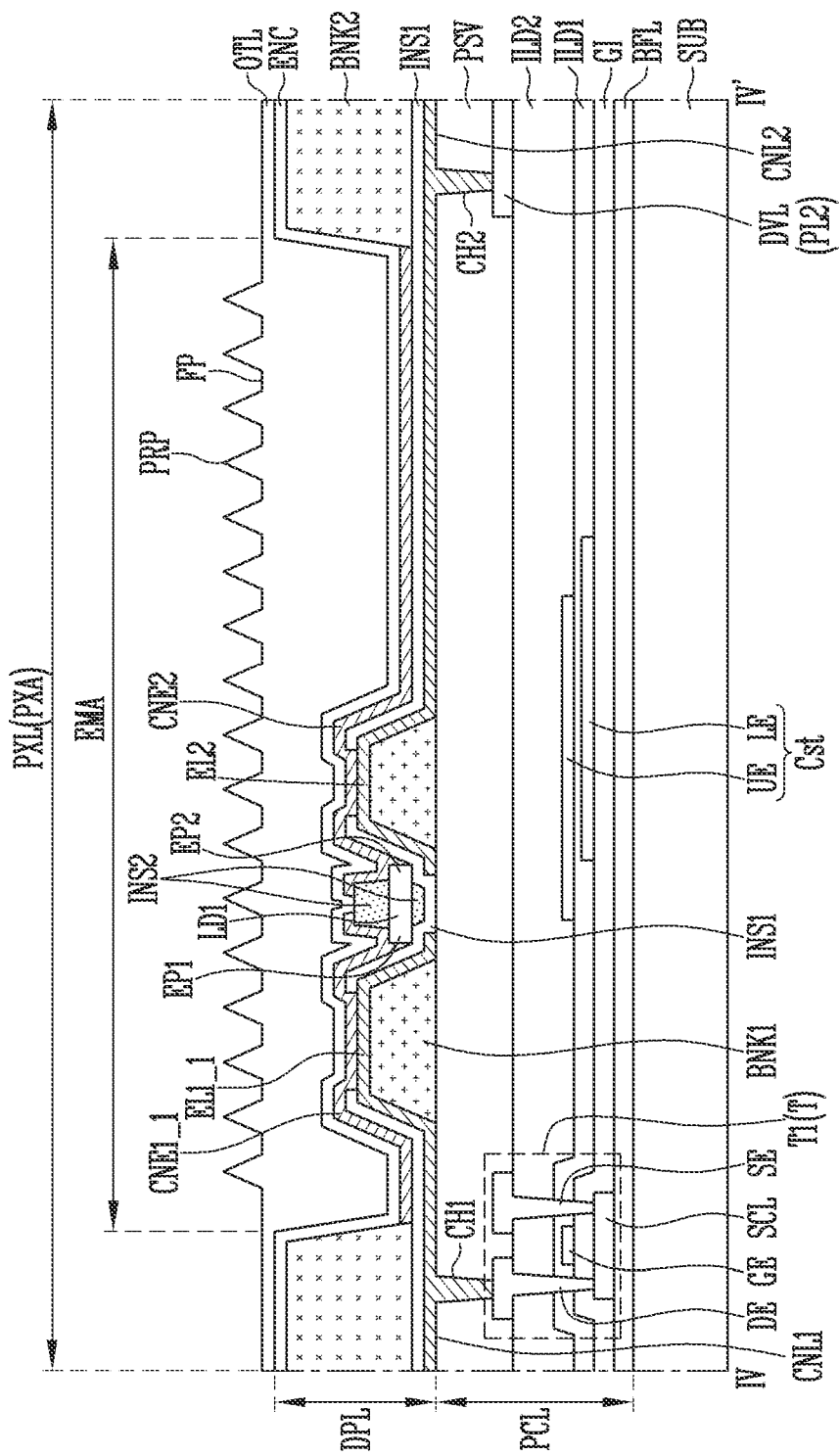

Although in the foregoing embodiment there has been described the case where the optical layer OTL includes the concave patterns CCP that are recessed downward, the present disclosure is not limited thereto. In one or more embodiments, as illustrated in FIG. 22D, the optical layer OTL may be provided to have prism patterns PRP having a prism mountain shape, in lieu of the concave patterns CCP. The prism patterns PRP may have the same size and width, but the present disclosure is not limited thereto. In one or more embodiments, each of the prism patterns PRP may have a size and width different from those of an adjacent prism pattern PRP with a planar portion FP interposed therebetween. In one or more embodiments of the present disclosure, the vertical angle of each of the prism patterns PRP and the size and/or width of each of the prism patterns PRP may be adjusted so that light that passes through the encapsulation layer ENC may be diffused and/or scattered or concentrated, whereby the light may more intensively travel in the image display direction of the display device.

While various embodiments have been described above, those skilled in the art will appreciate that various modifications, additions and substitutions are possible, without departing from the scope of the present disclosure.

Therefore, the embodiments disclosed in this specification are only for illustrative purposes rather than limiting the technical scope of the present disclosure. The scope of the present disclosure may be defined by the accompanying claims and equivalents thereof.

The invention claimed is:

1. A display device comprising:
a substrate comprising a display area including a plurality of pixel areas, each of the plurality of pixel areas including an emission area, and a non-display area at at least one side of the display area; and
a pixel in each of the plurality of pixel areas,
wherein the pixel comprises:
a first electrode and a second electrode spaced from each other on the substrate;
a plurality of light emitting elements connected between the first and the second electrodes;
an optical pattern on the plurality of light emitting elements and overlapping at least some of the plurality of light emitting elements;
a first contact electrode electrically connecting the first electrode and each of the light emitting elements; and
a second contact electrode electrically connecting the second electrode and each of the light emitting elements,
wherein the optical pattern is configured to extract light emitted from the plurality of light emitting elements, and
wherein at least a portion of the optical pattern is disposed on the first contact electrode and the second contact electrode.

2. The display device according to claim 1, wherein the optical pattern comprises a lens.

3. The display device according to claim 2, further comprising an encapsulation layer on the first and the second electrodes, and the plurality of light emitting elements.

4. The display device according to claim 3, wherein the optical pattern is integral with the encapsulation layer.

5. The display device according to claim 3, wherein the encapsulation layer is on the optical pattern.

6. The display device according to claim 3,
wherein the optical pattern comprises a plurality of sub-optical patterns, and
wherein each of the plurality of sub-optical patterns groups a specific number of light emitting elements among the plurality of light emitting elements as one unit and is located on the one unit.

7. The display device according to claim 6, wherein the sub-optical patterns have shapes different from each other.

8. The display device according to claim 6, wherein the sub-optical patterns have an identical shape.

9. The display device according to claim 3, further comprising an insulating layer disposed directly on an upper surface of each of the plurality of light emitting elements,
wherein the optical pattern is on the plurality of light emitting elements with the insulating layer interposed therebetween.

10. The display device according to claim 9
wherein the first contact electrode is disposed on the insulating layer,
wherein the second contact electrode is spaced from the first contact electrode on the insulating layer,
wherein the optical pattern covers a portion of the first contact electrode and a portion of the second contact electrode, and
wherein the first contact electrode and the second contact electrode include transparent conductive materials.

11. The display device according to claim 10, wherein the optical pattern comprises light diffusion particles, and
wherein the optical pattern entirely covers each of the light emitting elements.

12. A display device comprising:
a substrate comprising a display area including a plurality of pixel areas, each of the plurality of pixel areas including an emission area, and a non-display area at at least one side of the display area; and
a pixel in each of the plurality of pixel areas,
wherein the pixel comprises:
a first electrode and a second electrode spaced from each other on the substrate;
a plurality of light emitting elements connected between the first and the second electrodes;
an insulating optical pattern on an upper surface of each of the plurality of light emitting elements, and configured to extract light emitted from the plurality of light emitting elements;
a first contact electrode and a second contact electrode spaced from each other on the insulating optical pattern; and
an encapsulation layer on the first and the second contact electrodes.

13. The display device according to claim 12, wherein the insulating optical pattern has an upwardly protruding shape, and comprises optical diffusion particles dispersed therein.

14. The display device according to claim 13, wherein the insulating optical pattern includes an organic insulating material.

15. A display device comprising:
a substrate comprising a display area including a plurality of pixel areas, each of the plurality of pixel areas including an emission area, and a non-display area at at least one side of the display area; and
a pixel in each of the pixel areas,
wherein the pixel comprises:
- a first electrode and a second electrode spaced from each other on the substrate;
- a plurality of light emitting elements connected between the first and the second electrodes;
- an insulating layer on an upper surface of each of the plurality of light emitting elements;
- a first contact electrode and a second contact electrode spaced from each other on the insulating layer;
- an encapsulation layer on the first and the second contact electrodes; and
- an optical layer on the encapsulation layer,
- wherein the optical layer is configured to extract light emitted from the light emitting elements.

16. The display device according to claim 15, wherein the optical layer comprises a plurality of optical patterns.

17. The display device according to claim 16, wherein each of the plurality of optical patterns has an upwardly protruding shape.

18. The display device according to claim 16, wherein each of the plurality of optical patterns has a downwardly recessed shape.

19. The display device according to claim 16, wherein the optical patterns have an identical size.

20. The display device according to claim 16, wherein the optical patterns have sizes different from each other.

* * * * *